US009412456B2

(12) United States Patent
Kwak et al.

(10) Patent No.: US 9,412,456 B2
(45) Date of Patent: *Aug. 9, 2016

(54) NONVOLATILE MEMORY DEVICE, PROGRAMMING METHOD OF NONVOLATILE MEMORY DEVICE AND MEMORY SYSTEM INCLUDING NONVOLATILE MEMORY DEVICE

(71) Applicant: Samsung Electronics Co., Ltd., Suwon-si (KR)

(72) Inventors: DongHun Kwak, Hwaseong-si (KR); Sang-Won Park, Seoul (KR); Won-Taeck Jung, Seongnam-Si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/523,850

(22) Filed: Oct. 25, 2014

(65) Prior Publication Data
US 2015/0043283 A1 Feb. 12, 2015

Related U.S. Application Data

(62) Division of application No. 13/648,290, filed on Oct. 10, 2012, now Pat. No. 8,902,651.

(30) Foreign Application Priority Data

Oct. 13, 2011 (KR) ........................ 10-2011-0104753

(51) Int. Cl.
*G11C 16/04* (2006.01)
*G11C 16/10* (2006.01)
*G11C 16/34* (2006.01)
(Continued)

(52) U.S. Cl.
CPC ............ *G11C 16/10* (2013.01); *G11C 16/0483* (2013.01); *G11C 16/08* (2013.01); *G11C 16/26* (2013.01); *G11C 16/3459* (2013.01); *H01L 27/1157* (2013.01); *H01L 27/11582* (2013.01)

(58) Field of Classification Search
CPC ........... G11C 11/5628; G11C 11/5642; G11C 16/3454
USPC ....................................... 365/185.03, 185.22
See application file for complete search history.

(56) References Cited

U.S. PATENT DOCUMENTS 7,295,468 B2    11/2007   Shibata
7,505,335 B2    3/2009   Shibata
(Continued)

FOREIGN PATENT DOCUMENTS

JP         2005-149593 A     6/2005
KR    10-2006-0107689 A   10/2006
(Continued)

*Primary Examiner* — Huan Hoang
(74) *Attorney, Agent, or Firm* — Muir Patent Law, PLLC

(57) ABSTRACT

Disclosed are a program method and a nonvolatile memory device. The method includes receiving program data to be programmed in memory cells; reading the memory cells to judge an erase state and at least one program state; performing a state read operation in which the at least one program state is read using a plurality of state read voltages; and programming the program data in the memory cells using a plurality of verification voltages having different levels according to a result of the state read operation. Also disclosed are methods using a plurality of verification voltages selected based on factors which may affect a threshold voltage shift or other characteristic representing the data of a memory cell after programming.

24 Claims, 69 Drawing Sheets

(51) Int. Cl.
*H01L 27/115* (2006.01)
*G11C 16/08* (2006.01)
*G11C 16/26* (2006.01)

(56) References Cited

U.S. PATENT DOCUMENTS 8,902,651 B2 * 12/2014 Kwak ................. H01L 27/1157
365/185.03

| 2003/0151950 | A1 | 8/2003 | Tamada et al. |
| 2007/0035995 | A1 | 2/2007 | Crippa et al. |
| 2010/0226164 | A1 | 9/2010 | Nagashima et al. |

FOREIGN PATENT DOCUMENTS

| KR | 10-2008-0022394 A | 3/2008 |
| KR | 10-2007-0006712 A | 1/2010 |
| KR | 10-2005-0079977 A | 9/2010 |

* cited by examiner

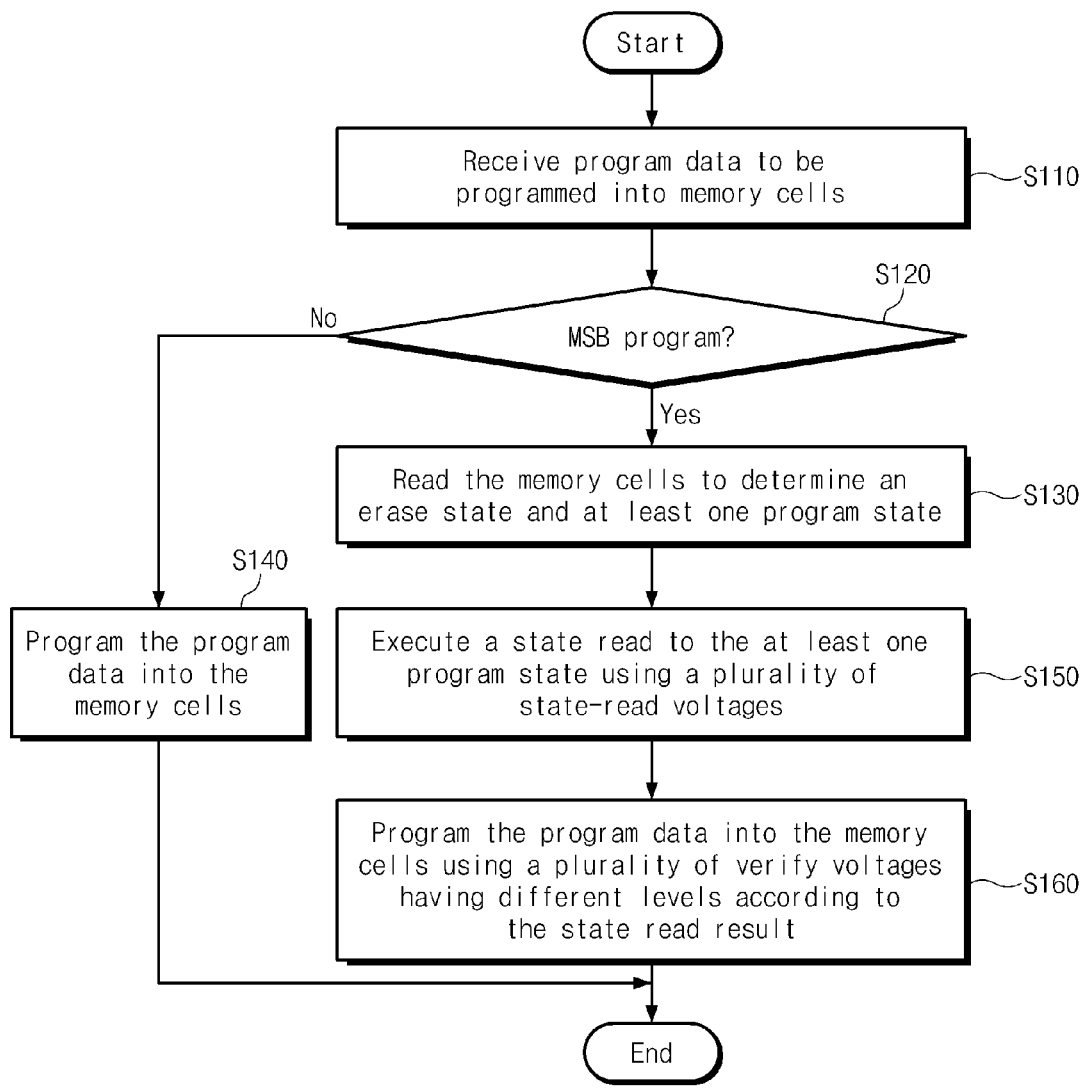

Fig. 51
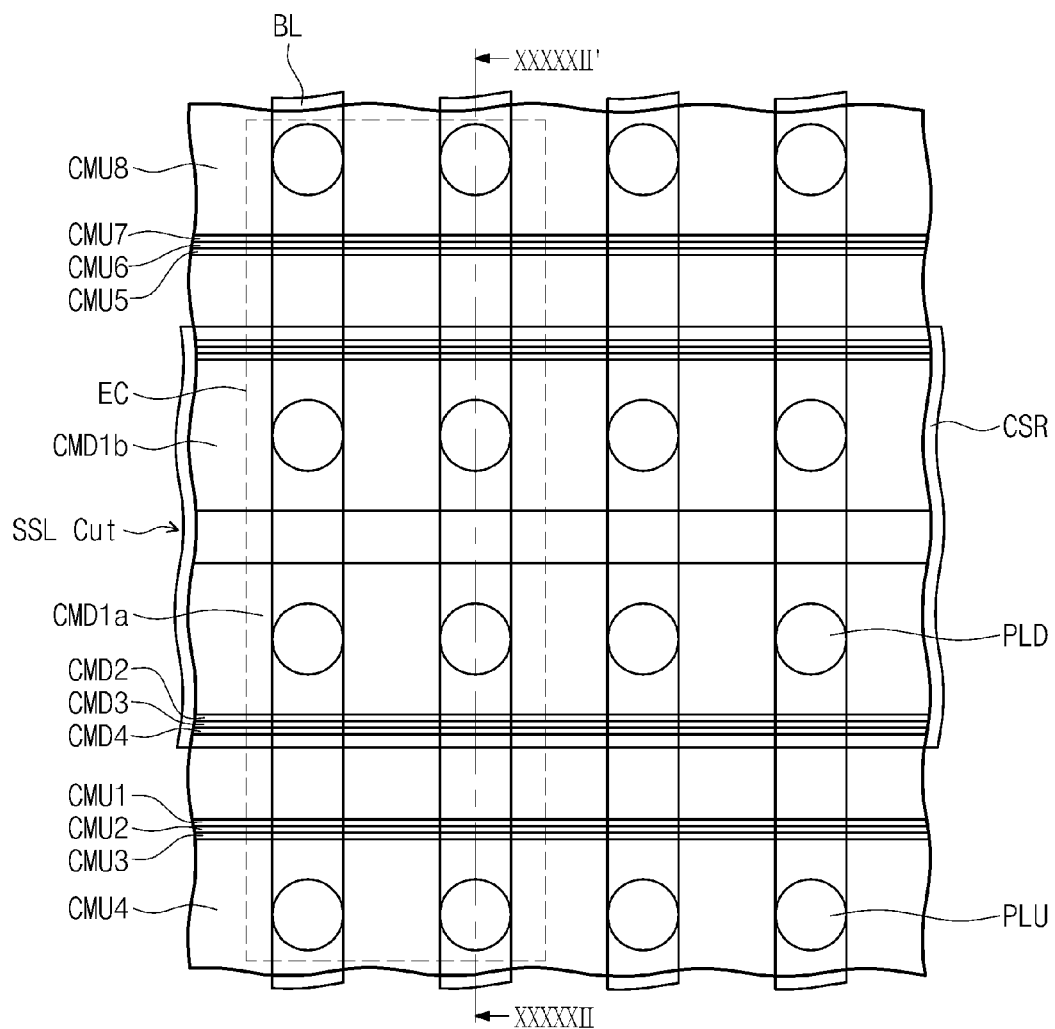
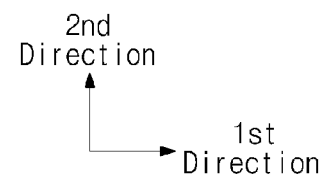

NONVOLATILE MEMORY DEVICE, PROGRAMMING METHOD OF NONVOLATILE MEMORY DEVICE AND MEMORY SYSTEM INCLUDING NONVOLATILE MEMORY DEVICE

CROSS-REFERENCE TO RELATED APPLICATIONS

This application is a Divisional application of and claims priority under to U.S. patent application Ser. No. 13/648,290 filed on Oct. 10, 2012, which claims priority under 35 U.S.C §119 to Korean Patent Application No. 10-2011-0104753 filed Oct. 13, 2011, the entirety of each of which is incorporated by reference herein.

BACKGROUND

The inventive concepts described herein relate to a semiconductor memory device, and more particularly, relate to a program method of a nonvolatile memory device and a memory system including the nonvolatile memory device.

A semiconductor memory device may be fabricated using semiconductors such as silicon (Si), germanium (Ge), gallium arsenide (GaAs), indium phosphide (InP), and the like. Semiconductor memory devices are classified into volatile memory devices and nonvolatile memory devices.

Volatile memory devices may lose stored data when they are turned off or otherwise lack power. Volatile memory devices include static RAM (SRAM), dynamic RAM (DRAM), synchronous DRAM (SDRAM), and the like. Nonvolatile memory devices may retain stored contents even when turned off or otherwise lacking a power source. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. The flash memory device includes NOR type flash memory and NAND type flash memory.

Recently, a semiconductor memory device with a three-dimensional memory array structure has been developed.

SUMMARY

Example embodiments provide a programming method of a nonvolatile memory device which comprises receiving program data to be programmed in memory cells; reading the memory cells to judge an erase state and at least one program state; performing a state read operation in which the at least one program state is read using a plurality of state read voltages; and programming the program data in the memory cells using a plurality of verification voltages having different levels according to a result of the state read operation.

In example embodiments, programming the program data in the memory cell comprises programming memory cells being programmed to a program state using at least two verification voltages having different levels according to the result of the state read operation.

In example embodiments, at the state read operation, the at least one program state is read using a first state read voltage and a second state read voltage higher than the first state read voltage.

In example embodiments, the first state read voltage has the same level as a verification voltage used when the at least one program state is programmed.

In example embodiments, first memory cells, read as memory cells each having a threshold voltage higher than the second state read voltage at the state read operation, among memory cells being programmed to the same program state are programmed using a first verification voltage, second memory cells read as memory cells each having a threshold voltage higher than the first state read voltage and lower than the second state read voltage are programmed using a second verification voltage higher than the first verification voltage, and third memory cells read as memory cells each having a threshold voltage lower than the first state read voltage are programmed using a third verification voltage higher than the second verification voltage.

In example embodiments, when the memory cells are programmed with the program data, a first verification voltage, a second verification voltage, and a third verification voltage are applied sequentially to a word line connected with the memory cells after a program voltage is applied to the word line.

In example embodiments, the program method further comprises programming the result of the state read operation in memory cells of a supplemental memory area.

In example embodiments, the program method further comprises receiving second program data to be programmed in the memory cells; reading the result of the state read operation programmed in the memory cells of the supplemental memory area; and programming the memory cells with the second program data using a plurality of verification voltages having different levels according to the result of the sate read operation read from the memory cells of the supplemental memory area.

In example embodiments, the program method further comprises outputting the result of the state read operation to the outside.

Example embodiments also provide a program method of a nonvolatile memory device comprising receiving program data to be programmed in memory cells; reading the memory cells to judge an erase state and at least one program state; performing a state read operation in which the at least one program state is read using a plurality of first state read voltages and the erase state is read using a plurality of second state read voltages; and programming the memory cells with the program data using a plurality of verification voltages having different levels according to a result of the state read operation.

Example embodiments also provide a program method of a nonvolatile memory device comprising receiving program data to be programmed in memory cells; judging whether the program data corresponds to an MSB program operation; and when the program data corresponds to an MSB program operation, reading the memory cells to judge an erase state and at least one program state, performing a state read operation in which the at least one program state is read using a plurality of read voltages, and programming the memory cells with the program data using a plurality of verification voltages having different levels according to a result of the state read operation, wherein at the state read operation, each program state is read using at least two state read voltages having different levels.

Example embodiments also provide a program method of a nonvolatile memory device which includes a plurality of cell strings provided on a substrate, each cell string including a plurality of cell transistors stacked in a direction perpendicular to the substrate and each cell transistor having an information storage film being an insulator, the program method comprising receiving program data to be programmed in memory cells; reading the memory cells to judge an erase state and at least one program state; performing a state read operation in which the at least one program state is read using a plurality of state read voltages; and programming the program data in the memory cells using a plurality of verification voltages having different levels according to a result of the state read operation.

Example embodiments also provide a program method of a nonvolatile memory device which includes a plurality of cell strings provided on a substrate, each cell string including a plurality of cell transistors stacked in a direction perpendicular to the substrate and each cell transistor having an information storage film being an insulator, the program method comprising receiving program data to be programmed in first memory cells; reading data from second memory cells connected with at least one word line just adjacent to a word line connected with the first memory cells; and programming the first memory cells with the program data using a plurality of verification voltages having different levels according to the read data from the second memory cells, wherein memory cells being programmed to a program state are programmed using verification voltages having different levels according to the read data.

In example embodiments, the program method further comprises receiving second program data to be programmed in memory cells connected with at least one another word line just adjacent to a word line connected with the memory cells, memory cells being programmed to the program state being programmed using the verification voltages having different levels according to the read data and the second program data.

Example embodiments also provide a nonvolatile memory device comprising a memory cell array including a plurality of memory cells connected to bit lines and word lines; an address decoding unit configured to apply read voltages to a selected word line, to apply state read voltages, and to apply a program voltage and verification voltages, at a program operation; and a page buffer unit including a plurality of page buffers, each page buffer including a data latch and a rearrangement latch, wherein the data latch stores program data to be programmed and stores a read result when the read voltages are applied to the selected word line and the rearrangement latch stores a state read result when the state read voltages are applied; and wherein when the program voltage and the verification voltages are applied, each page buffer biases a bit line according to data stored in the data latch and data stored in the rearrangement latch.

In example embodiments, at least two state read voltages of the state read voltages have levels between levels of two read voltages being just adjacent from among the read voltages.

In example embodiments, each page buffer biases the bit line with a power supply voltage or a ground voltage according to data stored in the data latch before the program voltage is applied.

In example embodiments, when the verification voltages are applied, each page buffer is configured to select a valid verification voltage according to data stored in the rearrangement latch.

In example embodiments, the memory cell array is divided into a user data area and a supplemental area, the state read result stored in the rearrangement latch being programmed in the supplemental area.

In example embodiments, when second program data corresponding to the same address as the program data is programmed, the address decoding unit applies second read voltages to the selected word line of the user data area, third read voltages to a selected word line of the supplemental area, and a second program voltage and second verification voltages to the selected word line of the user data area; wherein the data latch stores the second program data and stores a second read result when the second read voltages are applied; the rearrangement latch stores a third read result when the third read voltages are applied; and the second program voltage and the second verification voltages are applied, each page buffer biases the bit line according to data stored in the data latch and data stored in the rearrangement latch.

Example embodiments also provide a nonvolatile memory device comprising a memory cell array including a plurality of memory cells connected to bit lines and word lines; an address decoding unit configured to apply read voltages, state read voltages, and a program voltage and verification voltages to a selected word line, at a program operation on MSB data; and a page buffer unit including a plurality of page buffers, each page buffer including a data latch and a rearrangement latch which are connected to a bit line, wherein the data latch stores data to be programmed and stores a read result when the read voltages are applied to the selected word line and the rearrangement latch stores a state read result when the state read voltages are applied; and wherein at the program operation of the MSB data, each page buffer biases the bit line according to data stored in the data latch and the rearrangement latch when the program voltage and the verification voltages are applied.

Example embodiments also provide a nonvolatile memory device comprising a memory cell array including a plurality of memory cells connected to bit lines and word lines; an address decoding unit configured to apply first read voltages to a selected word line, to apply second read voltages to at least one word line just adjacent to the selected word line, and to apply a program voltage and verification voltages to the selected word line, at a program operation; and a page buffer unit including a plurality of page buffers, each page buffer including a data latch and a rearrangement latch, wherein the data latch stores program data to be programmed and stores a first read result when the first read voltages are applied to the selected word line and the rearrangement latch stores a second read result when the second read voltages are applied to the at least one word line; and wherein when the program voltage and the verification voltages are applied, each page buffer biases a bit line according to data stored in the data latch and data stored in the rearrangement latch.

Example embodiments also provide a memory system comprising a nonvolatile memory device; and a controller configured to control the nonvolatile memory device, wherein the nonvolatile memory device comprises a memory cell array including a plurality of memory cells connected to bit lines and word lines; an address decoding unit configured to apply read voltages to a selected word line, to apply state read voltages, and to apply a program voltage and verification voltages, at a program operation; and a page buffer unit including a plurality of page buffers, each page buffer including a data latch and a rearrangement latch, wherein the data latch stores program data to be programmed and stores a read result when the read voltages are applied to the selected word line and the rearrangement latch stores a state read result when the state read voltages are applied; and wherein when the program voltage and the verification voltages are applied, each page buffer biases a bit line according to data stored in the data latch and data stored in the rearrangement latch.

In example embodiments, the controller stores the state read result output from the nonvolatile memory device to control a program, read, or erase operation of the nonvolatile memory device according to the stored state read result.

In example embodiments, the nonvolatile memory device and the controller constitute a memory card.

In example embodiments, the nonvolatile memory device and the controller constitute a Solid State Drive (SSD).

Example embodiments also provide a program method of a nonvolatile memory device comprising reading data stored in memory cells of a buffer area to judge an erase state and at least one program state of memory cells of a user data area corresponding to memory cells of the buffer area; judging whether a fine program operation on memory cells of the user data area is performed; and if the fine program operation is judged to be performed, performing a state read operation on the at least one program state of memory cells of the user data area using a plurality of state read voltages to perform the fine program operation using a plurality of verification voltages having different levels according to a result of the state read operation, wherein at the state read operation, each program state is read using a plurality of state read voltages having different levels.

Example embodiments also provide a program method of a nonvolatile memory device comprising receiving program data to be programmed in memory cells; reading the memory cells to judge an erase state and at least one program state; reading memory cells of a test data area corresponding to the memory cells; and programming the memory cells with the program data using a plurality of verification voltages having different levels according to a read result on memory cells of the test data area, wherein programming the memory cells with the program data includes programming memory cells being programmed to one program state using verification voltages having different levels according to a read result on memory cells of the test data area.

Example embodiments also provide a program method of a nonvolatile memory device comprising receiving program data to be programmed in memory cells; iterating a first program loop in which a program voltage and a verification voltage are respectively applied once to the memory cells, until a threshold condition is satisfied, if the threshold condition is satisfied, performing a state read operation on memory cells having an intermediate state higher than an erase state, using at least two state read voltages having different levels; and performing a second program loop in which a program voltage and at least two verification voltages having different levels are applied to the memory cells using a plurality of verification voltages having different levels according to a result of the state read operation.

In example embodiments, the threshold condition includes a condition indicating that memory cells being first program passed of the memory cells are detected.

In example embodiments, the threshold condition includes a condition indicating that the number of program passed memory cells of the memory cells is over a specific value.

In example embodiments, the threshold condition includes a condition indicating that an iterated number of the first program loop is over a specific value.

Example embodiments also include a method of programming a non-volatile memory comprising: determining a tendency of a threshold voltage of a first memory cell transistor to shift from a programmed state, and selecting a first verification voltage from a plurality of verification voltages in response to the determining, and programming the first memory cell transistor to alter the threshold voltage of the first memory cell transistor, the programming including verifying the threshold voltage of first memory cell transistor has been altered sufficiently using the first verification voltage.

Example embodiments also include a method of programming a row of memory cells, comprising selecting a first row of memory cells among a plurality of rows selecting a first subset of the memory cells of the first row to change a detectable characteristic of the first subset of the memory cells to within a first program state range, the first program state range representing a value of at least a first bit of data, programming the first subset of memory cells to change the characteristic of each of the first subset of the memory cells, including verifying the change of the characteristic of some of the first subset of memory cells with a first verification level, and verifying others of the first subset of memory cells with a second verification level that is different from the first verification level.

Example embodiments also include a method of programming a memory device, comprising programming a first plurality of memory cells to a first program state of a plurality of program states, each program state representing a unique set of values of plural data bits, the first plurality of memory cells connected to a first word line, the programming comprising a plurality of program loops, each program loop comprising: (a) applying a program voltage to the word line; (b) applying a first verify voltage to the word line to verify a first subset of the first plurality of memory cells have at least a first threshold voltage; and (c) applying a second verify voltage, different from the first verify voltage, to the word line to verify a second subset of the first plurality of memory cells have at least a second threshold voltage.

Example embodiments also include a method of programming a multi-bit non-volatile memory cell comprising programming a first bit of data into the memory cell so that the memory cell exhibits a characteristic within a first range, the exhibited characteristic representing the first bit of data; reading the first bit of data from the memory cell; determining a shift of the characteristic exhibited by the memory cell; and programming a the memory cell to store the first bit of data and a second bit of data so that the memory cell exhibits a characteristic within a second range, the second range being chosen based upon the determined shift.

Example embodiments also include a method of programming a non-volatile memory cell comprising altering a threshold voltage of a memory cell transistor to within a first range; determining a shift of the threshold voltage of the memory cell with respect to the first range; altering the threshold voltage of the memory cell transistor to a second range, the second range selected in response to the determining step.

Example embodiments also include a non-volatile memory device comprising an array of memory cells arranged in rows in columns, rows of memory cells connected to corresponding word lines, columns of memory cells connected to corresponding bit lines; a page buffer including data latches and second latches connected to corresponding bit lines, data latches configured to store data; a voltage generator configured to generate a program voltage; a row decoder configured to decode an address and select a word line; a control unit configured to control a programming operation including performing a plurality of program loops each program loop comprising application of a program pulse to a word line selected by the row decoder and a plurality of sequential verify operations to verify respective program levels of a first row of memory cells connected to the selected word line, wherein the data latches of the page buffer are configured to inhibit or allow a programming operation on respective memory cells of the first row connected to bit lines corresponding to the data latches, and wherein the second latches are configured to select one of a plurality of verify results corresponding to each of the plurality of verify operations of a program loop.

Example embodiments also include non-volatile memory device comprising an array of memory cells arranged in rows in columns, rows of memory cells connected to corresponding word lines, columns of memory cells connected to corresponding bit lines; a voltage generator configured to generate a program voltage; a page buffer including data latches and second latches connected to corresponding bit lines, data latches configured to temporarily store data to be stored in a row of memory cells to be programmed; a row decoder configured to decode an address and select a word line; a control unit configured to control a programming operation including performing a plurality of program loops each program loop comprising application of a program pulse to a word line selected by the row decoder and a plurality of sequential verify operations to verify respective voltage threshold levels of a first row of memory cells connected to the selected word line; wherein the data latches of the page buffer are configured to inhibit or allow a programming operation on respective memory cells of the first row connected to bit lines corresponding to the data latches, wherein the control unit is configured control a coarse programming operation to program the first row of memory cells to a plurality of coarse program state, each of the plurality of coarse program states corresponding to a fine program state, wherein the control unit is configured to perform a state read of the first row of the memory cells when in a coarse program state to determine a tendency of a threshold voltage of each memory cell to shift, and wherein the second latches are configured to store information of the result of the state read, and configured to select, in response to the information stored in the second latches, one of a plurality of verify results corresponding to each of the plurality of verify operations of a program loop.

Example embodiments also contemplate devices implementing the disclosed methods described herein, as well as operation methods of the devices described herein.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 9 is a flowchart for describing a program method according to an embodiment.

FIG. 51 is a top view illustrating a part of one memory block in FIG. 2 according to still another embodiment.

DETAILED DESCRIPTION

Figure 1:
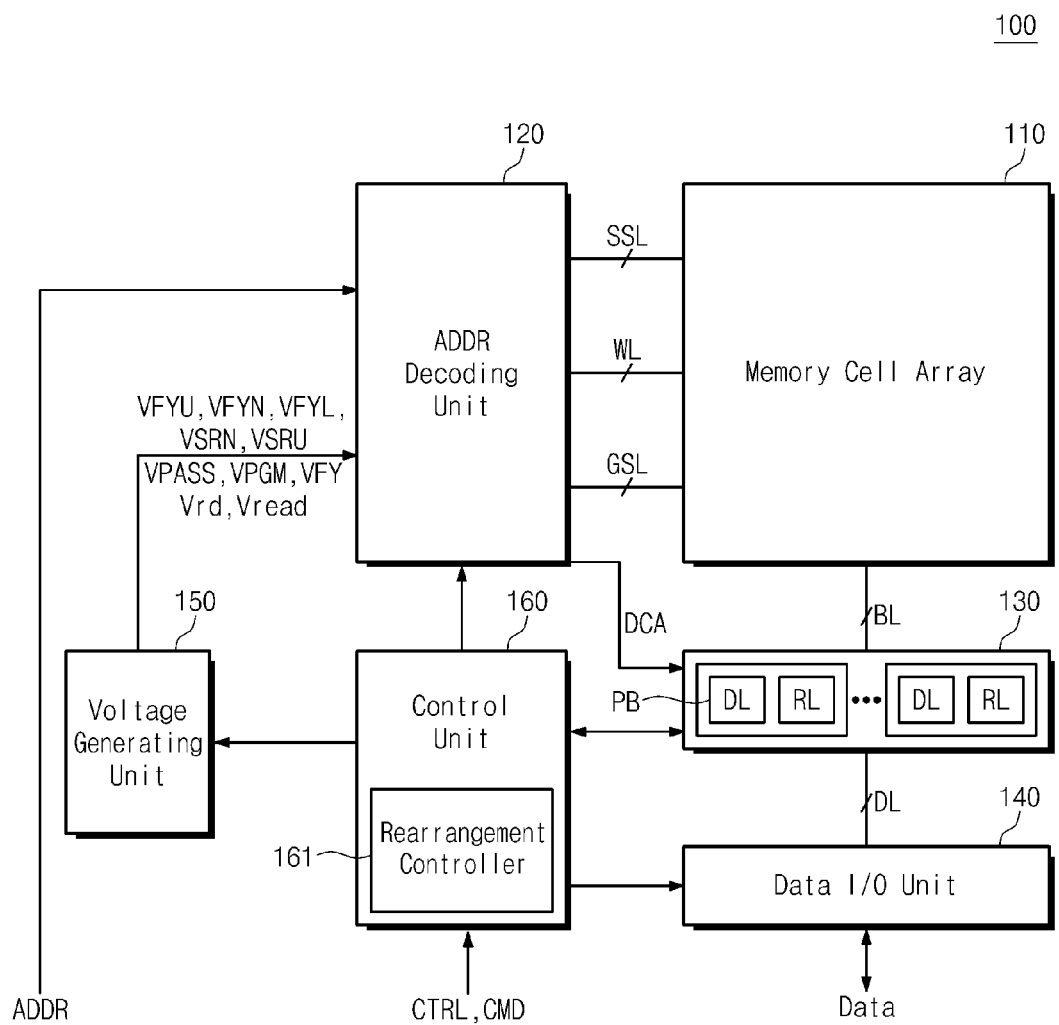
FIG. 1 is a block diagram schematically illustrating a nonvolatile memory device according to an embodiment.

Various example embodiments will be described more fully hereinafter with reference to the accompanying drawings, in which some example embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," "including," "have," "having," etc., when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected memory block" may be used to indicate a memory block, selected for an operation, such as programming, erasing, or reading, from among a plurality of memory blocks. The term "selected sub block" may be used to indicate a sub block, selected for an operation, such as programming, erasing, or reading, from among a plurality of sub blocks in one memory block.

The term "selected bit line" or "selected bit lines" may be used to indicate a bit line or bit lines, connected with a cell transistor to be programmed or read, from among a plurality of bit lines. The term "unselected bit line" or "unselected bit lines" may be used to indicate a bit line or bit lines, connected with a cell transistor to be program-inhibited or read-inhibited, from among a plurality of bit lines.

The term "selected string selection line" may be used to indicate a string selection line, connected with a cell string including a cell transistor to be programmed or read, from among a plurality of string selection lines. The term "unselected string selection line" or "unselected string selection lines" may be used to indicate a remaining string selection line or remaining string selection lines other than the selected string selection line from among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line, connected with a cell string including a cell transistor to be programmed or read, among a plurality of ground selection lines. The term "unselected ground selection line" may be used to indicate a remaining ground selection line or remaining ground selection lines other than the selected ground selection line from among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "unselected word line" may be used to indicate a word line, connected with a cell transistor to be programmed or read, from among a plurality of word lines. The term "unselected word line" or "unselected word lines" may be used to indicate a remaining word lines or remaining word lines other than a selected word line from among a plurality of word lines.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells from among a plurality of memory cells.

Embodiments will be described with reference to a NAND flash memory. However, the inventive concept is not limited thereto. The inventive concept may be applied to other non-volatile and volatile memory types, such as Electrically Erasable and Programmable ROM (EEPROM), NOR flash memory, Phase-change RAM (PRAM), Magnetic RAM (MRAM), Resistive RAM (RRAM), Ferroelectric RAM (FRAM), and the like.

FIG. 1 is a block diagram schematically illustrating a non-volatile memory device according to an embodiment. Referring to FIG. 1, a nonvolatile memory device 100 may include a memory cell array 110, an address decoding unit 120, a page buffer unit 130, a data input/output unit 140, a voltage generating unit 150, and a control unit 160.

The memory cell array 100 may include a plurality of cell strings that are arranged on a substrate in an array fashion, the array extending in a row direction and a column direction. Each cell string may include a plurality of memory cells stacked along a direction perpendicular to the substrate. That is, memory cells may be provided on the substrate arrayed in rows and columns, and may be stacked in a direction perpendicular to the substrate to form a three-dimensional memory cell array structure. The memory cell array 110 may include plural memory cells that store one or more bits of data, respectively. Alternative structures are also possible, such as a two-dimensional memory cell array.

The address decoding unit 120 may be coupled with the memory cell array 110 via word lines WL, string selection lines SSL, and ground selection lines GSL. The address decoding unit 120 may be configured to operate responsive to the control of the control unit 160. The address decoding unit 120 may receive an address ADDR from an external device.

The address decoding unit 120 may be configured to decode a row address of the input address ADDR. The address decoding unit 120 may be configured to select a word line, corresponding to the decoded row address, from among the plurality of word lines WL. The address decoding unit 120 may be configured to select a string selection line and a ground selection line, corresponding to the decoded row address, from among the string selection lines SSL and the ground selection lines GSL.

The address decoding unit 120 may supply the word lines WL with voltages transferred from the voltage generating unit 150 in response to the decoded row address and the control of the control unit 160. The address decoding unit 120 may supply the word lines WL with an upper verification voltage VFYU, a normal verification voltage VFYN, a lower verification voltage VFYL, a normal state read voltage VSRN, an upper state read voltage VSRU, a pass voltage VPASS, a program voltage VPGM, a verification voltage VFY, a read voltage Vrd, and a non-selection read voltage Vread selectively.

The address decoding unit 120 may be configured to decode a column address among the input address ADDR. The address decoding unit 120 may transfer the decoded column address DCA to the page buffer unit 130.

The page buffer unit 130 may be coupled with the memory cell array 110 via the bit lines BL. The page buffer unit 130 may operate responsive to the control of the control unit 160. The page buffer unit 130 may receive the decoded column address DCA from the address decoding unit 120. The page buffer unit 130 may select the bit lines BL in response to the decoded column address DCA.

The page buffer unit 130 may include a plurality of page buffers PB. Each page buffer PB may be coupled with one bit line BL. Each page buffer PB may include a data latch DL and a rearrangement latch RL.

Data to be programmed at memory cells and Data programmed at the memory cells may be stored in the data latches DL. For example, data previously programmed at memory cells and data to be programmed at the memory cells may be stored in the data latches DL.

Information associated with charge rearrangement of memory cells may be stored in the rearrangement latches RL. For example, a state read result of memory cells may be stored in the rearrangement latches RL. This will be more fully described later.

The address decoding unit 120 and the page buffer unit 130 may perform program and read operations according to the control of the control unit 160. Reading and programming on the memory cell array 110 may be made by controlling the string selection lines SSL, the word lines WL, and the ground selection lines GSL via the address decoding unit 120 and controlling the bit lines BL via the page buffer unit 130. At programming, a verification read operation may be carried out. The page buffer unit 130 may output the control unit 160 with a result of the verification read operation.

The page buffer unit 130 may receive data via data lines DL. The input data in the page buffer unit 130 may be written in the memory cell array 110. The page buffer unit 130 may read data from the memory cell array 110 to output it via the data lines DL. The page buffer unit 130 may store data read out from a first storage area of the memory cell array 110. The data stored in the page buffer unit 130 may be written in a second storage area thereof. That is, a copy-back operation may be made.

The address decoding unit 120 and the page buffer unit 130 may perform a state read operation according to the control of the control unit 160. This will be more fully described later. The address decoding unit 120 and the page buffer unit 130 may perform a program operation considering rearrangement under the control of the control unit 160. This will be more fully described later.

The data input/output unit 140 may be connected with the page buffer unit 130 via the data lines DL. The data input/output unit 140 may be configured to exchange data with an external device. The data input/output unit 140 may output data transferred from the page buffer unit 130 via the data lines DL to the external device. The data input/output unit 140 may transfer data input from the external device to the page buffer unit 130 via the data lines DL.

The voltage generating unit 150 may generate various voltages according to the control of the control unit 160. The voltage generating unit 150 may generate an upper verification voltage VFYU, a normal verification voltage VFYN, a lower verification, a voltage VFYL, a normal state read voltage VSRN, an upper state read voltage VSRU, a pass voltage VPASS, a program voltage VPGM, a verification voltage VFY, a read voltage Vrd, and a non-selection read voltage Vread. Each of these voltages may be are supplied to the address decoding unit 120.

The upper verification voltage VFYU, the normal verification voltage VFYN, and the lower verification voltage VFYL may be verification voltages used to program memory cells to one program state considering charge rearrangement.

The normal state read voltage VSRN and the upper state read voltage VSRU may be read voltages used at a state read operation for detecting the charge rearrangement.

Each of the upper verification voltage VFYU, the normal verification voltage VFYN, the lower verification voltage VFYL, the normal state read voltage VSRN, and the upper state read voltage VSRU may be formed as a set of voltages. For example, the upper verification voltage VFYU may indicate a set of voltages with various levels respectively corresponding to a Least Significant Bit (LSB), a Central Significant Bit (CSB), and a Most Significant Bit (MSB). These bits may also be referred to by different names, such as Second Significant Bit (2SB). In general, use of these "significant bit" phrases are used in this application to distinguish programming of various bits of information into the multi-level cell. Traditionally, flash memory programming has labeled a first bit to be programmed into a multi-level cell (from the erase state) as a Least Significant Bit (LSB) and the last bit of information to be programmed into a multi-level cell as a Most Significant Bit (MSB). When the multi-level cell has more than two bits, intermediate bits may be referred to as a Central Significant Bit (CSB), Second Significant Bit (2SB), etc. For ease of explanation, this application describes programming in a like fashion. It should be emphasized, however, that the significance of the bit of information is not dependent on the order of storage in the multi-level cell with respect to other bits. The significance of the bits with respect to each other, if any, may be determined by their use by a user, by later data handling by the memory device (e.g., by I/O circuitry of the memory device) or external devices (e.g., a memory controller). Thus, data referenced as LSB data may in fact be treated downstream as MSB data, and MSB data may be in fact LSB data. Each of the normal verification voltage VFYN, the lower verification voltage VFYL, the normal state read voltage VSRN, and the upper state read voltage VSRU may indicate a set of voltages with various levels. A specific voltage of a set of voltages may be marked by a reference numeral following a reference symbol.

The pass voltage VPASS, the program voltage VPGM, the verification voltage VFY, the read voltage Vrd, and the non-selection read voltage Vread may be voltages used at programming and reading.

The control unit 160 may be configured to control an overall operation of the nonvolatile memory device 100. The control unit 160 may operate responsive to control signals CTRL and a command CMD that are provided from an external device. The control unit 160 may judge program pass or program fail based on a verification read result provided from the page buffer unit 130. The control unit 160 may control the nonvolatile memory device 100 so as to perform program, read, erase, state read, and rearrangement program operations.

The control unit 160 may include a rearrangement controller 161. The rearrangement controller 161 may control a state read operation for detecting (or, predicting) a charge rearrangement characteristic of a programmed memory cell and a program operation considering rearrangement according to a state read result.

Figure 2:
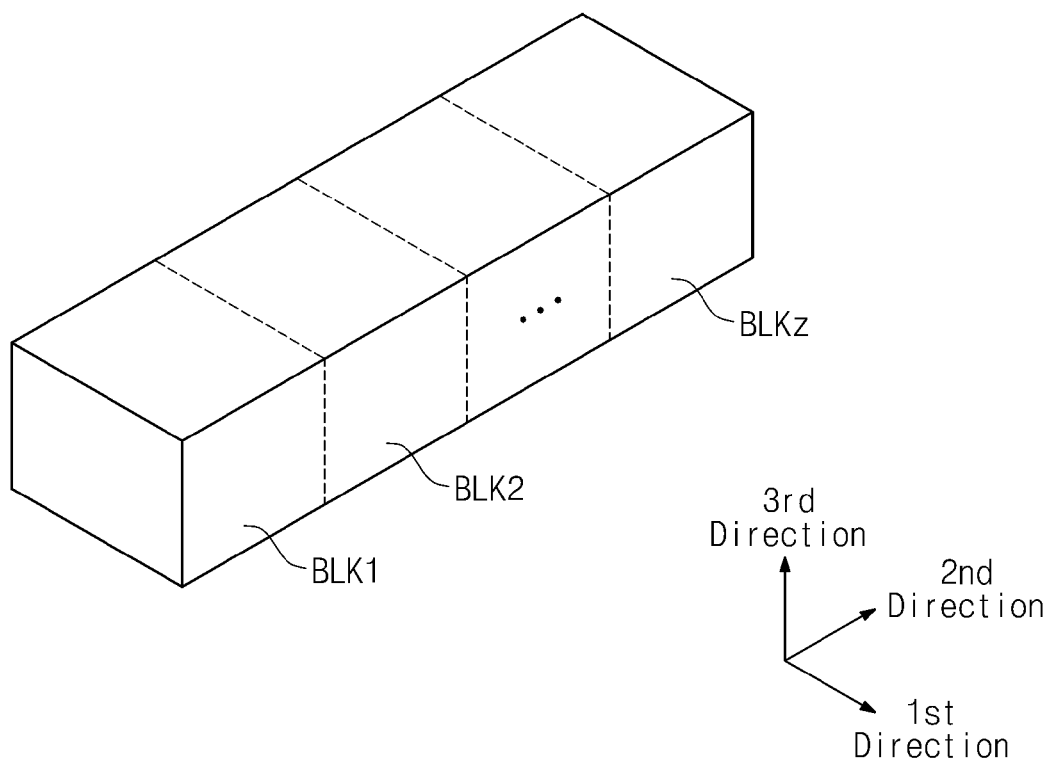
FIG. 2 is a diagram illustrating a memory cell array in FIG. 1 according to an embodiment.

FIG. 2 is a diagram illustrating a memory cell array in FIG. 1 according to an embodiment. Referring to FIGS. 1 and 2, a memory cell array 110 may include a plurality of memory blocks BLK1 to BLKz. In this example, each of the memory blocks BLK1 to BLKz may have a three-dimensional memory cell array structure (or, a vertical memory cell array structure). For example, each of the memory blocks BLK1 to BLKz may include memory cells arrays extending in the first, second and third directions. Although not shown in FIG. 2, each of the memory blocks BLK1 to BLKz may include a plurality of cell strings extending along the second direction. Although not shown in FIG. 2, a plurality of cell strings may be spaced apart from one other along the first and third directions.

Cell strings (not shown) within one memory block may be coupled with a plurality of bit lines BL, a plurality of string selection lines SSL, a plurality of word lines WL, one or more ground selection lines GSL, and a common source line. Cell strings in the plurality of memory blocks BLK1 to BLKz may share a plurality of bit lines. For example, the plurality of bit lines may extend along the second direction so as to be shared by the plurality of memory blocks BLK1 to BLKz.

The plurality of memory blocks BLK1 to BLKz may be selected by an address decoding unit 120 in FIG. 1. For example, the address decoding unit 120 may be configured to select a memory block, corresponding to an input address ADDR, from among the plurality of memory blocks BLK1 to BLKz. Erasing, programming, and reading on a selected memory block may be made. The plurality of memory blocks BLK1 to BLKz will be more fully described with reference to FIGS. 3 to 6.

Figure 3:
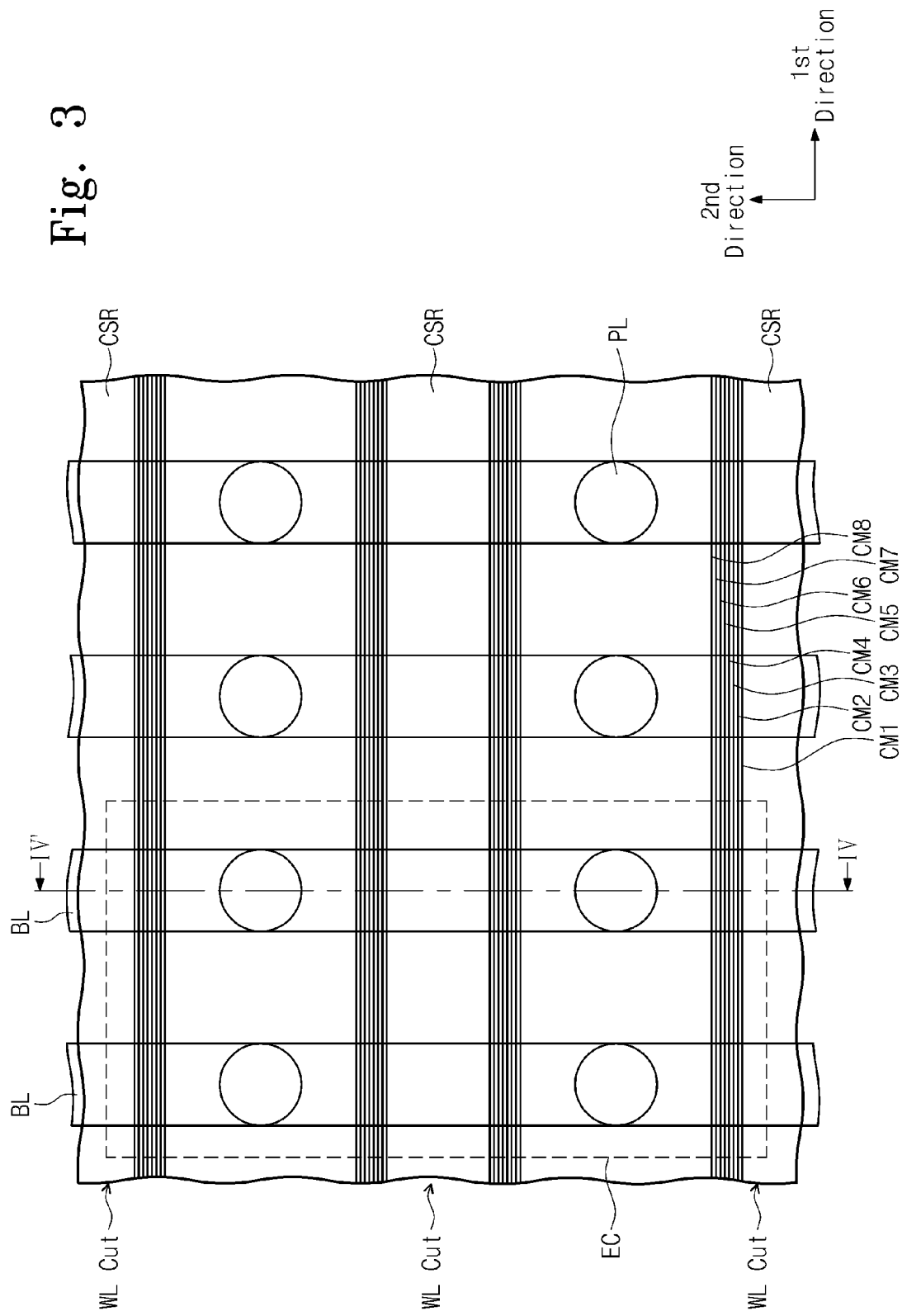
FIG. 3 is a top view of a part of one memory block in FIG. 1 according to an embodiment.
Figure 4:
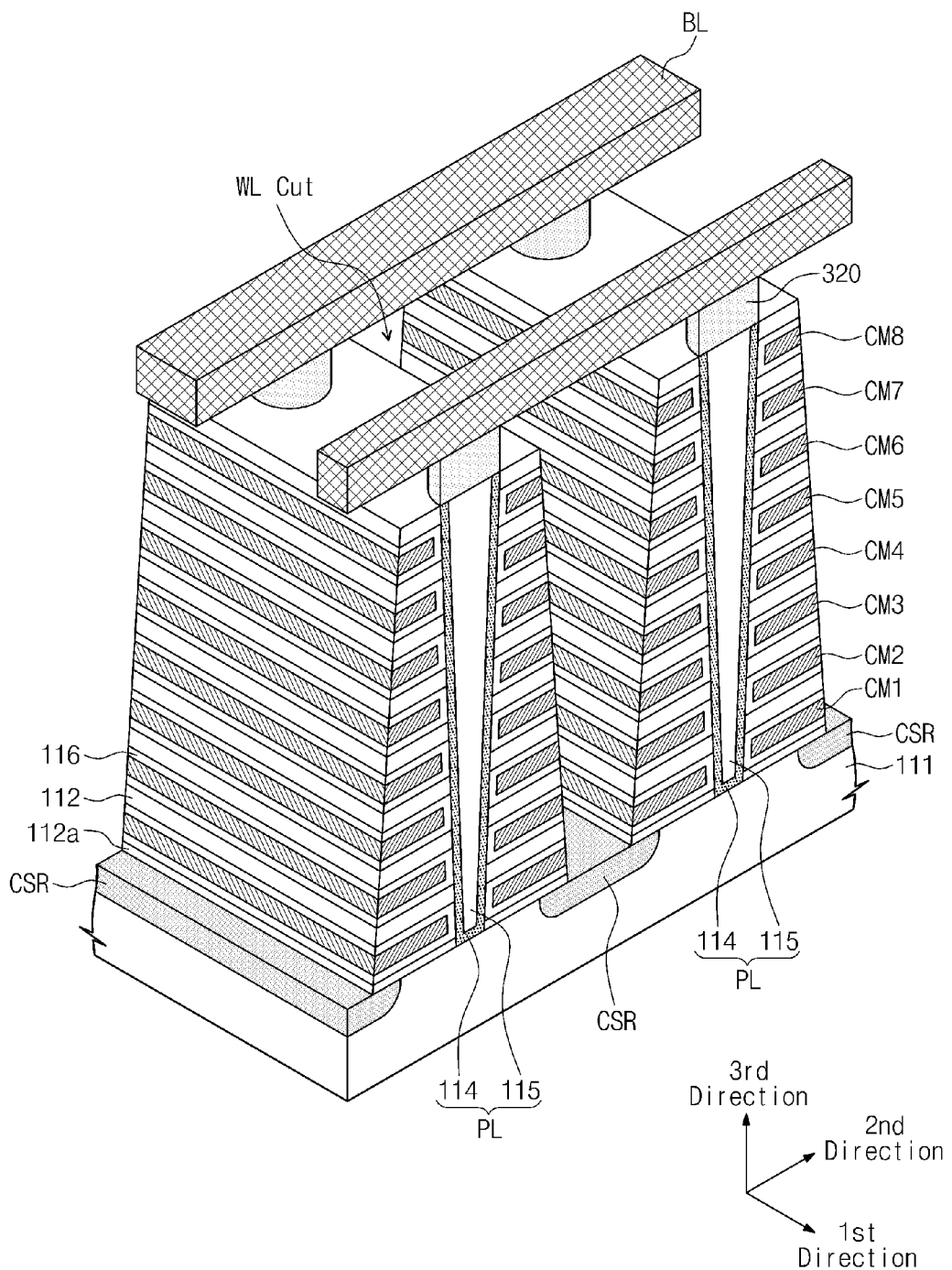
FIG. 4 is a perspective view taken along a line IV-IV' in FIG. 3 according to an embodiment.
Figure 5:
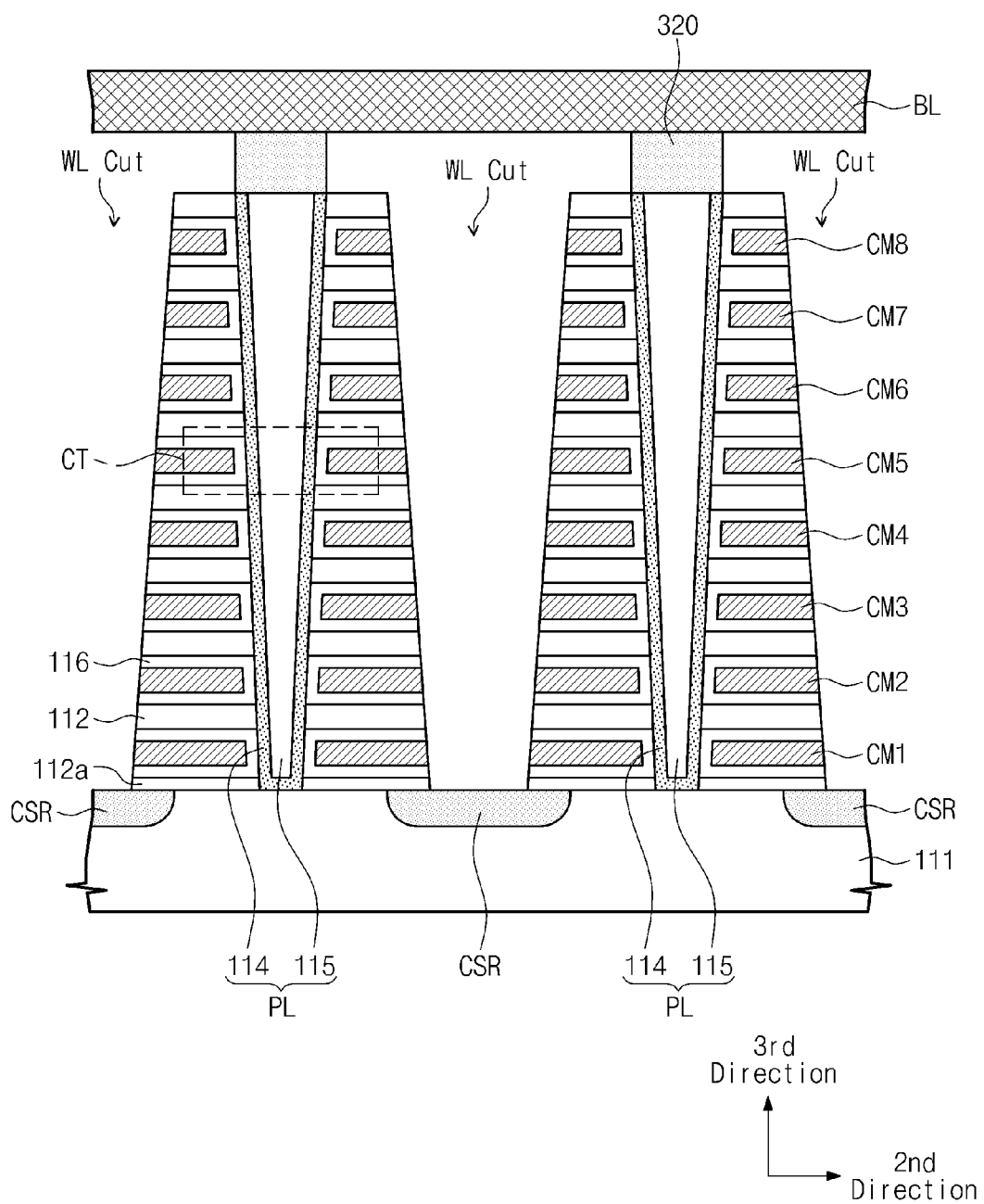
FIG. 5 is a cross-sectional view taken along a line IV-IV' in FIG. 3 according to an embodiment.

FIG. 3 is a top view of a part of one memory block in FIG. 1 according to an embodiment. FIG. 4 is a perspective view taken along a line IV-IV' in FIG. 3 according to an embodiment. FIG. 5 is a cross-sectional view taken along a line IV-IV' in FIG. 3 according to an embodiment.

Referring to FIGS. 3 to 5, three-dimensional memory cell arrays extending along first to third directions may be provided.

A substrate 111 may be provided. The substrate 111 may be a well having a first conductivity type, for example. The substrate 111 may be a p-well in which the Group III element such as boron is injected. The substrate 111 may be a pocket p-well that is provided within an n-well. Below, it is assumed that the substrate 111 is a p-well (or, a pocket p-well). However, the substrate 111 is not limited to p-type.

A plurality of common source regions CSR extending along the first direction may be provided in the substrate 111. The common source regions CSR may be spaced apart from one another along the second direction. The common source regions CSR may be connected in common to form a common source line.

The common source regions CSR may have a second conductivity type different from that of the substrate 111. For example, the common source regions CSR may be n-type. Below, it is assumed that the common source regions CSR are the n-type. However, the common source regions CSR are not limited to the n-type.

Between two adjacent regions of the common source regions CSR, a plurality of insulation materials 112 and 112a may be provided sequentially on the substrate 111 along the third direction (i.e., a direction perpendicular to the substrate 111). The insulation materials 112 and 112a may be spaced apart along the third direction. The insulation materials 112 and 112a may extend along the first direction. For example, the insulation materials 112 and 112a may include an insulation material such as a semiconductor oxide film. The insulation material 112a contacting with the substrate 111 may be thinner in thickness than other insulation materials 112.

Between two adjacent regions of the common source regions CSR, a plurality of pillars PL may be arranged sequentially along the first direction so as to penetrate the plurality of insulation materials 112 and 112a along the second direction. For example, the pillars PL may contact with the substrate 111 through the insulation materials 112 and 112a.

In an embodiment, the pillars PL between two adjacent common source regions CSR may be spaced apart along the first direction. The pillars PL may be disposed in line along the first direction.

In an embodiment, the pillars PL may be formed of a plurality of materials, respectively. Each of the pillars PL may include a channel film 114 and an inner material 115 provided within the channel film 114.

The channel films 114 may include a semiconductor material (e.g., silicon) having a first conductivity type. For example, the channel films 114 may include a semiconductor material (e.g., silicon) having the same type as the substrate 111. The channel films 114 can include intrinsic semiconductor being a nonconductor.

The inner materials 115 may include an insulation material. For example, the inner materials 115 may include an insulation material such as silicon oxide. Alternatively, the inner materials 115 may include air gap.

Between two adjacent regions of the common source regions CSR, information storage films 116 may be provided on exposed surfaces of the insulation materials 112 and 112a and the pillars PL. The information storage films 116 may store information by trapping or discharging charges.

Between two adjacent common source regions CSR and between the insulation materials 112 and 112a, conductive materials CM1 to CM8 may be provided on exposed surfaces of the information storage films 116. The conductive materials CM1 to CM8 may extend along the first direction. The conductive materials CM1 to CM8 on the common source regions CSR may be separated by word line cuts. The common source regions CSR may be exposed by the word line cuts. The word line cuts may extend along the first direction.

In an embodiment, the conductive materials CM1 to CM8 may include a metallic conductive material. The conductive materials CM1 to CM8 may include a nonmetallic conductive material such as polysilicon.

In an embodiment, information storage films 116 provided on an upper surface of an insulation material placed at the uppermost layer among the insulation materials 112 and 112a can be removed. Exemplarily, information storage films, provided at sides opposite to the pillars PL, from among sides of the insulation materials 112 and 112a can be removed.

A plurality of drains 320 may be provided on the plurality of pillars PL, respectively. The drains 320 may include a semiconductor material (e.g., silicon) having a second conductivity type, for example. The drains 320 may include an n-type semiconductor material (e.g., silicon). Below, it is assumed that the drains 320 include n-type silicon. However, the prevent invention is not limited thereto. The drains 320 can be extended to the upside of the channel films 114 of the pillars PL.

Bit lines BL extending in the second direction may be provided on the drains 320 so as to be spaced apart from one another along the first direction. The bit lines BL may be coupled with the drains 320. In this embodiment, the drains 320 and the bit lines BL may be connected via contact plugs (not shown). The bit lines BL may include a metallic conductive material. Alternatively, the bit lines BL may include a nonmetallic conductive material such as polysilicon.

Below, the conductive materials CM1 to CM8 may have first height to the eighth height according to a distance from the substrate 111.

The plurality of pillars PL may form a plurality of cell strings together with the information storage films 116 and the plurality of conductive materials CM1 to CM8. Each of the pillars PL may form a cell string with information storage films 116 and adjacent conductive materials CM1 to CM8.

The pillars PL may be provided on the substrate 111 along row and column directions. The eighth conductive materials CM8 may constitute rows. Pillars connected with the same eighth conductive material CM8 may constitute one row. The bit lines BL may constitute columns. Pillars connected with the same bit line BL may constitute a column. The pillars PL may constitute a plurality of strings arranged along row and column directions together with the information storage films 116 and the plurality of conductive materials CM1 to CM8. Each cell string may include a plurality of cell transistors CT stacked in a direction perpendicular to the substrate 111.

Figure 6:
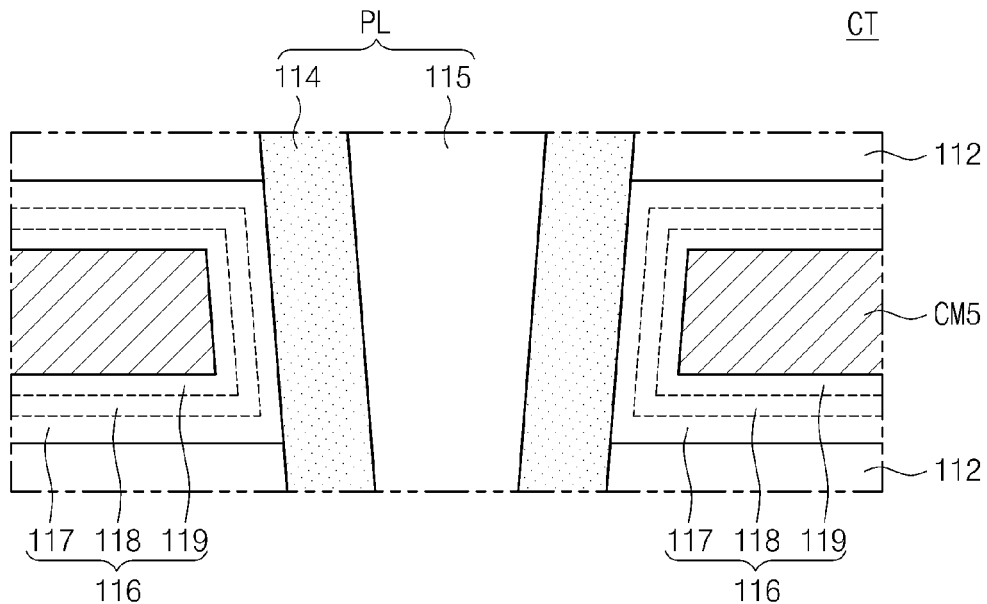
FIG. 6 is an enlarged diagram illustrating one of cell transistors in FIG. 5.

FIG. 6 is an enlarged diagram illustrating one of cell transistors in FIG. 5. Referring to FIGS. 3 to 6, cell transistors CT may be formed of conductive materials CM1 to CM8, pillars PL, and information storage films 116 provided between the conductive materials CM1 to CM8 and the pillars PL.

The information storage films 116 may extend to upper surfaces and lower surfaces of the conductive materials CM1 to CM8 from regions between the conductive materials CM1 to CM8 and the pillars PL. Each of the information storage films 116 may include first to third sub insulation films 117, 118, and 119.

In the cell transistors CT, the channel films 114 of the pillars PL may include the same p-type silicon as the substrate 111. The channel films 114 may act as bodies of cell transistors CT. The channel films 114 may be formed in a direction perpendicular to the substrate 111. The channel films 114 of the pillars PL may act as a vertical body. Vertical channels may be formed at the channel films 114.

The first sub insulation films 117 adjacent to the pillars PL may act as tunneling insulation films of the cell transistors CT. For example, the first sub insulation films 117 may include a thermal oxide film, respectively. The first sub insulation films 117 may include a silicon oxide film, respectively.

The second sub insulation films 118 may act as charge storage films of the cell transistors CT. For example, the second sub insulation films 118 may act as a charge trap film, respectively. For example, the second sub insulation films 118 may include a nitride film or a metal oxide film, respectively.

The third sub insulation films 119 adjacent to the conductive materials CM1 to CM8 may act as blocking insulation films of the cell transistors CT. In this embodiment, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

In this embodiment, the first to third sub insulation films 117 to 119 may constitute ONA (oxide-nitride-aluminum-oxide) or ONO (oxide-nitride-oxide).

The plurality of conductive materials CM1 to CM8 may act as a gate (or, a control gate), respectively.

That is, the plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute a plurality of cell transistors CT stacked in a direction perpendicular to the substrate 111. Exemplarily, the cell transistors CT may be a charge trap type cell transistor.

The cell transistors CT can be used for different purposes according to height. For example, among the cell transistors CT, cell transistors having at least one height and placed at an upper portion may be used as string selection transistors. The string selection transistors may be configured to perform switching operations between cell strings and bit lines. Among the cell transistors CT, cell transistors having at least one height and placed at a lower portion may be used as ground selection transistors. The ground selection transistors may be configured to perform switching operations between cell strings and a common source line formed of common source regions CSR. Cell transistors between cell transistors used as string and ground selection transistors may be used as memory cells and dummy memory cells.

The conductive materials CM1 to CM8 may extend along the first direction to be connected with the plurality of pillars PL. The conductive materials CM1 to CM8 may constitute conductive lines interconnecting cell transistors CT of the pillars PL. In this embodiment, the conductive materials CM1 to CM8 may be used as a string selection line, a ground selection line, a word line, or a dummy word line according to the height.

Conductive lines interconnecting cell transistors used as string selection transistors may be used as string selection lines. Conductive lines interconnecting cell transistors used as ground selection transistors may be used as ground selection lines. Conductive lines interconnecting cell transistors used as memory cells may be used as word lines. Conductive lines interconnecting cell transistors used as dummy memory cells may be used as dummy word lines.

Figure 7:
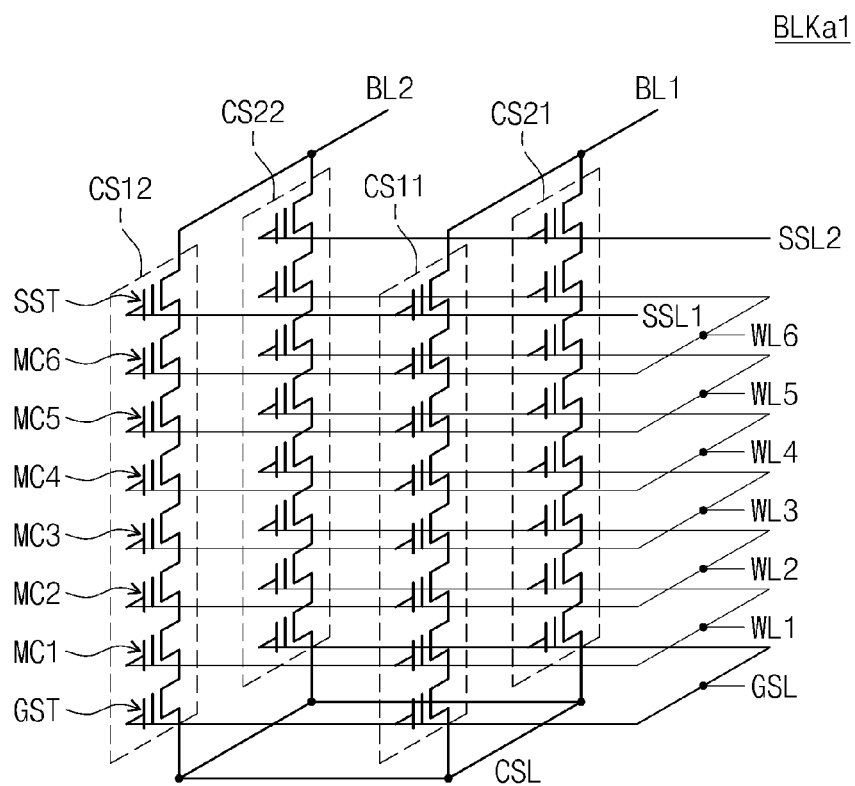
FIG. 7 is a circuit diagram illustrating an equivalent circuit of a part EC of a top view in FIG. 3 according to an embodiment.

FIG. 7 is a circuit diagram illustrating an equivalent circuit of a part EC of a top view in FIG. 3 according to an embodiment. Referring to FIGS. 3 to 7, cell strings CS11, CS12, CS21, and CS22 may be provided between bit lines BL1 and BL2 and a common source line CSL. Cell strings CS11 and CS21 may be connected between the first bit line BL1 and the common source line CSL, and cell strings CS12 and CS22 may be connected between the second bit line BL2 and the common source line CSL.

Common source regions CSR may be connected in common to form a common source line CSL.

The cell strings CS11, CS12, CS21, and CS22 may correspond to four pillars of a part EC of a top view in FIG. 3. The four pillars may constitute four cell strings CS11, CS12, CS21, and CS22 together with conductive materials CM1 to CM8 and information storage films 116.

In this embodiment, the first conductive materials CM1 may constitute ground selection transistors GST with the information storage films 116 and the pillars PL. The first conductive materials CM1 may form a ground selection line GSL. The first conductive materials CM1 may be interconnected to form a ground selection line GSL.

The second to seventh conductive materials CM2 to CM7 may constitute first to sixth memory cells MC1 to MC6 with the information storage films 116 and the pillars PL. The second to seventh conductive materials CM2 to CM7 may be used as second to sixth word lines WL2 to WL6.

The second conductive material CM2 may be interconnected to form the first word line WL1. The third conductive material CM3 may be interconnected to form the second word line WL2. The fourth conductive material CM4 may be interconnected to form the third word line WL3. The fifth conductive material CM5 may be interconnected to form the fourth word line WL4. The sixth conductive material CM6 may be interconnected to form the fifth word line WL5. The seventh conductive material CM7 may be interconnected to form the sixth word line WL6.

The eighth conductive materials CM8 may constitute string selection transistors SST with the information storage films 116 and the pillars PL. The eighth conductive materials CM8 may form string selection lines SSL1 and SSL2.

Memory cells of the same height may be connected in common with one word line. Accordingly, when applied to a word line of a specific height, a voltage may be applied to all cell strings CS11, CS12, CS21, and CS22.

Cell strings in different rows may be connected with different string selection lines SSL1 and SSL2, respectively. The cell strings CS11, CS12, CS21, and CS22 may be selected or unselected by the row by selecting or unselecting the string selection lines SSL1 and SSL2. For example, cell strings (CS11 and CS12) or (CS21 and CS22) connected with an unselected string selection line SSL1 or SSL2 may be electrically separated from the bit lines BL1 and BL2. Cell strings (CS21 and CS22) or (CS11 and CS12) connected with a selected string selection line SSL2 or SSL1 may be electrically connected with the bit lines BL1 and BL2.

The cell strings CS11, CS12, CS21, and CS22 may be connected with the bit lines BL1 and BL2 by the column. The cell strings CS11 and CS21 may be connected with the bit line BL1, and the cell strings CS12 and CS22 may be connected with the bit line BL2. The cell strings CS11, CS12, CS21, and CS22 may be selected and unselected by the column by selecting and unselecting the bit lines BL1 and BL2.

Figure 8A:
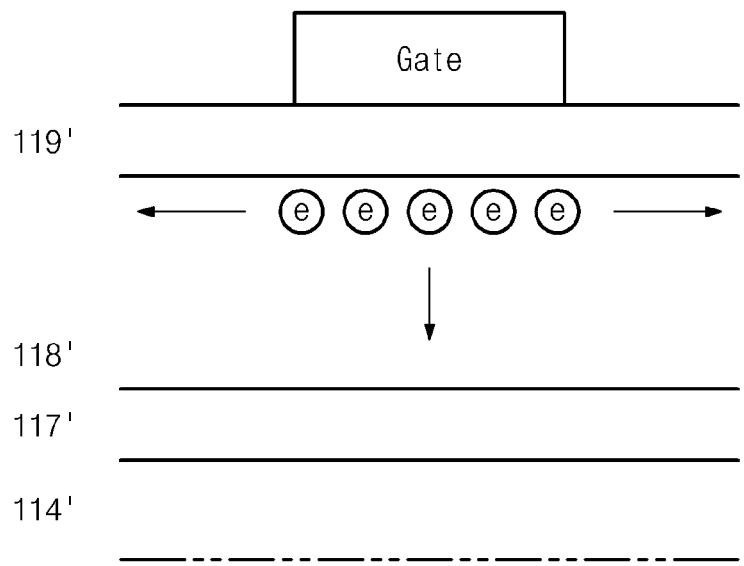
FIGS. 8A-8D illustrate exemplary charge rearrangement phenomena.

FIG. 8A is a diagram of an exemplary memory cell transistor, showing a plurality of electrons e trapped in charge trapping layer 118' under the gate of the memory cell transistor. The charge trapping layer 118' may be a nitride film or a metal oxide film. The charge trapping layer 118' is sandwiched between insulation films 119' and 117', which may be silicon oxide films, e.g. A channel of the memory cell transistor may be formed in layer 114', which may be formed in or from a semiconductor substrate, such as a silicon germanium, gallium arsenide or indium phosphide crystalline wafer.

Figure 8B:
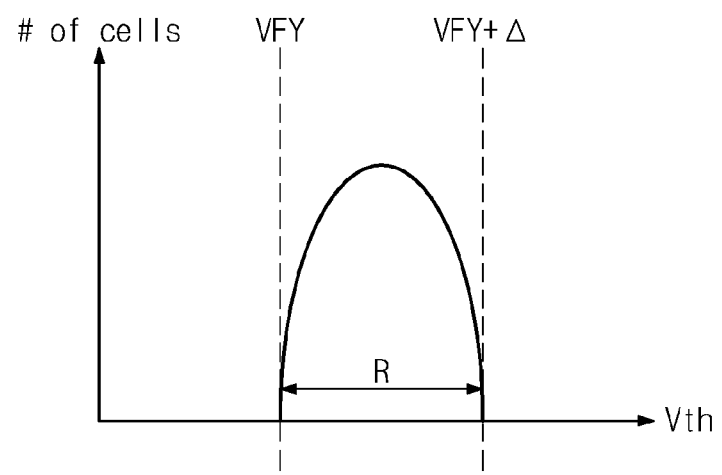

FIG. 8B illustrates an exemplary Vth (voltage threshold) distribution range R of a plurality of memory cell transistors immediately after programming the plurality of memory cell transistors. The plurality of memory cell transistor cells may be connected to the same word line and may be programmed simultaneously. The Vth distribution range R may represent a value of a bit in SLC memory cell transistors (e.g., a "0") or values of bits stored in MLC memory cell transistors (e.g., "0/1"). Other Vth distribution ranges (not shown) may represent other values of a bit (for SLC memory cell transistors) or bits (for MLC memory cell transistors). The Vth range of FIG. 8B may extend from a program verify voltage VFY to a second voltage value VFY+Δ.

Figure 8C:
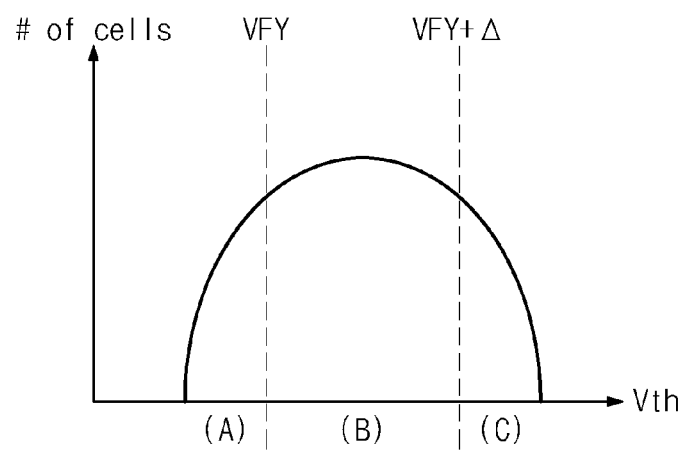

FIG. 8C illustrates an exemplary Vth distribution of the plurality of memory cell transistors after charge rearrangement within each memory cell transistor of the plurality of memory cell transistors. As shown by the arrows in FIG. 8A, electrons within charge trapping layer 118' may move after initially being trapped in the charge trapping layer 118' during programming. Electrons that migrate downwards away from the gate and towards the channel (in layer 114') may act to increase the voltage threshold Vth of that memory cell transistor, and electrons that migrate horizontally (left or right in FIG. 8A) may act to decrease the voltage threshold Vth of that memory cell transistor. Thus, voltage threshold Vth of a memory cell transistor may naturally increase or decrease outside of the voltage threshold range R after some period of time after programming, despite being initially programmed to within range R. For the plurality of memory cell transistors discussed above with respect to FIG. 8B, an exemplary voltage threshold range after charge rearrangement is shown in FIG. 8C. As seen in 8C, the voltage threshold range after charge rearrangement is larger than range R of FIG. 8B, including memory cell transistors with voltage thresholds greater than range R (at C—an example of "upper tail" or "over tail" memory cell transistors) and memory cell transistors with voltage thresholds less than range R (at A—an example of "under tail" memory cell transistors). If margins between adjacent Vth ranges representing different values of a bit (or bits) is small, such charge rearrangement may lead to incorrect interpretation (or an inability to interpret) a threshold value of a memory cell transistor. For example, memory cell transistors at A or C may have voltage threshold values in a range associated with a different data bit value (or different values of bits).

Figure 8D:
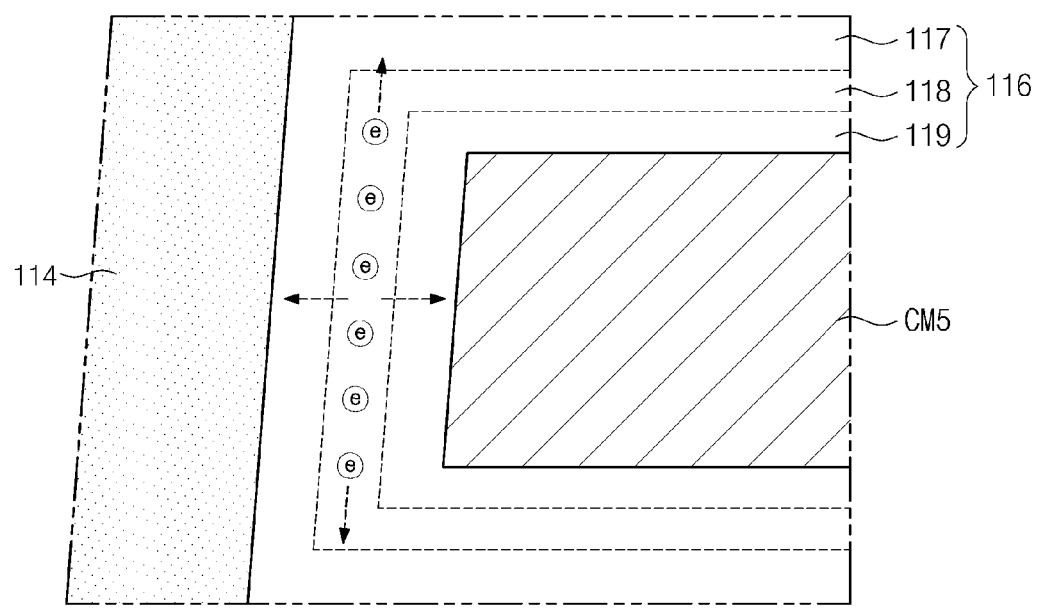

FIG. 8D is an enlarged diagram of a right portion of a cell transistor in FIG. 6. Referring to FIG. 8D, there are illustrated information storage film 116 including first to third sub insulation films 117 to 119, a fifth conductive material CM5, and a channel film 114.

When a cell transistor CT in FIGS. 6 and 8D is programmed, charges of the channel film 114 may pass through the first sub insulation film 117 to be trapped by the second sub insulation film 118. As charges are trapped by the second sub insulation film 118, a threshold voltage of the cell transistor CT may be adjusted.

Charges just trapped by the second sub insulation film 118 may be at an unstable state. Charge rearrangement may occur when trapped charges may shift within the second sub insulation film 118 to reach a stable state.

Electric fields among the fifth conductive material CM5, the trapped charges, and the channel film 114 may be varied before and after charge rearrangement. That is, a threshold voltage of the cell transistor CT may be varied before and after charge rearrangement. Although the cell transistor CT is programmed to have a target threshold voltage, its threshold voltage may become higher or lower than the target threshold voltage due to the charge rearrangement.

Programming may be made considering the charge rearrangement to reduce or prevent the above-described problem.

FIG. 9 is a flowchart for describing a program method according to an embodiment. Referring to FIGS. 1, 7, and 9, in operation S110, program data to be stored into memory cells may be received. For example, program data may be received. The received program data may be intended to be stored in memory cells corresponding to a selected string selection line and a selected word line. The program data may be first stored in data latches DL prior to storage in the memory cells.

In operation S120, whether the program data corresponds to MSB programming may be determined. If the program data is determined not to correspond to MSB programming, in operation S140, program data may be stored into the memory cells in a typical fashion. For example, the program data may be stored under the condition that charge rearrangement is not considered.

If the program data is determined to correspond to MSB programming, read operations S130 and S150 may be performed prior to the MSB programming in step S160. In operation S130, a read operation on the memory cells may be performed to determine an erase state and at least one program state. For example, if the MSB programming is to program a word line of memory cells previously programmed with LSB data, a read operation on the memory cells of this word line may be performed to determine the LSB data of the word line. The LSB data of the memory cells may be represented as an erase state (e.g., LSB data of "1") and a program state (e.g., LSB data of "0"). A read result may be stored in the data latches DL.

In operation S150, a state read operation on at least one program state may be performed using a plurality of state read voltages. For example, a state read operation on at least one program state of each memory cell may be executed. In the example of MSB programming a word line of memory cells and reading LSB data of that word line in step S130, the state read operation of S150 may perform one or more state reads of memory cells with LSB data of "0", that is, those memory cells of the word line having been previously programmed during the LSB programming operation. A state read result may be stored in rearrangement latches RL.

In operation S160, the MSB program data may be programmed into the memory cells using a plurality of verification voltages with different levels, according to the state read result. For example, in the MSB programming, some of the memory cells of a word line may be targeted for shifting of a Vth level of the memory cells to a particular Vth range to indicate a particular MSB/LSB data (e.g., a Vth range indicating "0/0" data for LSB and MSB data). These "0/0" data memory cells may be programmed using different verification voltages.

The state read operation and the program operation responsive to the state read result need not be limited to programming MSB data. The state read operation and the program operation responsive to the state read result can be also applied to program data that is not MSB data.

Figure 10:
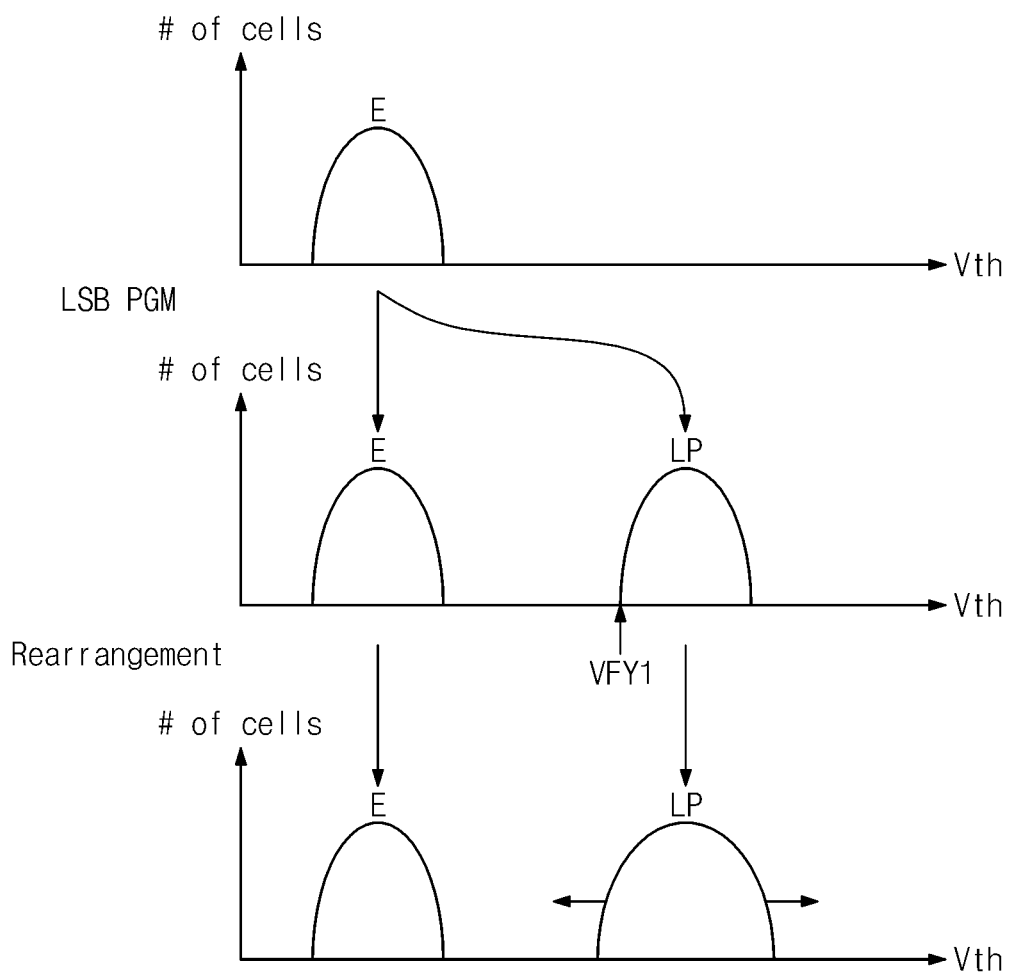
FIG. 10 is a diagram illustrating threshold voltage distributions of memory cells when LSB data is programmed into memory cells.

FIG. 10 is a diagram illustrating threshold voltage distributions of memory cells when LSB data is programmed into certain memory cells, such as certain EEPROM memory cells, NOR flash memory cells and NAND flash memory cells. In FIG. 10, a horizontal axis indicates a threshold voltage, and a vertical axis indicates the number of memory cells. The memory cells represented may be memory cells connected to a word line of the memory array, such as a physical page of memory cells in a NAND flash memory.

Before LSB data is programmed, memory cells may be at an erase state E. In this embodiment and other embodiments described herein, the erase operation is not described, but may be any known operation. If the memory device is a flash memory device, the erase operation may simultaneously erase a block of memory cells, lowering their threshold values to an erase state E. If memory cells with the erase state E are then programmed with LSB data, they may have either one of an erase state and an LSB program state LP, respectively, depending on the LSB data the memory cell is intended to store (e.g., an erase state may represent "1" LSB data and the LSB program state LP may represent "0" LSB data). The memory cells programmed to the LSB program state LP may be programmed to have a threshold voltage higher than a verification voltage VFY1.

Memory cells programmed to the LSB program state LP may experience charge rearrangement. The charge rearrangement may force threshold voltages of the memory cells to be varied. The threshold voltages of the memory cells may be varied by other mechanisms other than charge rearrangement, such as by charge leakage, read disturbance (e.g., charge injection due to reading) or by charge coupling with neighboring memory cells. This may mean that a threshold voltage distribution of memory cells having the LSB program state LP widens.

Figure 11:
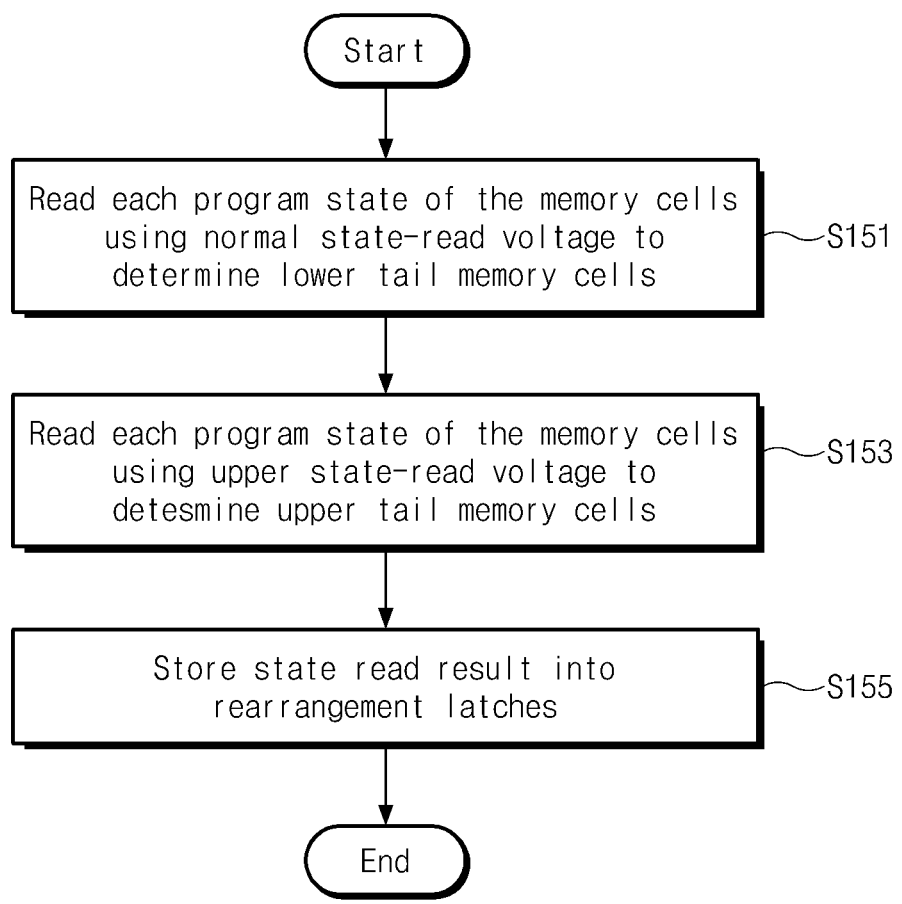
FIG. 11 is a flowchart for fully describing an operation S150 of performing a state read operation in FIG. 9.

FIG. 11 is a flowchart providing exemplary details of operation S150 of performing a state read operation in FIG. 9. Referring to FIGS. 1, 9, and 11, in operation S151, program states of memory cells may be read using a normal state read voltage to determine lower tail memory cells. For example, memory cells programmed to the LSB program state LP that are read as memory cells having a threshold voltage lower than the normal state read voltage may be judged to be the lower tail memory cells.

In operation S153, program states of memory cells may be read using an upper state read voltage to determine upper tail memory cells. For example, memory cells programmed to the LSB program state LP that are read as memory cells having a threshold voltage higher than the normal state read voltage may be judged to be the upper tail memory cells. The upper state read voltage may be higher in level than the normal state read voltage.

In operation S155, a state read result may be stored in rearrangement latches RL. The state read result may indicate which of the memory cells programmed to the LSB program state LP are the lower tail memory cells, the upper tail memory cells and which are neither lower tail nor upper tail memory cells (e.g., normal memory cells).

Figure 12:
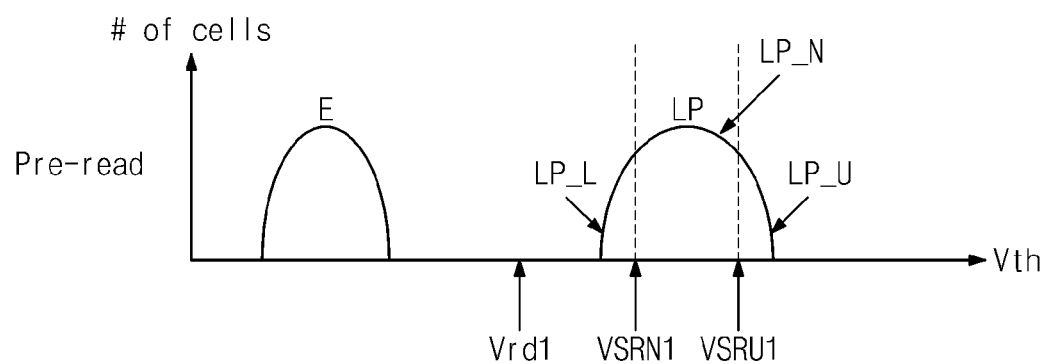
FIG. 12 is a diagram illustrating a method of performing a state read operation in FIG. 11.

FIG. 12 is a diagram illustrating an exemplary method of performing a state read operation of FIG. 11. Referring to FIGS. 1, 11, and 12, a state read operation may be performed for each program state (e.g., each Vth range representing data previously programmed into the memory cells). In FIG. 12, there is only one program state, LSB program state LP, and thus this example describes the state read operation with respect to the LSB program state LP.

A read voltage Vrd1 may be a voltage used to discriminate those memory cells having an erase state E from those memory cells having an LSB program state LP. For example, the read voltage Vrd1 may be applied to the selected word line while unselected word lines have a pass voltage applied thereto (to assure memory cell transistors connected to the unselected word lines are turned on). After or during a charge application to bit lines respectively connected to the selected memory cells, the application of the read voltage Vrd1 to the selected word line allows the charge (voltage) on a corresponding bit line to drain to ground for those memory cells of the selected word line having a threshold voltage lower than Vrd1 (these memory cells being turned on), while those memory cells of the selected word line having a threshold voltage higher than Vrd1 remain off, keeping a charge on corresponding bit lines. Detection of the charge or voltage on a bit line may therefore be used to determine a voltage threshold (Vth) level of a corresponding memory cell connected to the selected word line, and thus be used to represent corresponding data.

A state read operation may be performed using a normal state read voltage VSRN1. Those memory cells having an LSB program state LP and having a threshold voltage lower than the normal state read voltage VSRN1 may be judged to be lower tail memory cells LP_L.

A state read operation may be performed using an upper state read voltage VSRU1. Those memory cells having an LSB program state LP and having a threshold voltage higher than the upper state read voltage VSRU1 may be judged to be upper tail memory cells LP_U. If there is no program state higher than LSB program state LP previously programmed in the memory cells (e.g., the page or word line of memory cells), any memory cell of the memory cells (e.g., of the page or word line of memory cells) having a threshold voltage higher than the upper state read voltage VSRU1 may be judged to be upper tail memory cells LP_U.

Memory cells that have a threshold voltage higher than the normal state read voltage VSRN1 and lower than the upper state read voltage VSRU1 may be judged to be normal memory cells LP_N.

In an embodiment, the normal state read voltage VSRN1 and the upper state read voltage VSRU1 can have levels corresponding to a range of a threshold voltage distribution of memory cells with the LSB program state LP when no charge rearrangement is generated. The normal state read voltage VSRN1 may have the same level as a verification voltage VFY1 (refer to FIG. 10) used when memory cells are programmed to have the LSB program state LP. The upper state read voltage VSRU1 may have a level equal to the upper end of the range of the LSB program state LP, which may be estimated during the design of the memory device, estimated based on testing similar memory devices or by testing the memory device during a post manufacturing process, or periodically determined and adjusted by performing a series of incremental read operation on the LSB program state LP data shortly after programming during the life of the memory device (e.g., corresponding to the highest Vth of memory cells programmed to the LSB program state LP immediately or shortly after programming those memory cells).

The lower tail memory cells LP_L may have a threshold voltage level lower than the normal state read voltage VSRN1. That is, the lower tail memory cells LP_L may be memory cells whose threshold voltages are lowered due to the charge rearrangement or other factors.

The upper tail memory cells LP_U may have a threshold voltage level higher than the upper state read voltage VSRU1. That is, the upper tail memory cells LP_U may be memory cells whose threshold voltages become higher due to the charge rearrangement or other factors. As the state read operation is executed, it is possible to determine the lower tail memory cells LP_L whose threshold voltages are lowered due to the charge rearrangement and the upper tail memory cells LP_U whose threshold voltages become higher due to the charge rearrangement. That is, it is possible to discriminate characteristics of threshold voltages of memory cells varied due to the charge rearrangement or other factors.

Figure 13:
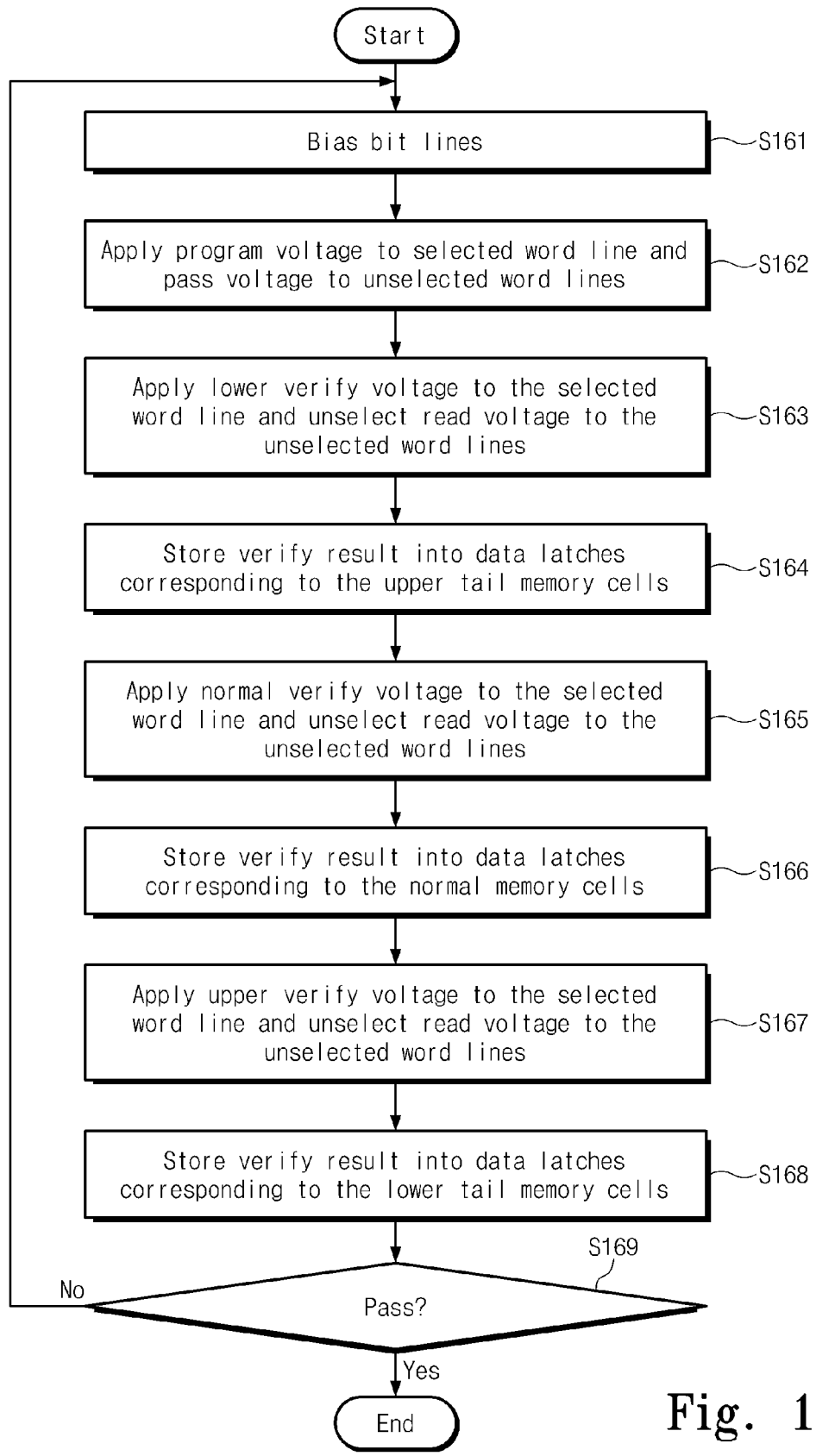
FIG. 13 is a flowchart for fully describing an operation S160 of programming memory cells with program data in FIG. 9.

FIG. 13 is a flowchart for describing exemplary details of operation S160 of programming memory cells with program data in FIG. 9. Referring to FIGS. 1, 9, and 13, in operation S161, bit lines BL may be biased. For example, the bit lines BL may be biased according to data stored in data latches DL. For example, the bit lines BL may be biased according to program data and data previously stored in memory cells. In response to a level of bias voltage applied to the bit lines (e.g., a logic high or logic low voltage), memory cells connected to the bit line may be selected for programming or prevented from being programmed. See, e.g., U.S. Pat. No. 5,473,563 for exemplary biasing of bit lines to prevent or allow memory cells to be programmed in a programming step. U.S. Pat. No. 5,473,563 is incorporated by reference for its teachings of flash memory programming operations and related structure, as well as for providing exemplary detail regarding structure, layout and operations of two-dimensional NAND flash memory.

In operation S162, a program voltage VPGM may be supplied to a selected word line, and a pass voltage VPASS may be supplied to unselected word lines. The program voltage VPGM may be a voltage sufficient to enable the Fowler-Nordheim tunneling to be generated at memory cells of the selected word line that are selected for programming (e.g., in response to the bias voltage applied to the bit lines). The pass voltage VPASS may be a voltage sufficient to turn on those memory cells associated with unselected word lines (e.g., memory cells of a memory cell string that are not connected to the selected word line) to form channels in these memory cells.

In operations S163, S164, S165, S166, S167 and S168 verification of the programming of the memory cells of the selected word line is performed with different verification voltages. The verification voltage used to verify programming depends on whether the memory cell was previously determined to be an upper tail memory cell LP_U, a normal memory cell LP_N or a lower tail memory cell LP_L. In operation S163, a lower verification voltage may be applied to the selected word line, and a non-selection read voltage may be applied to the unselected word lines. The lower verification voltage may be lower in level than a normal verification voltage. The non-selection read voltage may be a voltage sufficient to turn on those memory cells associated with unselected word lines (e.g., memory cells of a memory cell string that are not connected to the selected word line) to form channels in these memory cells.

In operation S164, a verification result may be stored in data latches DL corresponding to upper tail memory cells LP_U. A lower verification voltage may be applied to the selected word line to verify programming of the upper tail memory cells LP_U. In this example, lower verification voltage may not be used to verify normal memory cells LP_N and lower tail memory cells LP_L.

In operation S165, a normal verification voltage may be provided to the selected word line to verify programming of the normal memory cells LP_N, and a non-selection read voltage may be provided to the unselected word lines. The normal verification voltage may be higher than the lower verification voltage and lower than an upper verification voltage. In operation S166, a verification result may be stored in data latches DL corresponding to normal memory cells. In this example, the normal verification voltage may be used to verify the normal memory cells LP_N, while it may not be used to verify upper tail memory cells LP_U and lower tail memory cells LP_L.

In operation S167, an upper verification voltage may be applied to the selected word line, and a non-selection read voltage may be applied to the unselected word lines. The upper verification voltage may be higher in level than the normal verification voltage. In operation S168, a verification result may be stored in data latches DL corresponding to lower tail memory cells LP_L. That is, the upper verification voltage may be used to verify the lower tail memory cells LP_L, while it may not be used to verify normal memory cells LP_N and upper tail memory cells LP_U.

In operation S169, program pass may be judged. The programming operation may end when it is determined that all memory cells to be programmed have been verified to be programmed to a Vth level past their corresponding verification voltage (as described above with respect to steps S163, S165 and S167) and as reflected by the results stored in corresponding data latches (as described above with respect to steps S164, S166 and S168). The programming of the word line may thus end at step S169, either completely for this data or for this data set (e.g., "0/1") and proceed to the next data set (e.g., "0/0"). If it is determined that some of the memory cells have not been programmed to a Vth level past their corresponding verification level, the method may return to the beginning and repeat the programming and verification. Steps S161 to S169 may be repeated until programming of all selected memory cells is confirmed by Step S169 (pass) or for a certain (e.g., predetermined) number of times (which may indicate a failure of programming of the word line, and may indicate a faulty set of memory cells or a "bad block" of memory cells needing replacement).

Figure 14:
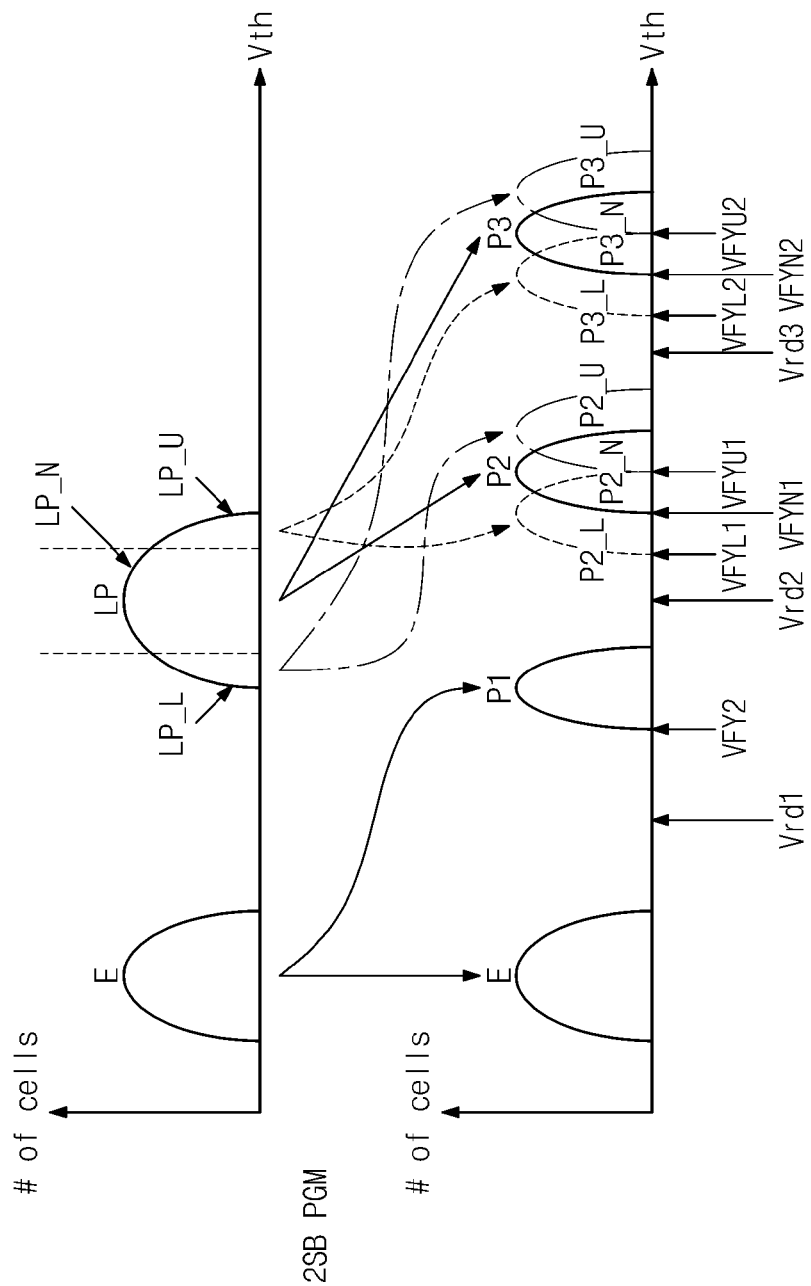
FIG. 14 is a diagram illustrating threshold voltage distributions of memory cells programmed according to a program method in FIG. 13.

FIG. 14 is a diagram illustrating threshold voltage distributions of memory cells programmed according to a program method in FIG. 13. In this example, memory cells of a selected word line are to be programmed with a second significant bit 2SB. Prior to programming the memory cells of the selected word line with the second significant bit 2SB, the memory cells of the selected word line have been programmed with LSB least significant bit data and either have an erase state E Vth (representing one binary logic value of LSB data, such as "1") or have been programmed from the erase state E to the LSB program state LP (representing the other binary logic value of LSB data, such as "0").

Referring to FIGS. 1, 9 and 14, memory cells with an LSB program state LP may be programmed to a second program state P2 or a third program state P3. Memory cells with an erase state E may maintain the erase state E or may be programmed to a first program state P1. The resulting states (erase state, and program states P1, P2 and P3) may each represent two bits of data (LSB data and 2SB data). For example, the erase state, and program states P1, P2 and P3 states may respectively represent 2SB/LSB data bits as "1/1", "0/1" "1/0" and "0/0".

When programming 2SB data to cells previously programmed to the LSB program state LP by increasing a threshold voltage value of the memory cells to either the P2 program state or P3 program state, memory cells LP_N with the LSB program state LP may be programmed to a second normal program state P2_N or a third normal program state P3_N using a normal verification voltage VFYN1 or VFYN2. Upper tail memory cells LP_U with the LSB program state LP may be programmed to a second lower program state P2_L or a third lower program state P3_L using a lower verification voltage VFYL1 or VFYL2. Lower tail memory cells LP_L with the LSB program state LP may be programmed to a second upper program state P2_U or a third upper program state P3_U using an upper verification voltage VFYU1 or VFYU2. For each of these memory cells in the LSB program state (LP_L, LP and LP_U), the 2SB data bit to be programmed into the memory cell may determine whether the memory cell is programmed to the second normal program state P2 (P2_U, P2_N or P2_L, respectively) or the third normal program state P3 (P3_U, P3_N or P3_L, respectively).

The second lower program state P2_L, the second normal program state P2_N, and the second upper program state P2_U may constitute the second program state P2. The third lower program state P3_L, the third normal program state P3_N, and the third upper program state P3_U may constitute the third program state P3.

The lower verification voltage VFYL1 or VFYL2 may be respectively lower in level than the normal verification voltage VFYN1 or VFYN2, and the upper verification voltage VFYU1 or VFYU2 may be respectively higher in level than the normal verification voltage VFYN1 or VFYN2.

Figure 15:
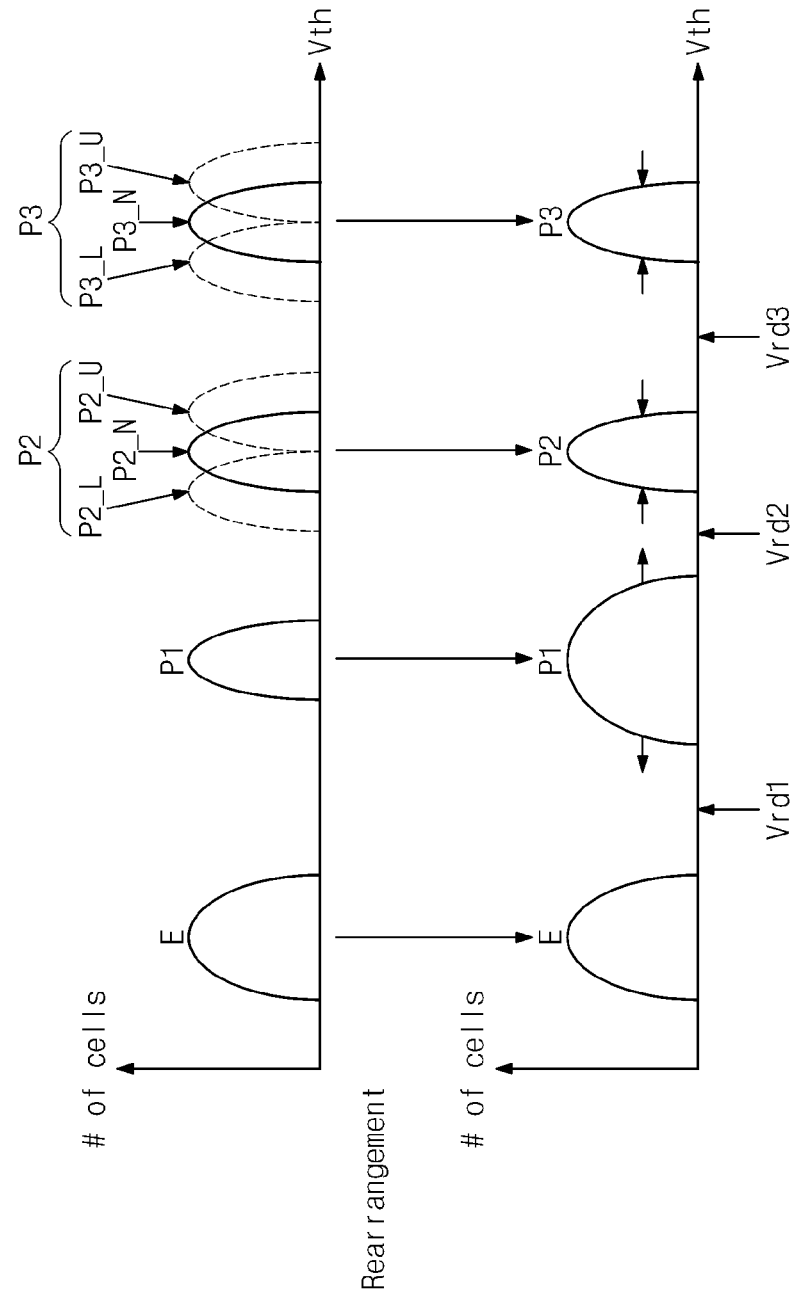
FIG. 15 is a diagram illustrating a threshold voltage variation due to charge rearrangement that is generated at memory cells programmed according to a method described in FIG. 14.

FIG. 15 is a diagram illustrating a threshold voltage variation due to charge rearrangement which is generated at memory cells programmed according to a method described in FIG. 14. Referring to FIGS. 1, 9, and 15, charge rearrangement may be generated at memory cells programmed to first to third program states P1 to P3.

Upper tail memory cells LP_U whose threshold voltages become higher by the charge rearrangement may be programmed to a second or third lower program state P2_L or P3_L. Upper tail memory cells LP_U had been previously determined to have a charge rearrangement characteristics resulting in a higher threshold voltage (Vth) of the memory cell after charge rearrangement (e.g., as determined by state read operations described herein, such as those described with respect to FIGS. 9-12). By programming upper tail memory cells LP_U to a lower range of the second or program state P2 or P3 (i.e., P2_L or P3_L), during future charge rearrangement with respect to these memory cells, threshold voltages of memory cells with the second or third lower program state P2_L or P3_L may be increased, so that a threshold voltage distribution is varied towards a second or third normal program state P2_N or P3_N.

Lower tail memory cells LP_L whose threshold voltages are lowered by the charge rearrangement may be programmed to a second or third upper program state P2_U or P3_U. Lower tail memory cells LP_L had been previously determined to have a charge rearrangement characteristics resulting in a lower threshold voltage (Vth) of the memory cell after charge rearrangement (e.g., as determined by state read operations described herein, such as those described with respect to FIGS. 9-12). By programming lower tail memory cells LP_L to a higher range of the second or program state P2 or P3 (i.e., P2_H or P3_H), during future the charge rearrangement with respect to these memory cells, threshold voltages of memory cells with the second or third upper program state P2_U or P3_U may be decreased, so that a threshold voltage distribution is varied towards the second or third normal program state P2_N or P3_N.

In this example, memory cells whose threshold voltages are increased due to the charge rearrangement may be programmed using a verification voltage lower than a normal verification voltage. Memory cells whose threshold voltages are decreased due to the charge rearrangement may be programmed using a verification voltage higher than the normal verification voltage. If programming is made using verification voltages determined in consideration of charge rearrangement, a threshold voltage distribution of memory cells may become narrower due to charge rearrangement which may improve data reliability, allow for smaller margins between program states and/or increase a number of program states (or bits/cell) of the memory cells.

When memory cell are programmed with multi-bit data, reading may be performed to determine the data previously stored in the memory cells. FIGS. 14 and 15 show read voltages of Vrd1, Vrd2, Vrd3 that may be applied to a selected word line in a read operation to determine the program state (E, P1, P2 or P3) of memory cells connected to the selected word line and thus read the data of the memory cells. Depending on the data to be read (e.g., LSB or MSB) one or more reads with one or more of the read voltages Vrd1, Vrd2, Vrd3 may be necessary. In addition to the reading to determine the stored data, state read operations for determining charge rearrangement, Vth shifting, and/or upper and lower tail memory cells of each program state may be performed.

There is described the case that a state read operation of each program state is performed using two state read voltages. However, the inventive concept is not limited thereto. For example, further granularity may be desired in determining the tendency of a Vth of a memory cell to shift. In such a case, four state read voltages may be used to determine large upper tail memory cells, small upper tail memory cells, normal memory cells, small lower tail memory cells and large lower tail memory cells (respectively representing memory cells with a tendency to have a large Vth increase, a relatively smaller Vth increase, little or no Vth shift, a small Vth decrease and a relatively larger Vth decrease). In this example, five verification voltages may be used during programming corresponding to this memory cell classification. Other modifications are also contemplated. For example, if it is determined that Vth shifts in one direction (higher or lower) may tend to be larger than in another direction, more state read voltages may be used in that direction to classify the memory cells than the other direction. Alternatively, state read voltages may only be used to determine upper tail memory cells and no distinction may be made between lower tail memory cells and normal memory cells. Alternatively, state read voltages may only be used to determine upper tail memory cells and no distinction may be made between lower tail memory cells and normal memory cells.

Figure 16:
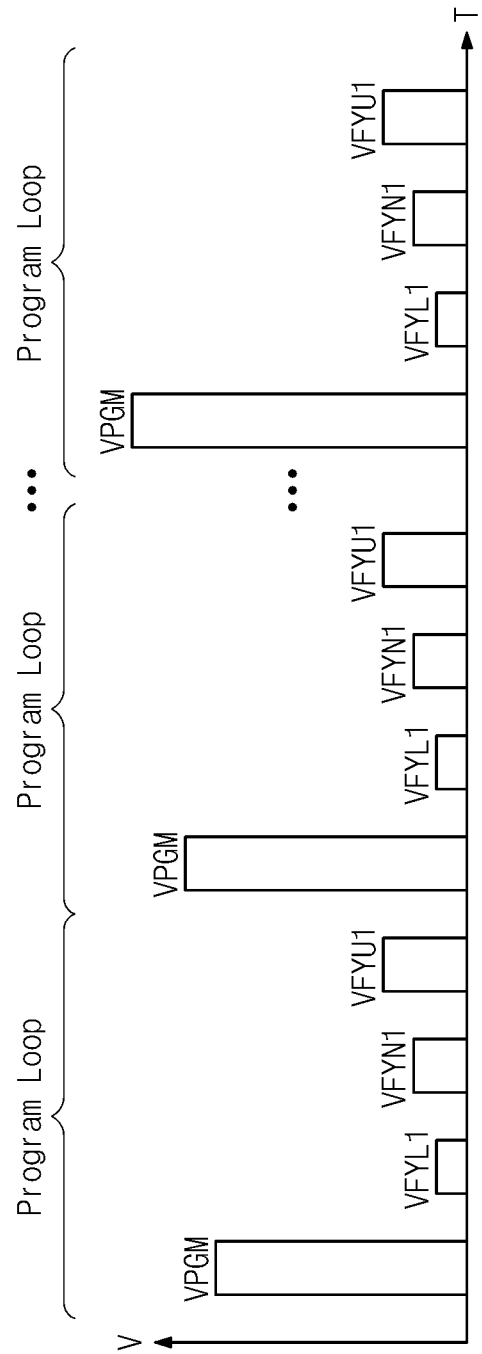
FIG. 16 is a timing diagram illustrating voltages applied to a selected word line according to a program method described in FIG. 14.

FIG. 16 is a timing diagram illustrating voltages applied to a selected word line according to a program method described in FIG. 14. In an embodiment, voltages used to program memory cells to a second program state P2 are illustrated in FIG. 16. Referring to FIGS. 13, 14, and 16, a program voltage VPGM may be applied to a selected word line. Afterwards, a lower verification voltage VFYL1, a normal verification voltage VFYN1, and an upper verification voltage VFYU1 may be sequentially applied to the selected word line. Applying of the program voltage VPGM and the verification voltages VFYL1, VFYN1, and VFYU1 may form one program loop.

After a program loop is executed, a control unit 160 of a nonvolatile memory device 100 (refer to FIG. 1) may judge program pass or program fail. Programming may be ended at program pass. In case of determining a program fail, a next program loop may be performed.

At the next program loop, a program voltage VPGM with an increased level may be applied. Afterwards, the verification voltages VFYL1, VFYN1, and VFYU1 may be sequentially applied. The program voltage VPGM may be incremented for each iteration of the program loops. Alternatively or in addition, length of application of the program voltage VPGM may be increased for each iteration of the program loops Page buffers PB may select a valid verification voltage of the verification voltages VFYL1, VFYN1, and VFYU1 according to data stored in rearrangement latches RL (refer to FIG. 1). For example, when data stored in a rearrangement latch RL indicates an upper tail memory cell, the page buffer PB may select the lower verification voltage VFYL1 as a valid verification voltage, and may ignore other verification voltages VFYN1 and VFYU1. For example, for upper tail memory cells, when the verification voltages VFYN1 and VFYU1 are applied, the page buffer PB may bias a bit line such that a value of a data latch is not changed.

Likewise, when data stored in a rearrangement latch RL indicates a normal memory cell, the page buffer PB may select the normal verification voltage VFYN1 as a valid verification voltage, read operations using other verification voltages VFYL1 and VFYU1 may be ignored (or not performed). When data stored in a rearrangement latch RL indicates an upper tail memory cell, the page buffer PB may select the lower verification voltage VFYL1 as a valid verification voltage, and may ignore (or not perform) read operations using other verification voltages VFYN1 and VFYU1.

Figure 17:
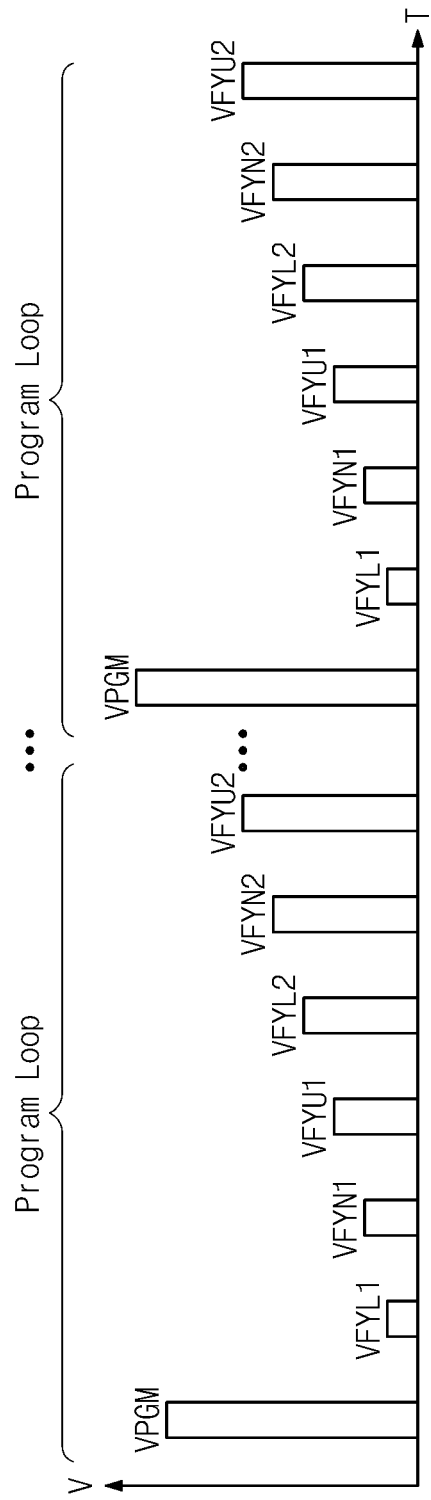
FIG. 17 is a timing diagram illustrating voltages applied to a selected word line according to a program method described in FIGS. 13 and 14.

FIG. 17 is a timing diagram illustrating voltages applied to a selected word line according to a program method which may include the details described in FIGS. 13 and 14. In an embodiment, there are illustrated voltages used to program memory cells to second and third program states P2 and P3. Referring to FIGS. 13, 14, and 17, a program voltage VPGM may be applied to a selected word line. Afterwards, a lower verification voltage VFYL1, a normal verification voltage VFYN1, an upper verification voltage VFYU1, a lower verification voltage VFYL2, a normal verification voltage VFYN2, an upper verification voltage VFYU2 may be sequentially applied to the selected word line. Applying of the program voltage VPGM and the verification voltages VFYL1, VFYN1, VFYU1, VFYL2, VFYN2, and VFYU2 may form a program loop.

After the program loop is executed, a control unit 160 of a nonvolatile memory device 100 (refer to FIG. 1) may determine program pass or program fail. Programming may be terminated in case of program pass. An additional program loop may be executed in case of program fail. At a next program loop, the program voltage VPGM having an increased level may be applied to the selected word line. Afterwards, the verification voltages VFYL1, VFYN1, VFYU1, VFYL2, VFYN2, and VFYU2 may be sequentially applied to the selected word line to verify programming of corresponding memory cells of the word line. A level of the program voltage VPGM may be increased for each subsequent iteration of the program loops.

Page buffers PB may select a valid verification voltage according to data stored in data latches DL (refer to FIG. 1) and rearrangement latches RL. For example, when data stored in a data latch DL indicates a second program state P2, the page buffer PB may ignore verify read operations using the verification voltages VFYL2, VFYN2, and VFYU2. In the event that data stored in a rearrangement latch RL points at a lower tail memory cell, the page buffer PB may select the upper verification voltage VFYU1 as a valid verification voltage and may ignore verify read operations using the verification voltages VFYN1 and VFYU1. When a non-selection verification voltage is applied, the page buffer PB may bias a bit line BL such that data of the data latch DL is not varied.

If data stored in the data latch DL indicates the second program state P2 and data stored in the rearrangement latch RL points at a normal memory cell, the page buffer PB may select the normal verification voltage VFYN1 as a valid voltage and may ignore verify read operations using the verification voltages VFYL1, VFYU1, VFYL2, VFYN2, and VFYU2.

In the event that data stored in the data latch DL indicates the second program state P2 and data stored in the rearrangement latch RL points at an upper tail memory cell, the page buffer PB may select the lower verification voltage VFYL1 as a valid voltage and may ignore verify read operations using the verification voltages VFYN1, VFYU1, VFYL2, VFYN2, and VFYU2.

When data stored in the data latch DL indicates a third program state P3 and data stored in the rearrangement latch RL points at a lower tail memory cell, the page buffer PB may select the upper verification voltage VFYU2 as a valid voltage and may ignore verify read operations using the verification voltages VFYL1, VFYN1, VFYU1, VFYL2, and VFYN.

If data stored in the data latch DL indicates the third program state P3 and data stored in the rearrangement latch RL points at a normal memory cell, the page buffer PB may select the normal verification voltage VFYN2 as a valid voltage and may ignore verify read operations using the verification voltages VFYL1, VFYN1, VFYU1, VFYL2, and VFYU2.

In case that data stored in the data latch DL indicates the third program state P3 and data stored in the rearrangement latch RL points at an upper tail memory cell, the page buffer PB may select the lower verification voltage VFYL2 as a valid voltage and may ignore verify read operations using the verification voltages VFYL1, VFYN1, VFYU1, VFYN2, and VFYU2.

Figure 18:
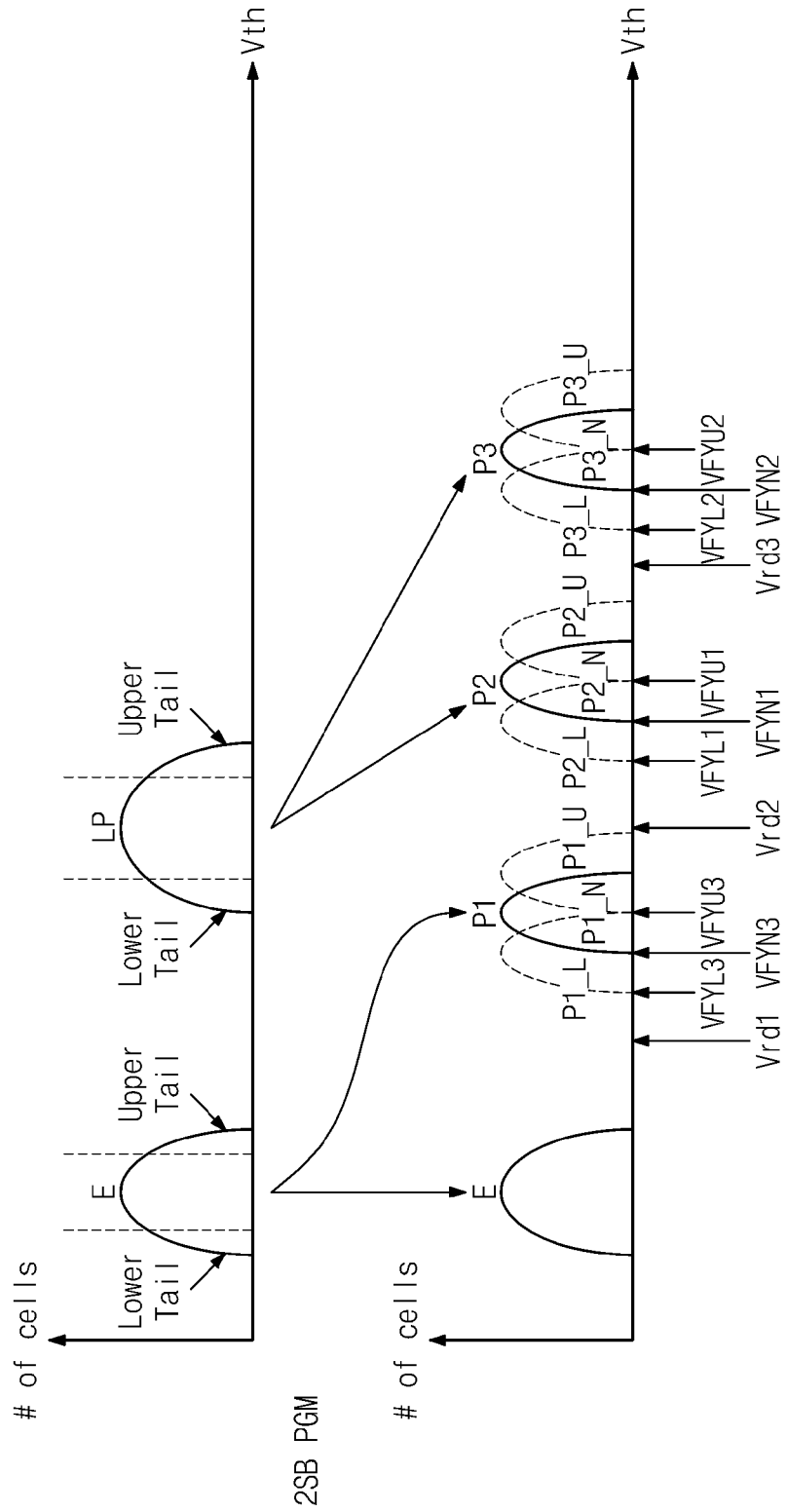
FIG. 18 is a diagram illustrating an application of threshold voltage distributions of memory cells programmed according to a program method in FIG. 13.

FIG. 18 is a diagram illustrating an application of threshold voltage distributions of memory cells programmed according to a program method in FIG. 13. As compared with threshold voltage distributions in FIG. 14, a state read operation may be performed with respect to memory cells having an erase state E, and lower tail memory cells, normal memory cells, and upper tail memory cells in the erase state E may be determined.

Lower tail memory cells having an erase state E may be programmed to a first upper program state P1_U during programming of a second bit 2SB. Normal memory cells having the erase state E may be programmed to a first normal program state P1_N, and upper tail memory cells having the erase state E may be programmed to a first lower program state P1_L. The first lower program state P1_L, the first normal program state P1_N, and the first upper program state P1_U may form a first program state P1.

A state read operation may be additionally performed with respect to an erase state E, and a program operation may be carried out considering charge rearrangement determined from the state read operation. Upon future charge rearrangement, threshold voltage distributions of the first to third program states P1 to P3 may be narrowed.

Figure 19:
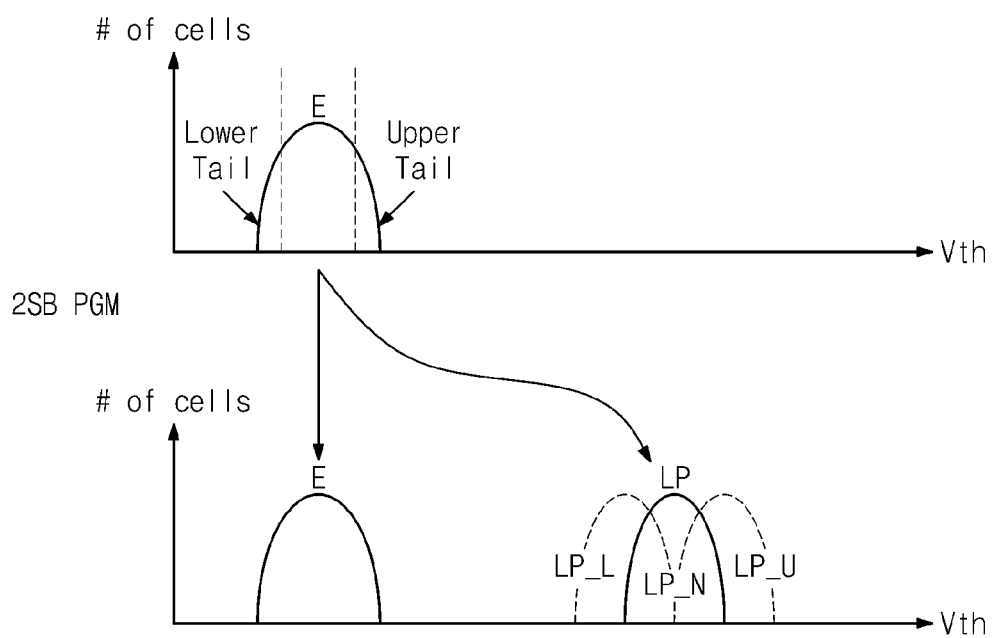
FIG. 19 is a diagram illustrating another application of threshold voltage distributions of memory cells programmed according to a program method in FIG. 13.

FIG. 19 is a diagram illustrating another application of threshold voltage distributions of memory cells programmed according to a program method in FIGS. 10 and 13. A state read operation may be performed with respect to memory cells having an erase state E prior to performing LSB programming, and lower tail memory cells, normal memory cells, and upper tail memory cells may be determined.

Memory cells having an erase state E may maintain the erase state or be programmed to an LSB program state LP by programming a least significant bit. For those memory cells to be programmed to the LSB program state LP, lower tail memory cells having the erase state E may be programmed to a first upper program state LP1_U; normal memory cells having the erase state E may be programmed to a first normal program state LP1_N; and tail memory cells having the erase state E may be programmed to a first lower program state LP1_L. The first lower program state LP1_L, the first normal program state LP1_N, and the first upper program state LP1_U may form an LSB program state LP. Different verification voltages may be used to confirm programming to the different LSB program sub-states (the first lower program state LP1_L, the first normal program state LP1_N, and the first upper program state LP1_U).

A state read operation may be additionally performed with respect to an erase state E prior to LSB programming is performed, and a program operation may be carried out considering rearrangement.

A state read operation and a program operation taking charge rearrangement into consideration for programming a second bit 2SB in memory cells has been described with reference to FIGS. 14 to 19. However, the inventive concept is not limited thereto. For example, a state read operation and a program operation considering rearrangement can be performed again for programming a third bit, a fourth bit, etc. (which may be a most significant bit). This may be in addition to taking into consideration charge rearrangement when programming the second bit 2SB or the second bit 2SB (or other bits) may be programmed without taking into consideration charge rearrangement.

Figure 20:
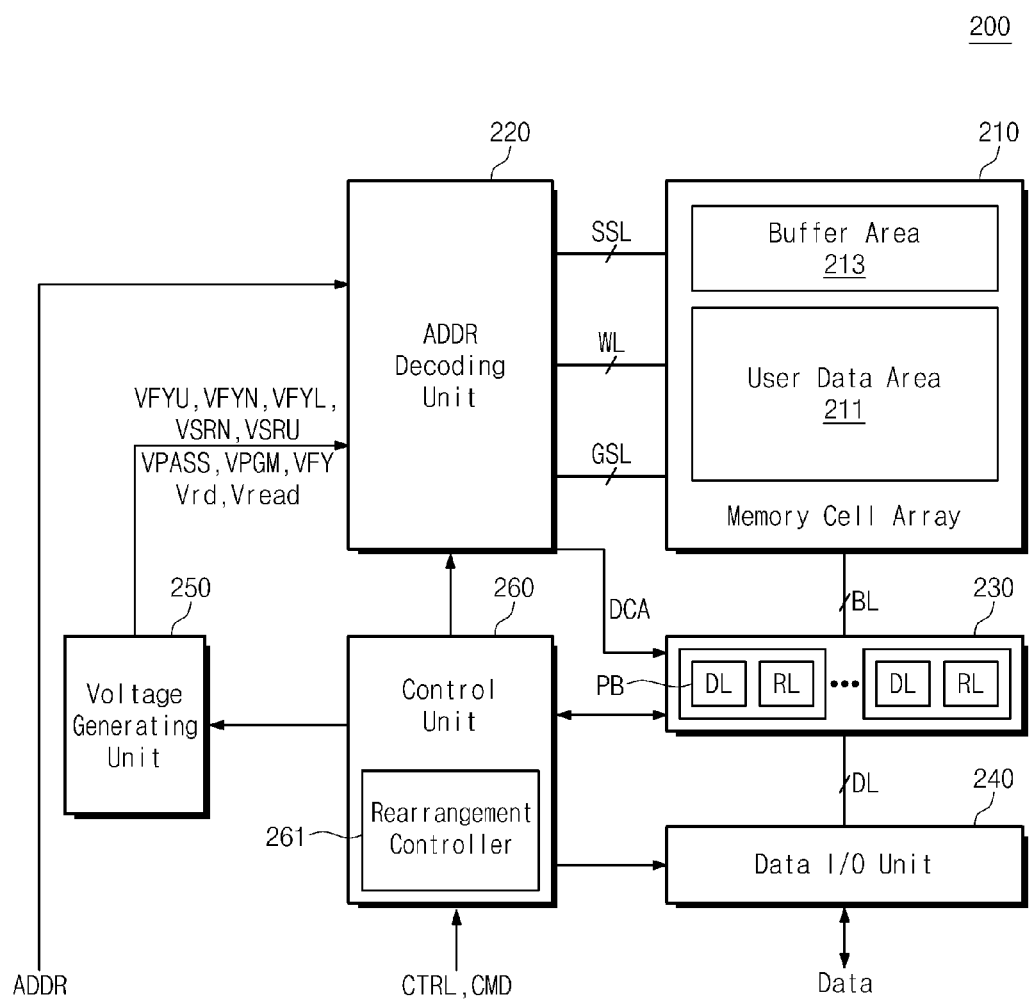
FIG. 20 is a block diagram schematically illustrating a nonvolatile memory device according to still another embodiment.

FIG. 20 is a block diagram schematically illustrating a nonvolatile memory device according to still another embodiment. Referring to FIG. 20, a nonvolatile memory device 200 may include a memory cell array 210, an address decoding unit 220, a page buffer unit 230, a data input/output unit 240, a voltage generating unit 250, and a control unit 260. As with all embodiments, the memory device 200 may be a semiconductor chip, or a group of chips (such as a stack of chips) within a semiconductor chip.

The memory cell array 210 may include a user data area 211 and a buffer area 213. The nonvolatile memory device 200 may be substantially identical to that in FIG. 1 except that 3-step programming is performed using the buffer area 213. Buffer area 213 may be integrally formed with the memory cell array. For example, if the memory device 200 is a semiconductor memory chip, buffer area 213 may be formed as part of the semiconductor chip and may be formed from the same memory cell types as the memory cells of the user data area 211. Buffer area 213 may be formed from a predetermined physical location of the memory cell array 210 or may be determined by a block management system (which may allow modification of the blocks of memory that constitute the buffer area 213 and the user data area 211).

Figure 21:
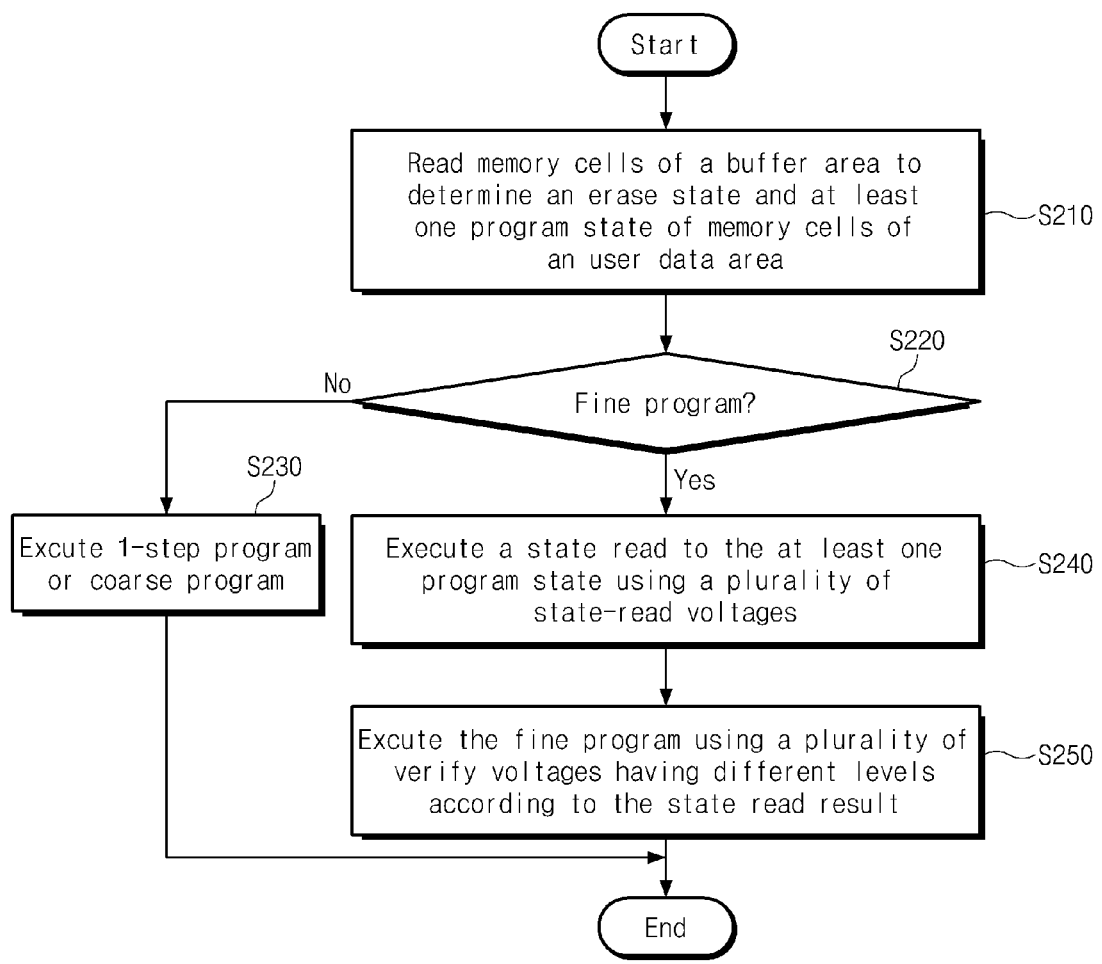
FIG. 21 is a flowchart illustrating a program method according to another embodiment.

FIG. 21 is a flowchart illustrating a program method according to another embodiment. Referring to FIGS. 20 and 21, in operation S210, an erase state and at least one program state of memory cells of a user data area 311 may be determined by reading memory cells of a buffer area 213. The buffer area 213 may store the currently stored data (e.g., LSB and 2SB data) of the memory cells (e.g., word line) that are to be programmed with an additional bit of data (e.g., MSB data). Data (e.g., LSB and 2SB data) may be previously stored in the buffer area 213 by either reading the memory cells (e.g., word line) prior to being programmed with a subsequent bit (e.g., prior to coarse programming adding an MSB data bit). Alternatively, data (e.g., LSB and 2SB data) may be previously stored in the buffer area 213 during the programming of the word line with that data (e.g., the LSB and 2SB data) prior to programming the subsequent bit (e.g., MSB data). Alternatively, the buffer area 213 may store all data to be programmed to the memory cells (e.g., LSB, 2SB and MSB data).

In operation S220, whether a fine program operation is to be performed may be judged. If not, the method proceeds to operation S230, in which 1-step programming or coarse programming is made. 1-step and coarse programming may include programming at higher program voltage VPGM or for longer pulse durations of the program voltage VPGM as compared to fine programming. The course program states (e.g., CP1 to CP7 of FIG. 22A) may have a Vth distribution range larger than the program states resulting from fine programming. The 1-step programming may include only a single programming cycle or include multiple programming cycles.

Figure 22A:
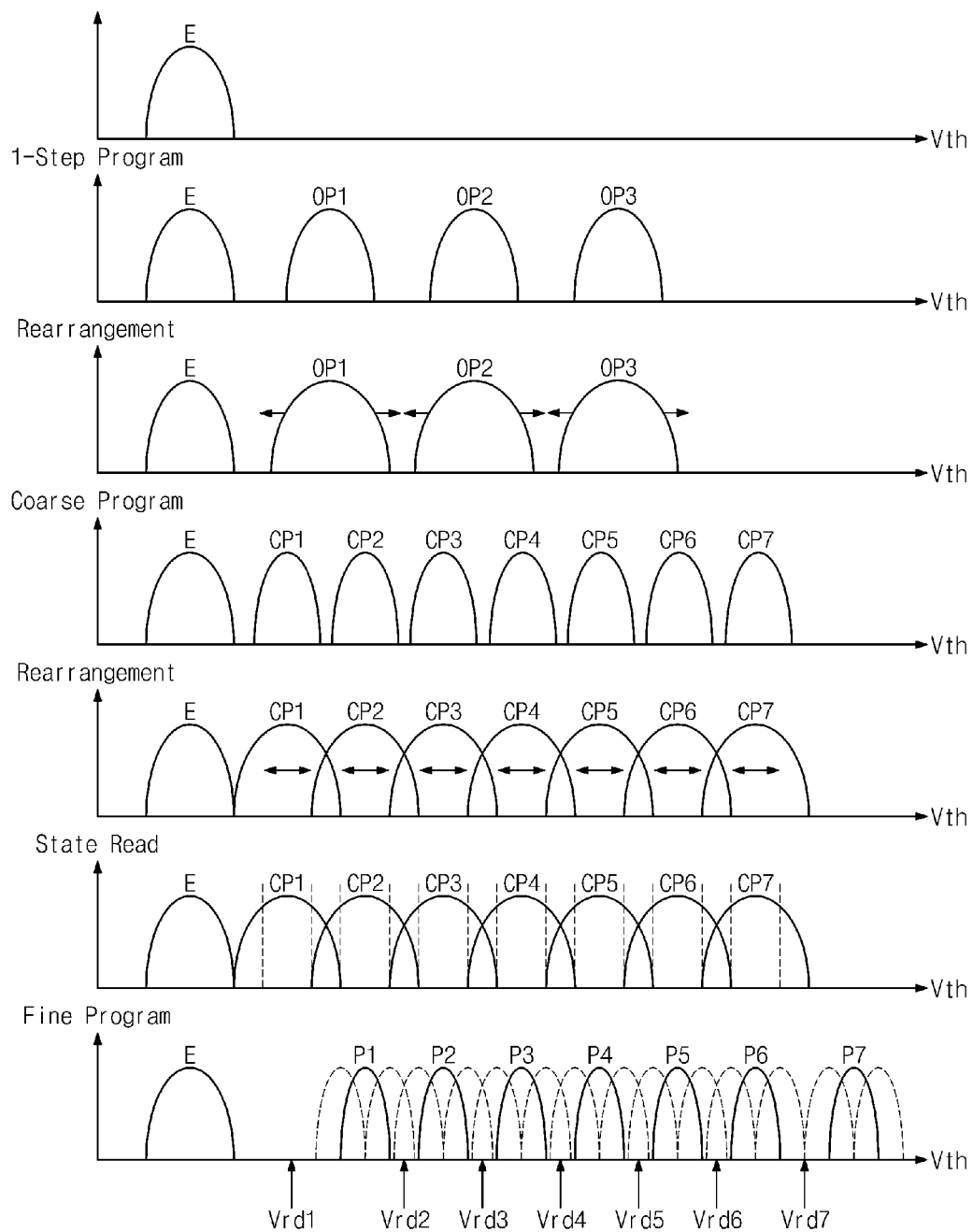
FIG. 22A is a diagram illustrating threshold voltage distributions of memory cells according to a program method in FIG. 21.

In case that the fine program operation is to be performed, the method proceeds to operation S240, in which a state read operation on at least one program state is performed (e.g., one or more of the course program states CP1 to CP7 of FIG. 22A) using a plurality of state read voltages which may be in a manner as described elsewhere in this disclosure. Afterwards, in operation S240, a fine program operation may be executed using a plurality of verification voltages having different levels, according to the state read result. U.S. Patent Publication No. 2011/0222342 is incorporated by reference for its teachings of 1 step programming, coarse programming and fine programming, as well as the use of a buffer area in connection with memory cell programming.

FIG. 22A is a diagram illustrating threshold voltage distributions of memory cells according to a program method in FIG. 21. Referring to FIGS. 20 to 22A, 1-step programming may be made with respect to memory cells. The 1-step programming may be executed without a state read operation and a program operation using a state read result. 1-bit or 2-bit data may be programmed in a memory cell of a user data area 211 by the 1-step programming. Upon execution of the 1-step programming, program data may be further programmed in a buffer area 213. For example, the program data may be programmed in Single Level Cells (SLC) of the buffer area 213.

If the 1-step programming is performed, memory cells having an erase state E of the user data area 211 may maintain an erase state E or may be programmed to one of first to third program states OP1 to OP3. When the 1-step programming results in four states (e.g., the erase state E and first to third program states OP1 to OP3), the 1-step programming may program the memory cells (and thus select each memory cell for one of these four states) based on 2-bit data (or two data pages for a physical page of the memory) such as an LSB and a 2SB bit.

Charge rearrangement may occur after the 1-step programming is executed. If charge rearrangement occurs, threshold voltage distributions of the first to third program states OP1 to OP3 may widen.

Coarse programming may be performed after the 1-step programming on 1-step programmed memory cells. Coarse programming may add an additional bit of information (e.g., an MSB bit) to each memory cell. Coarse programming may include reading the state of the memory cells in the user data area 211 to determined the existing data (e.g., two-bit data) to which the additional bit of information is to be added or the two-bit data may be determined by reading memory cells of the buffer area 213 (which may continue to store the two-bit data until programming is complete). Alternatively, the previously stored data (e.g., two-bit data) may be obtained from a different source than the buffer area 213, such as a buffer memory in a memory controller controlling operations of the memory device 300. The coarse programming may be performed according to the determination of the two-bit data previously stored and program data (e.g., the additional bit of data for each cell) to be programmed. If the coarse programming is performed, memory cells may maintain an erase state E or may be programmed to first to seventh coarse program states CP1 to CP7. When the coarse programming is performed, the program data may be further programmed in memory cells of the buffer area 213. For example, the program data may be programmed in Single Level Cells (SLC) of the buffer area 213.

After the coarse programming is performed, charge rearrangement may occur. This may make threshold voltage distributions of the first to seventh coarse program states CP1 to CP7 widen. In some examples, threshold voltage distributions of the first to seventh coarse program states CP1 to CP7 may partially overlap with each other.

Fine programming may be executed with respect to coarse programmed memory cells. As illustrated in FIG. 21, the fine programming may accompany a state read operation and a program operation using a state read result.

An erase state and at least one program state of memory cells of the user data area 211 may be determined by reading memory cells of the buffer area 213. The buffer area 213 may store all data (e.g., three data pages) of the memory cells being programmed, and this data can be used to determine the erase or program state of each of the memory cells being programmed. A state read operation may be performed with respect to the at least one program state (or, an erase state). If the state read operation is performed, lower tail memory cells, normal memory cells, and upper tail memory cells of each program state (or, an erase state) may be determined. For example, memory cells may be determined to have been programmed to coarse programming state CP1 by referencing information in the buffer are 213. When one or more neighboring coarse program states CP1 to CP7 overlap, it may be impracticable to determine the coarse programming state to which a memory cell has been previously programmed by reading the memory cell. For example, when a memory cell has a Vth value in a Vth distribution region shared by coarse program states CP1 and CP2 (after charge rearrangement), it may be impracticable to determine whether this memory cell has been previously programmed to the coarse program state CP1 or coarse program state CP2. Reference to information (e.g., the original three bit data of the memory cell) may be referenced to determine the coarse program state to which the memory cell was previously programmed.

Figure 22B:
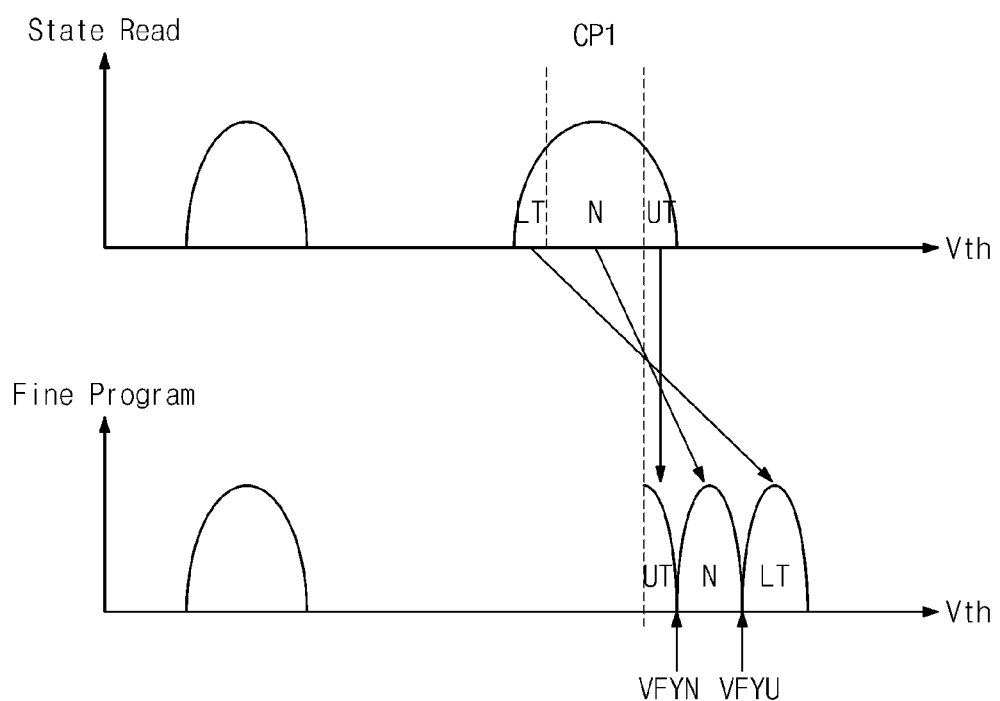
FIG. 22B illustrates an alternative, which may be applied to the embodiment of FIG. 22A.

Memory cells may be programmed using a plurality of verification voltages according to a state read result. The lower tail memory cells may be programmed using an upper verification voltage, the normal memory cells may be programmed using a normal verification voltage, and the upper tail memory cells may be programmed using a lower verification voltage. Memory cells may be programmed to first to seventh program states P1 to P7. In an alternative embodiment, upper tail memory cells may not be programmed in the fine program operation. The fine program operation may be performed on lower tail memory cells and normal memory cells and the Vth levels of the upper tail memory cells may remain at the levels resulting from the coarse programming operation (although additional charge rearrangement, coupling with other memory cells, etc. may alter their Vth levels). FIG. 22B illustrates an example of this alternative with respect to the fine programming of coarse programming state CP1, illustrating upper tail memory cells UT of coarse program state CP1 remaining at their coarse program state, and normal memory cells N being verified in the fine program operation with a lower verification voltage of VFYN and lower tail memory cells LT being verified in the fine program operation with an upper verification voltage of VFYU. In this example, the threshold distribution ranges after fine programming the lower tail, normal and upper tail memory cells from coarse program state are shown to be separate, but they may overlap as shown in FIG. 22A. In addition, while the alternative of FIG. 22B eliminates the use of a verify voltage for upper tail memory cells in connection with a modification of the embodiment of FIG. 22A, it is contemplated this alternative is equally applicable to other embodiments described herein.

After the fine programming is performed, charge rearrangement may be generated. In this case, threshold voltage distributions of the first to seventh program states P1 to P7 may become narrower. That is, the data reliability of the nonvolatile memory device 200 may be improved. Read voltages of Vrd1, Vrd2, . . . Vrd7 may be applied to a selected word line in a read operation to determine the program state (E, P1, P2 . . . P7) of memory cells connected to the selected word line and thus read the data of the memory cells. Depending on the data to be read (e.g., LSB or MSB) one or more reads with one or more of the read voltages Vrd1, Vrd2, . . . Vrd7 may be necessary. Read voltages Vrd1, Vrd2, . . . Vrd7 may be designed to be centered between neighboring threshold ranges representing the program states (E, P1, P2 . . . P7). The read voltages of this and other embodiments are shown to be outside the range of the plural verify voltages associated with a single program state (e.g., not interposed within the verify voltages associated with a single program state, such as one of E, P1, P2 . . . P7). However, it may be appropriate to allow the read voltages to have values within the range of verify voltages associated with a single program state.

Figure 23:
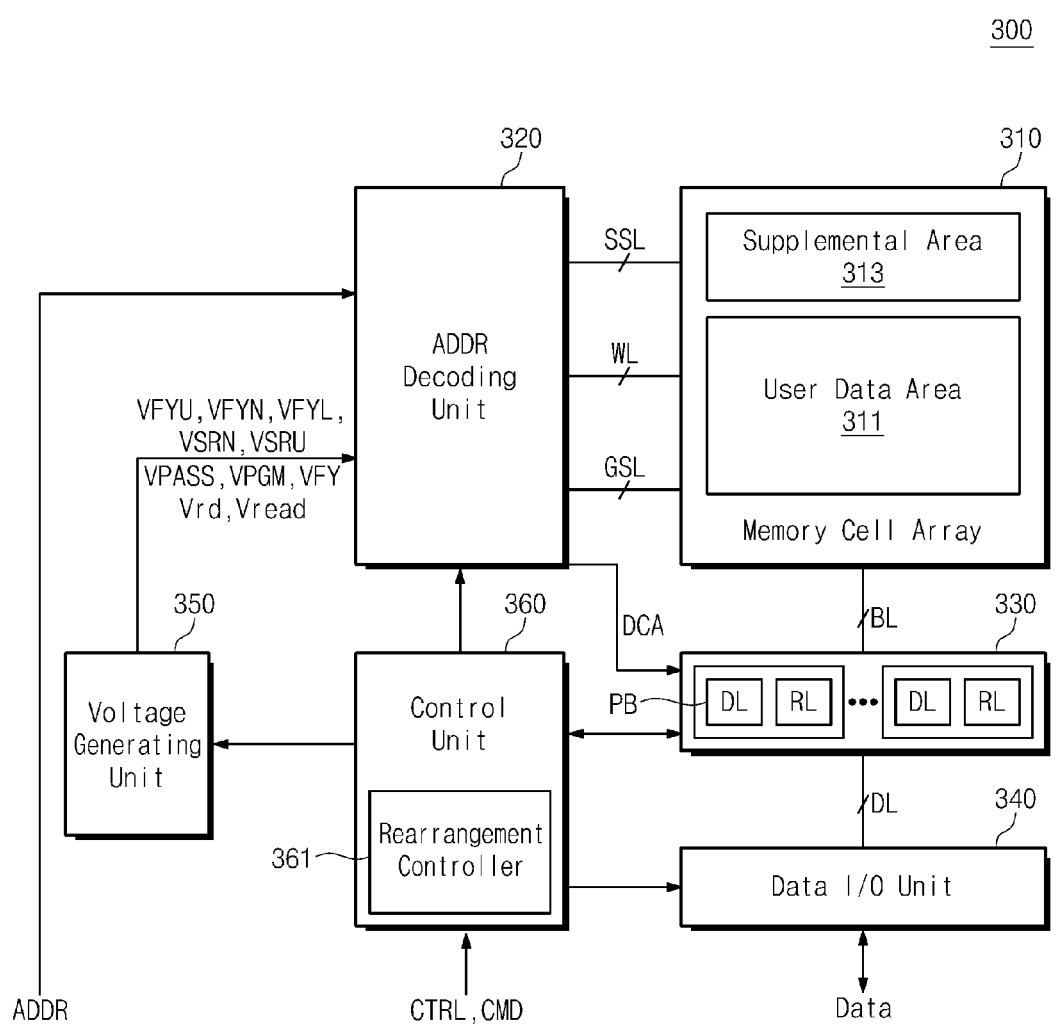
FIG. 23 is a block diagram schematically illustrating a nonvolatile memory device according to still another embodiment.

FIG. 23 is a block diagram schematically illustrating a nonvolatile memory device according to still another embodiment. Referring to FIG. 23, a nonvolatile memory device 300 may include a memory cell array 310, an address decoding unit 320, a page buffer unit 330, a data input/output unit 340, a voltage generating unit 350, and a control unit 360.

The memory cell array 310 may include a user data area 311 and a supplemental area 313. The nonvolatile memory device 300 may be substantially identical to that in FIG. 1 except that a state read result is programmed in the supplemental area 313. Supplemental area 313 may be integrally formed with the memory cell array. For example, if the memory device 300 is a semiconductor memory chip, supplemental area 313 may be formed as part of the semiconductor chip and may be formed from the same memory cell types as the memory cells of the user data area 311. Supplemental area 313 may be formed from a predetermined physical location of the memory cell array 310 or may be determined by a block management system.

Figure 24:
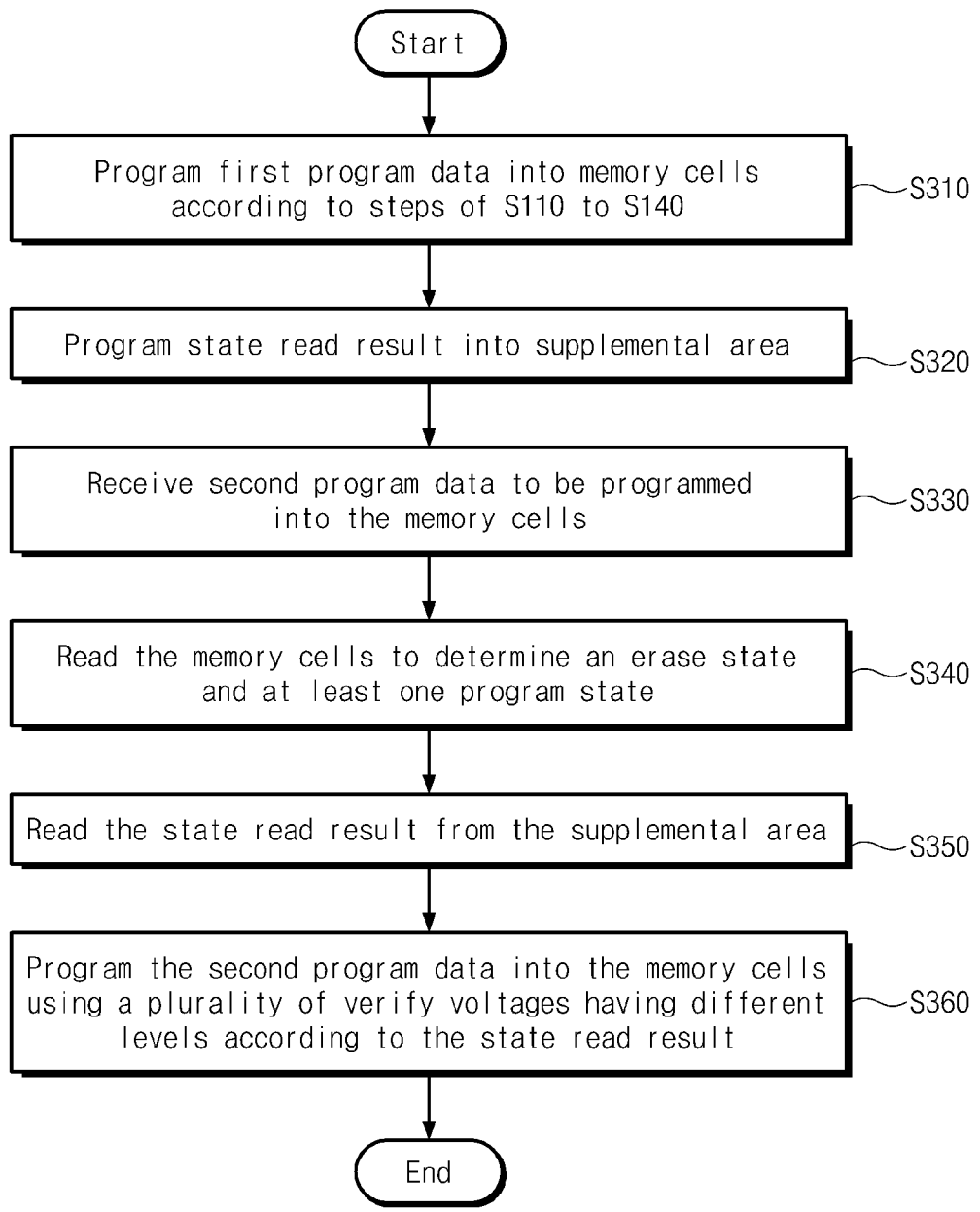
FIG. 24 is a flowchart illustrating a program method according to still another embodiment.

FIG. 24 is a flowchart illustrating a program method according to still another embodiment. Referring to FIG. 24, in operation S310, first program data may be programmed in memory cells. For example, the first program data may be received, data previously programmed in memory cells may be read, a state read operation may be performed, and the first program data may be programmed according to the first program data, the read result, and the state read result.

In operation S320, the state read result may be programmed in a supplemental area 313.

In operation S330, second program data to be programmed in memory cells may be received. For example, the second program data may be upper bit data to be programmed following the first program data. Alternatively, second program data may be lower bit data to be programmed after memory cells are erased.

In operation S340, an erase state and at least one program state may be judged by reading memory cells. The operation S340 may correspond to operation S120 in FIG. 9.

In operation S350, a state read result may be read out from the supplemental area 313. A state read result programmed in the supplemental area 313 in operation S320 may be read out in operation S350. The state read result thus read may be stored in rearrangement latches RL.

In operation S360, the second program data may be programmed in memory cells using a plurality of verification voltages having different levels, according to the state read result. The operation S360 may correspond to operation S150 in FIG. 9.

Figure 25:
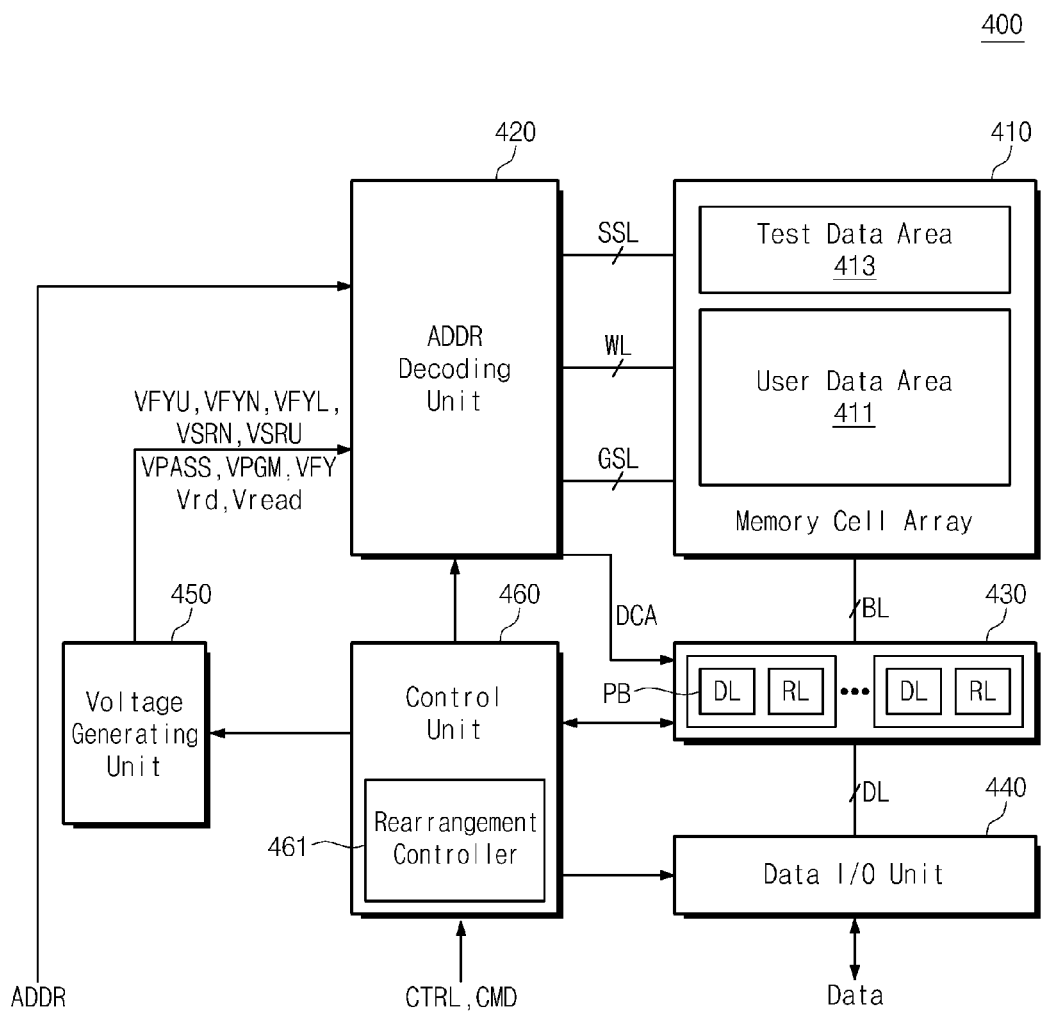
FIG. 25 is a block diagram schematically illustrating a nonvolatile memory device according to still another embodiment.

As described above, a rearrangement characteristic of memory cells may be judged via a state read operation, and a state read result may be programmed in the supplemental area 313 of a memory cell array 310. Afterwards, when data is programmed in corresponding memory cells, a rearrangement characteristic may be determined according to a state read result programmed in the supplemental area 313, and a program operation may be performed. Use of state read results stored in supplemental area 313 may allow use of state read results in plural programming operations without the need to perform plural state read operations (e.g., for each memory cells of a physical page of memory cells, plural programming operations to the memory cell may use a state read results stored in the supplemental area 313 obtained from a single state read operation of that memory cell). It may also be possible to modify the state read results programmed in the supplemental area with future state read results. Thus, it is possible to provide a nonvolatile memory device 300 with the improved data reliability and a program method thereof FIG. 25 is a block diagram schematically illustrating a nonvolatile memory device according to still another embodiment. Referring to FIG. 25, a nonvolatile memory device 400 may include a memory cell array 410, an address decoding unit 420, a page buffer unit 430, a data input/output unit 440, a voltage generating unit 450, and a control unit 460.

The memory cell array 410 may include a user data area 411 and a test data area 413. The nonvolatile memory device 400 may be substantially identical to that in FIG. 1 except that reading is made with respect to the test data area 413 without execution of a state read operation.

The test data area 413 may store information associated with a rearrangement characteristic of memory cells in the user data area 411. In an embodiment, memory cells of the user data area 411 in the nonvolatile memory device 400 may be tested, and a test result may be programmed in the test data area 413.

Figure 26:
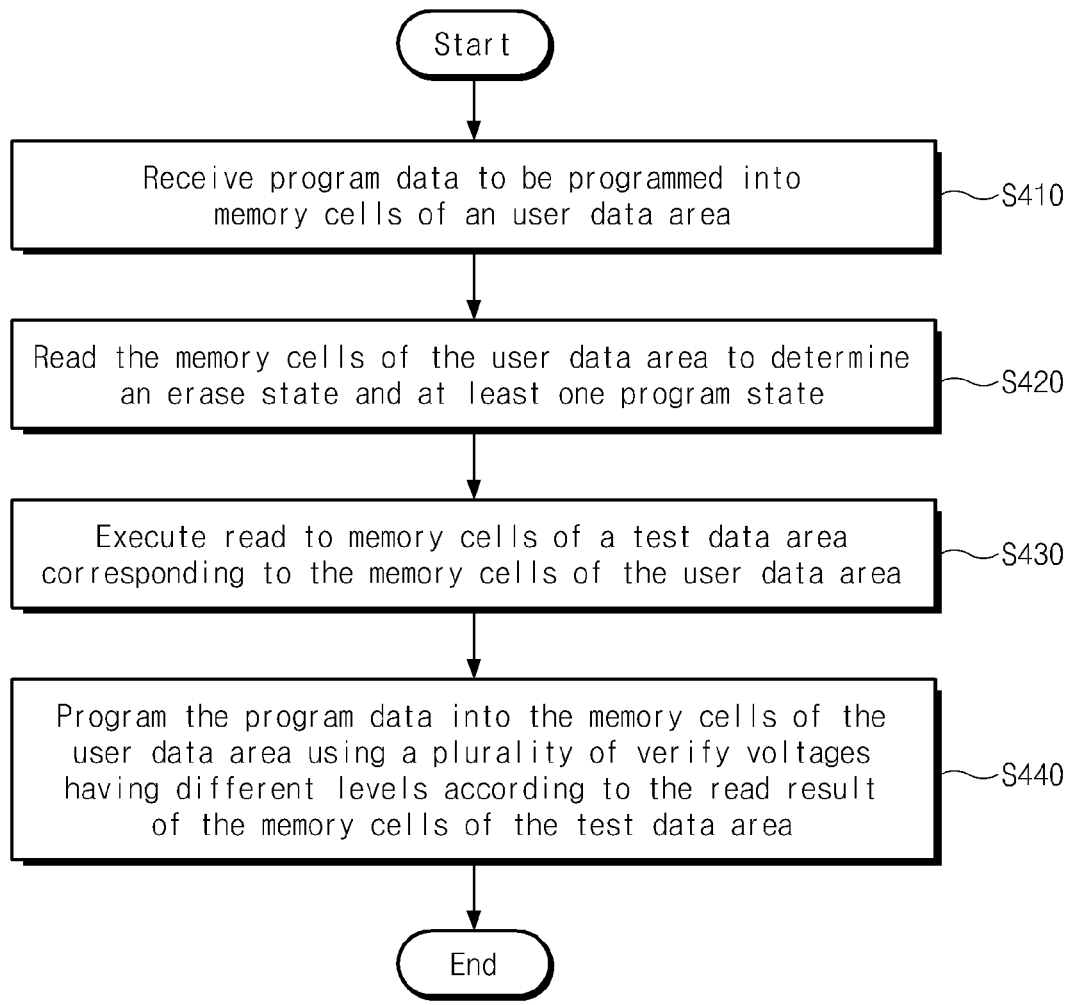
FIG. 26 is a flowchart illustrating a program method according to still another embodiment.

FIG. 26 is a flowchart illustrating a program method according to still another embodiment. Referring to FIGS. 25 and 26, in operation S410, data to be programmed in memory cells of a user data area 411 may be received. The operation S410 may correspond to operation S110 in FIG. 9.

In operation S420, memory cells in the user data area may be read such that an erase state and at least one program state are judged. The operation S420 may correspond to operation S120 in FIG. 9.

In operation S430, a read operation may be carried out with respect to memory cells of a test data area 413 corresponding to memory cells of the user data area 411. For example, a read operation may be performed with respect to memory cells that store information associated with a rearrangement characteristic of memory cells of the user data area 411.

In operation S440, program data may be stored in memory cells of the user data area 411 using a plurality of verification voltages having different levels, based on a read result on memory cells of the test data area 413.

As described in relation to FIGS. 25 and 26, a rearrangement characteristic of memory cells may be detected via testing, and information indicating the rearrangement characteristic may be programmed in the test data area 413. Testing may occur as part of a manufacturing process (e.g., prior to packaging the memory device or after packaging memory device, but prior to determining a packaging defect, or prior to shipping to a third party after packaging). Alternatively or in addition, testing may be performed as a background operation, such as when the memory device is not being accessed. For example, blocks in a NAND flash memory device (such as free blocks) may have test data written to physical pages of the blocks, which are then subsequently read with state read operations to determine rearrangement characteristics of the memory cells of the physical pages. Test data may be stored for each memory cell or may be stored for a group of memory cells (e.g., such as for all memory cells within a certain physical area). A program operation on the user data area 411 may be performed in view of rearrangement, based on information associated with the rearrangement characteristic programmed in the test data area 413.

Figure 27:
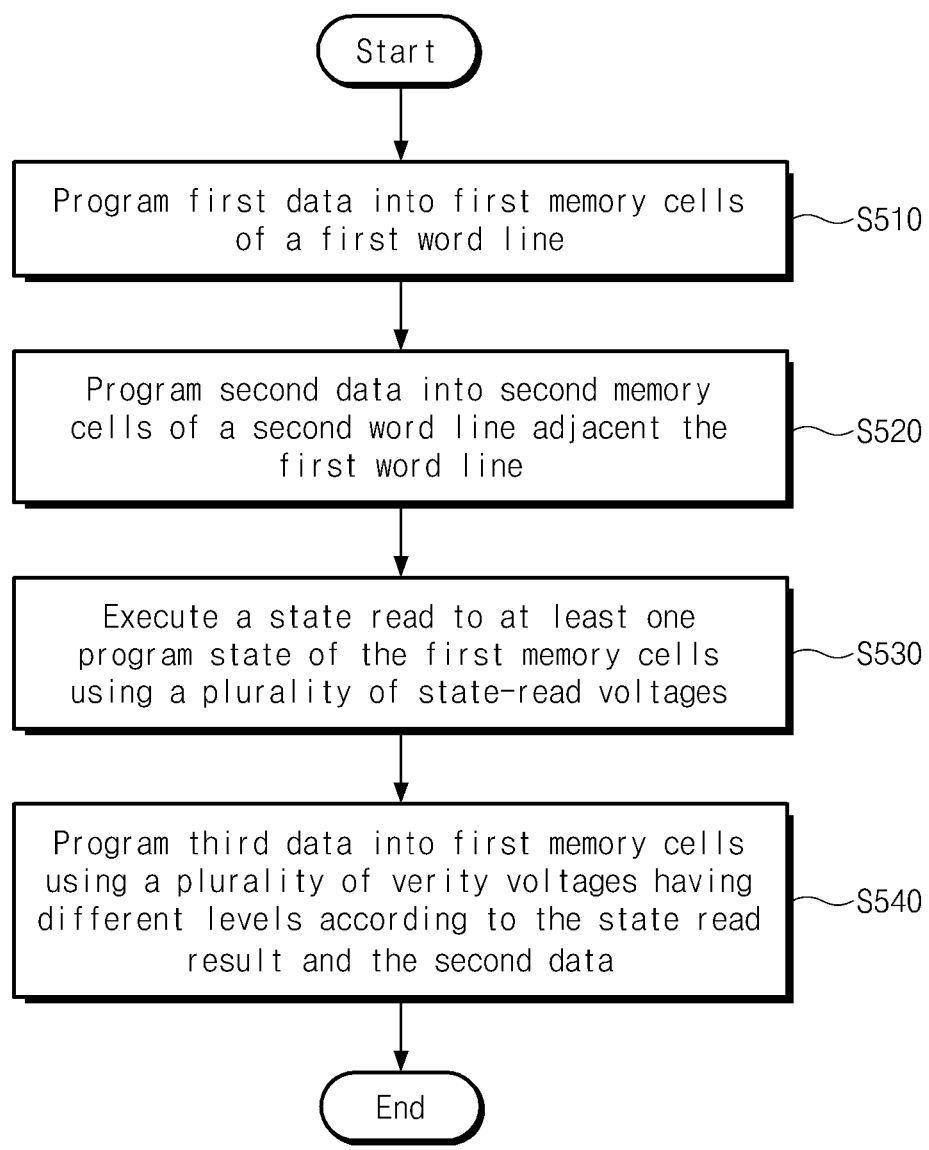
FIG. 27 is a flowchart illustrating a program method according to still another embodiment.

FIG. 27 is a flowchart illustrating a program method according to still another embodiment. Referring to FIGS. 25 and 27, in operation S510, first data may be received and programmed in first memory cells connected to a first word line.

In operation S520, second data may be received and programmed in second memory cells that are connected to a second word line adjacent to the first word line connected to the first memory cells.

In operation S530, a state read may be performed on the program states of the first data programmed in the first memory cells using a plurality of state-read voltages. The state read may be performed in a manner similar to that described with respect to FIG. 12, FIG. 22A or with respect to other description provided herein.

In operation S540, third data may be received and programmed in the first memory cells connected to the first word line using a plurality of verify voltages for each program state (or for one or less than all program states). The resulting program states may represent the combination of first data and third data. For example, the first data may be LSB data and 2SB data and may result in program states E, OP1, OP2 and OP3 as shown in FIG. 22A after the programming in operation S510. The third data may be MSB data and the programming in operation S540 may result in program states E and P1-P7 as shown in FIG. 22A (coarse programming described with respect to FIG. 22A may also be performed or may not be performed). In operation S540, the selection of the verify voltage for each memory cell may take into consideration both the results of the state-read operation in operation S530 as well as the second data programmed into the second memory cells. The second data may either be read from the second word line prior to step S540, or may remain in page buffer latches, such as rearrangement latches RL after the programming of the second data in the second memory cells in operation S520. Second data of the second word line may be used when determining a verify voltage used to program the third data in the memory cells of the first word line. For example, a verify voltage to program a specific memory cell of the first memory cells with third data in step S540 may be decided according to a difference between the threshold voltage of the specific memory cell after programming first data into the specific memory cell and threshold voltages of one or more second memory cells that are adjacent to the specific memory cell. Alternatively, or in addition, a verify voltage to program a specific memory cell of the first memory cells with third data in step S540 may be decided according to an increase of the threshold voltage to a neighboring second memory cell (or increases of threshold voltages of multiple neighboring second memory cells) due to programming of the second data into the second memory cells in operation S520 after programming the first data into the first memory cells in operation S510.

Charges may be trapped at an information storage film of the specific memory cell when the first program data is programmed. Charges trapped at the specific memory cell may be affected by an electric field from charges trapped at adjacent memory cells. Rearrangement of charges trapped at the specific memory cell may be affected by the electric field. As a difference between a threshold voltage of the specific memory cell and threshold voltages of adjacent memory cells becomes large, the strength of the electric field may become strong. That is, influence of the neighboring second memory cell on the rearrangement may be increased. In addition, the neighboring second memory cell may affect a Vth level of the specific memory cell through other mechanisms, such as parasitic coupling due to an increase of the Vth of the second memory cell from the programming of the second memory cell in step S520. Thus, Vth shift of the specific memory cell (e.g., a first memory cell of the first word line) may be assessed as a Vth shift due to rearrangement characteristics of the specific memory cell and Vth shift due to various influences of neighboring second memory cell(s) (such as a Vth difference with the specific cell and/or a Vth change of the second memory cell due to subsequent programming after programming the first data in operation 510). By analyzing a neighboring second memory cell's (or multiple neighboring second memory cells') Vth change and/or Vth difference with the specific memory cell, an estimate can be made as to second memory cell's/cells' influence on the Vth shift of the specific memory cell after programming the first data and removed as a factor from results of the state read in operation S530 to determine rearrangement characteristics of the specific memory cell. If this estimated shift from the influence of neighboring memory cells is consistent with a Vth shift determined from the state read in operation S530, the specific memory cell may be determined as a normal memory cell and a normal verify voltage may be used in the subsequent program operation S540 (in the verify sub-step of one or more program loops). If the estimated shift from the influence of neighboring memory cells does not account for a Vth shift determined from the state read in operation S530 (e.g., a Vth to an upper tail region or lower tail region of a program state), a verify voltage other than the normal verify voltage may be used in the subsequent program operation S540 (e.g., an upper verification voltage for lower tail memory cells and a lower verification voltage for upper tail memory cells in the verify sub-step of one or more program loops). In addition, an estimated shift from the influence of neighboring memory cells may be determined to counteract a Vth shift from rearrangement. In this case, the determined Vth shift from rearrangement may be used to select a verify voltage for use in future programming, even if no or no significant Vth shift is apparent from execution of the state read in step S530. Programming the third data in operation S540 may be made considering rearrangement according to the determined (or, predicted) rearrangement characteristics as described in relation to FIGS. 13 and 14.

In an embodiment, when a program method of FIG. 27 is executed, a lower state read voltage VSRL, a normal state read voltage VSRN and an upper state read voltage VSRU may be generated and used by a nonvolatile memory device 400 in FIG. 25.

Figure 28:
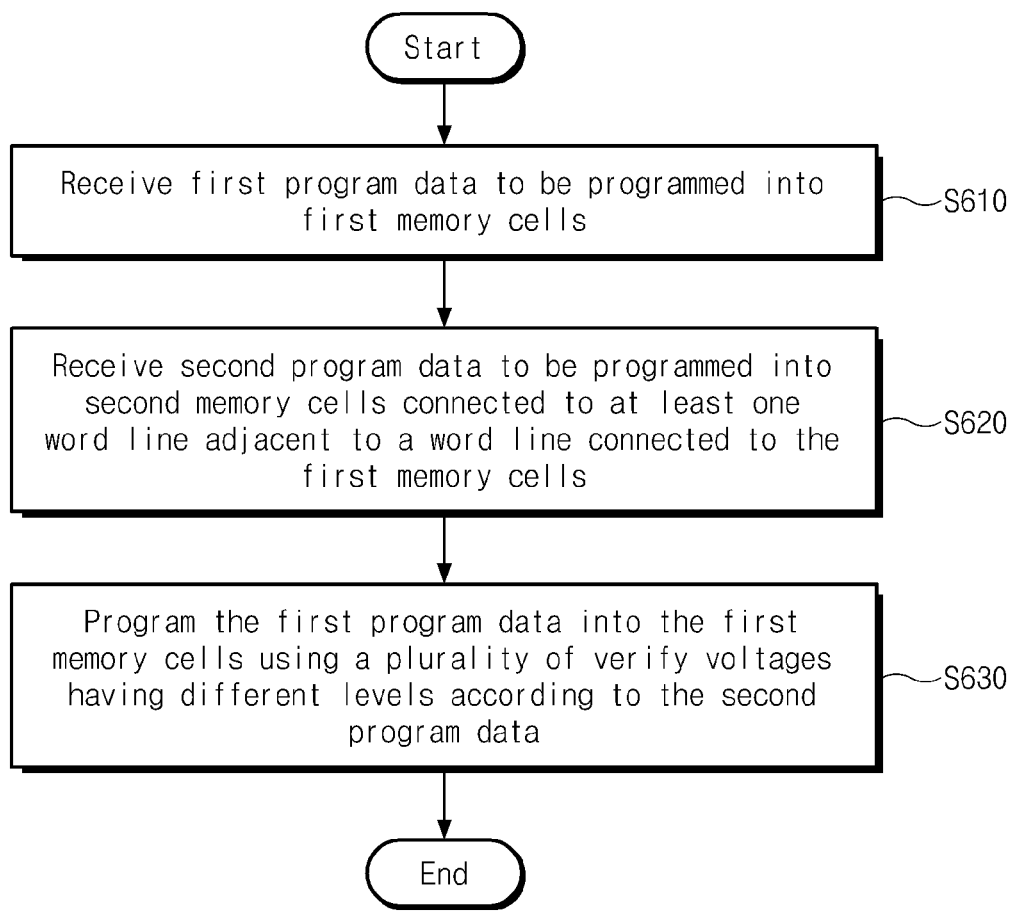
FIG. 28 is a flowchart illustrating a program method according to still another embodiment.

FIG. 28 is a flowchart illustrating a program method according to still another embodiment. Referring to FIGS. 25 and 28, in operation S610, first program data to be programmed in first memory cells of a first word line may be received. The first program data may be stored in data latches DL.

In operation S620, there may be received second program data to be programmed in second memory cells which are connected to a second word line adjacent to a word line connected to the first memory cells. The second program data may also include data in one or more other word lines adjacent the first word line in addition to the second word line. The second program data may be data to be programmed after the first program data is programmed in the first word line. The second data may be stored in data latches DL or rearrangement latches RL.

In operation S630, the first program data may be programmed in the first memory cells using a plurality of verification voltages having different levels, based on the second program data. Memory cells programmed with the first program data may experience a threshold voltage shift, which may be due to charge rearrangement or may be due to other parasitic influences, due to influence of an electric field and/or other factors when the second program data is programmed. Thus, it is possible to improve the data reliability of the nonvolatile memory device 400 by considering an effect on Vth due to data to be subsequently programmed in adjacent memory cells. As will be apparent, predicting the effect of subsequently programmed adjacent memory cells on Vth shift of the first memory cells may be the only factor in selecting one of multiple verify voltages for each program state, or may be one of multiple factors. For example, other factors may also be used to select one of multiple verify voltages, such as performing a state read of previous program and/or erase states (e.g., as described with respect to FIGS. 12 and 22A), and/or prior programming of neighboring memory cells (e.g., as described with respect to FIG. 27).

In an embodiment, when a program method of FIG. 28 is executed, a lower state read voltage VSRL, a normal state read voltage VSRN and an upper state read voltage VSRU may be generated and used by a nonvolatile memory device 400 in FIG. 25.

Figure 29:
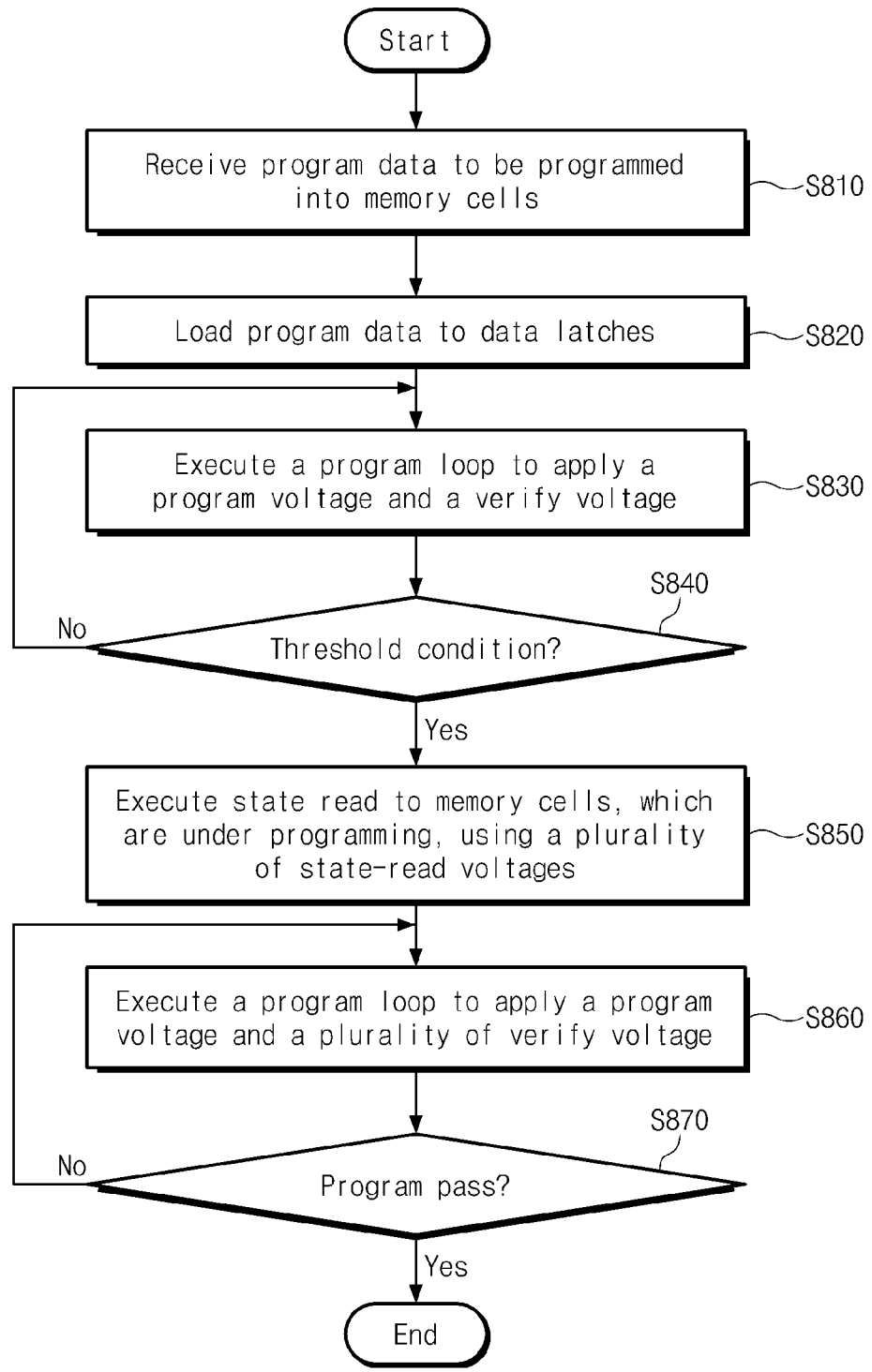
FIG. 29 is a flowchart illustrating a program method according to still another embodiment.

FIG. 29 is a flowchart illustrating a program method according to still another embodiment. Referring to FIG. 29, in operation S810, program data to be programmed in memory cells may be received. For example, LSB data may be received as program data, 2SB data may be received as program data, MSB data may be received as program data, etc.

In operation S820, the program data may be loaded onto data latches DL (refer to FIG. 1). Bit lines BL may be biased according to the program data in the data latches DL.

In operation S830, there may be executed a program loop in which a program voltage and a verification voltage are applied. For example, in operation S830, a program voltage may be applied once to a selected word line, and then a verification voltage may be applied once to the selected word line. Only one verification operation (with one verification voltage) may be performed each time operation S830 is performed.

In operation S840, whether a threshold condition is satisfied may be judged. For example, the threshold condition may be a number of program loops of operation S830 performed. When a program loop number is over a specific value, the threshold condition may be satisfied. In addition or alternatively, threshold condition may include a first program pass. When any of the memory cells are first detected to pass programming (as determined by the verification operation of operation S830, the threshold condition may be satisfied. The threshold condition may be satisfied by a certain number of program passed memory cells. When the number of memory cells detected to pass programming (as determined by the verification operation of S830) is over a specific value, the threshold condition may be satisfied. Other various conditions may be used as the threshold condition. If the threshold condition is satisfied, the method proceeds to operation S850. If the threshold condition is not satisfied, the method returns to and repeats operation S830. In this case, a program voltage may be increased.

When the threshold condition is met, the method proceeds to operation S850. In operation S850, a state read operation on memory cells being programmed (memory cells whose threshold voltages are adjusted) may be performed using a plurality of state read voltages. A delay time may be provided between steps S830 and S850 to provide sufficient time for charge rearrangement. See, for example, U.S. Pat. No. 7,813,183 regarding providing a exemplary delay time between application of a programming pulse (or erase voltage) and a subsequent read or verify operation, the contents of which are hereby incorporated by reference. In operation S860, as a program loop is executed, a program voltage may be applied once, while a plurality of verification voltages having different levels may be applied, respectively, to verify programming various memory cells with different verification levels (e.g., as done with respect to other embodiments described herein). Which memory cells are verified by which of the plurality of verification voltages may be determined according to a state read result, as discussed elsewhere herein. Alternatively, other factors described herein, such as neighboring memory cells as described with respect to FIGS. 27 and 28 may be used in addition or in place of the state read operation of S850 to determine which of the plurality of verification voltages should be used for a particular memory cell of the memory cells to be programmed. The program voltage applied across the memory cells to be programmed in operation S860 may be consistent with the program voltages applied across memory cells to be programmed in operation S830 (e.g., same program voltage, or a new program voltage incremented in the same manner as between subsequent program voltages of operation S830). Alternatively, the program voltage applied across the memory cells to be programmed in operation S860 may be a soft program voltage, less than otherwise may have been applied in a subsequent operation S830. See, for example, U.S. Patent Publication 2012/010374, herein incorporated by reference in its entirety, regarding exemplary soft programming of memory cells, as well as other exemplary programming features. For example, U.S. Patent Publication 2012/010374 also discusses re-verifying a cell that is already determined to be programmed, and if such verification fails, applying programming voltage(s) to that cell, which may also be utilized by the methods and devices described herein.

In operation S870, program pass may be judged. The method may be ended upon program pass. Upon program fail, the method returns to and repeats operation S860. At this time, a program voltage may be increased. While not shown in FIG. 29, after a certain number of program fails, the method may end and it may be determined that there is an error, such as a defective memory. The method of FIG. 29 may be performed without interruption of other programming besides those memory cells receiving programming data in operation S810. If the method of FIG. 29 is applied to a word line (i.e., the program data received in operation S810 is for a selected word line), the method of FIG. 29 may be performed without interruption of programming of neighboring word lines.

Figure 30A:
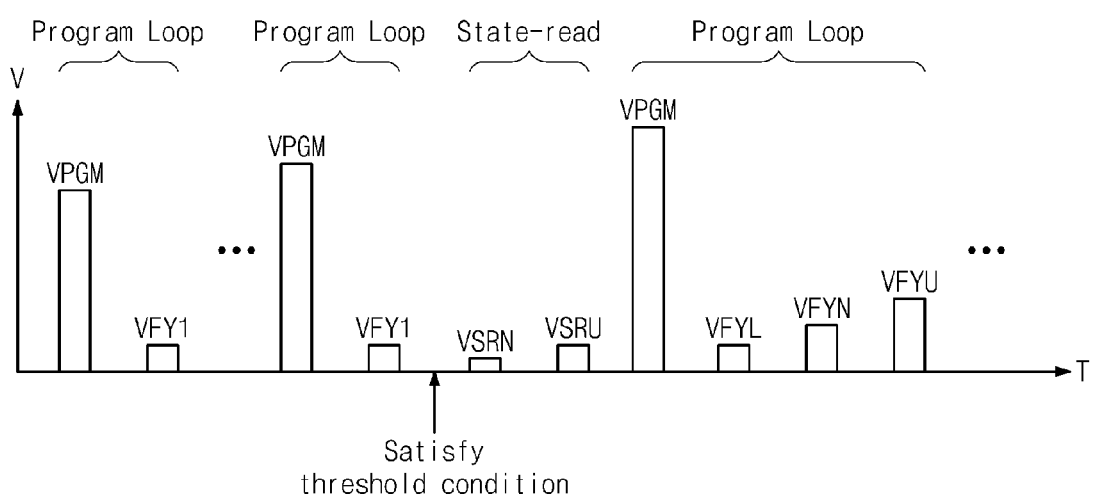
FIG. 30A is a timing diagram illustrating voltages applied to a selected word line according to a program method in FIG. 29.
Figure 30B:
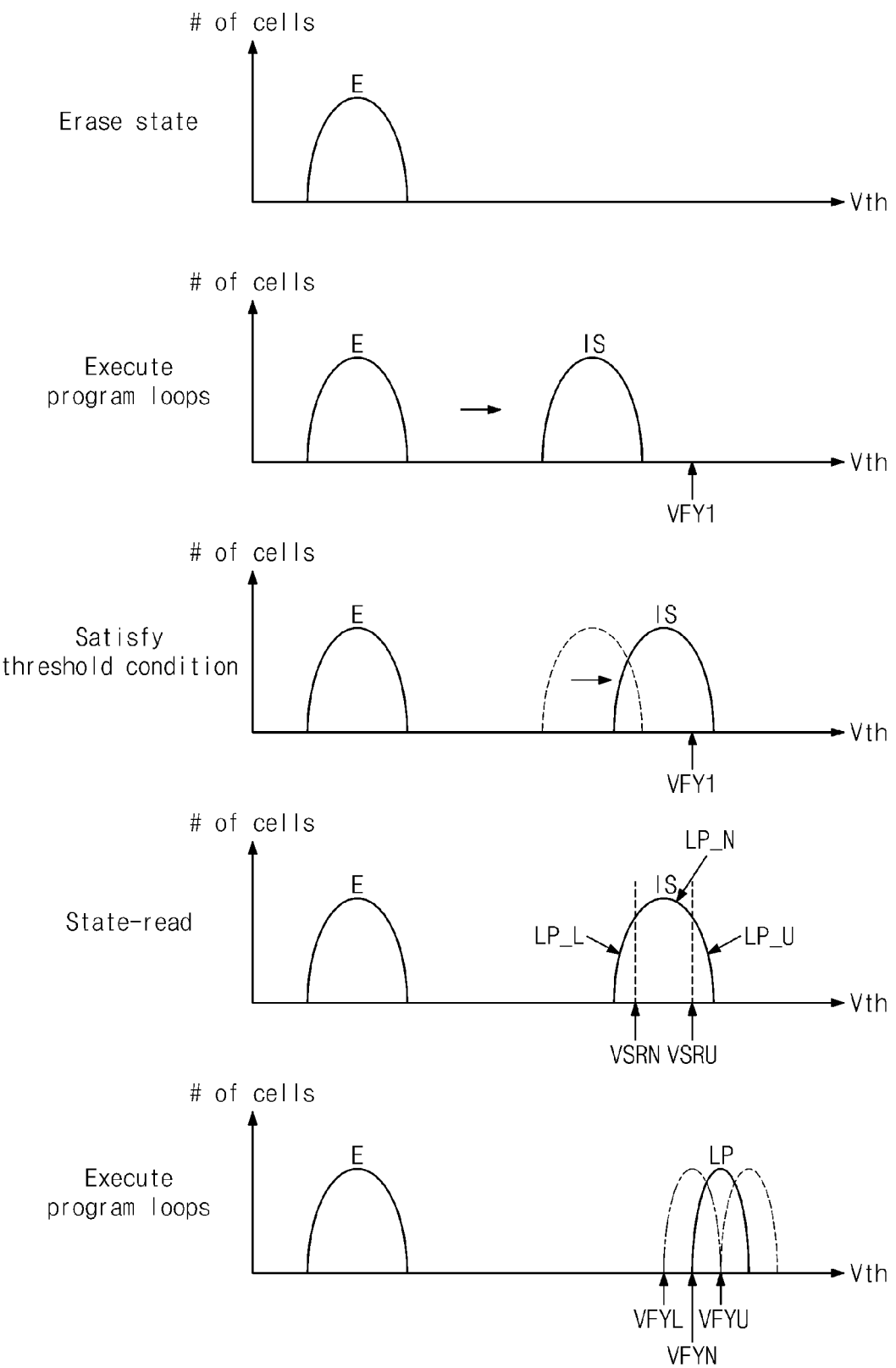
FIG. 30B is a graph illustrating a variation in a threshold voltage distribution of memory cells according to a program method in FIG. 29 and a voltage applying manner in FIG. 30A.

FIG. 30A is a timing diagram illustrating voltages applied to a selected word line according to a program method in FIG. 29. FIG. 30B is a graph illustrating a variation in a threshold voltage distribution of memory cells according to a program method in FIG. 29 and a voltage applying manner in FIG. 30A.

Referring to FIGS. 30A and 30B, during execution of each of first several program loops, a program voltage VPGM may be applied once to the word line to which the memory cells are connected, and a verification voltage VFY1 may be applied once to verify the programming of the memory cells. The program voltage VPGM may be increased at each iteration of these program loops. As the program loop is iterated, threshold voltages of programmed memory cells may be increased from an erase state E, or from a program state resulting from a previous program operation (not shown in FIGS. 29 and 30A). Memory cells with increased threshold voltages (or, memory cells being programmed) may have an intermediate state IS.

If a threshold condition is satisfied, a state read operation may be carried out. A state read operation may be performed with respect to memory cells having the intermediate state IS. The state read operation may be performed by applying a normal state read voltage VSRN and an upper state read voltage VSRU to the memory cells having the intermediate state. The normal state read voltage VSRN may be higher in level than the upper state read voltage VSRU. The upper state read voltage VSRU may be equal in level to the verification voltage VFY1. The state read operation may be performed as noted with respect to other embodiments described herein.

If the state read operation is performed, upper tail memory cells LP_U, normal memory cells LP_N, and lower tail memory cells LP_L may be discriminated. For certain memory devices (such as those with very small memory cells), charge rearrangement or other factors causing a threshold shift may occur in a short period of time. Thus, rearrangement may occur and/or substantially reflect rearrangement characteristics of the memory cell between programming loops during programming. If a state read operation is carried out when a threshold condition is satisfied, upper tail memory cells LP_U, normal memory cells LP_N, and lower tail memory cells LP_L may be discriminated. Herein, threshold voltages of the upper tail memory cells LP_U may be increased due to the rearrangement, threshold voltages of the normal memory cells LPN may not significantly vary although the rearrangement is generated, and threshold voltages of the lower tail memory cells LP_L may be decreased due to the rearrangement.

Afterwards, a program loop considering determined rearrangement characteristics of the memory cells may be performed. The upper tail memory cells LP_U may be programmed using a lower verification voltage VFYL, the normal memory cells LP_N may be programmed using a normal verification voltage VFYN, and the lower tail memory cells LP_L may be programmed using an upper verification voltage VFYU. Memory cells having the intermediate state IS may be programmed to a program state LP by programming. If a program operation is performed in view of the rearrangement, a threshold voltage distribution of memory cells may become narrow when the rearrangement is generated.

In an alternative embodiment, a state read result may be stored in a supplemental area of a memory cell array so as to be read if necessary. A state read result can be output to an external device. In case that a rearrangement characteristic of memory cells is previously stored in a test area or supplemental area of a memory cell array, a program operation may be performed based on the rearrangement characteristic read from the test area without the state read operation of operation S850.

Figure 31:
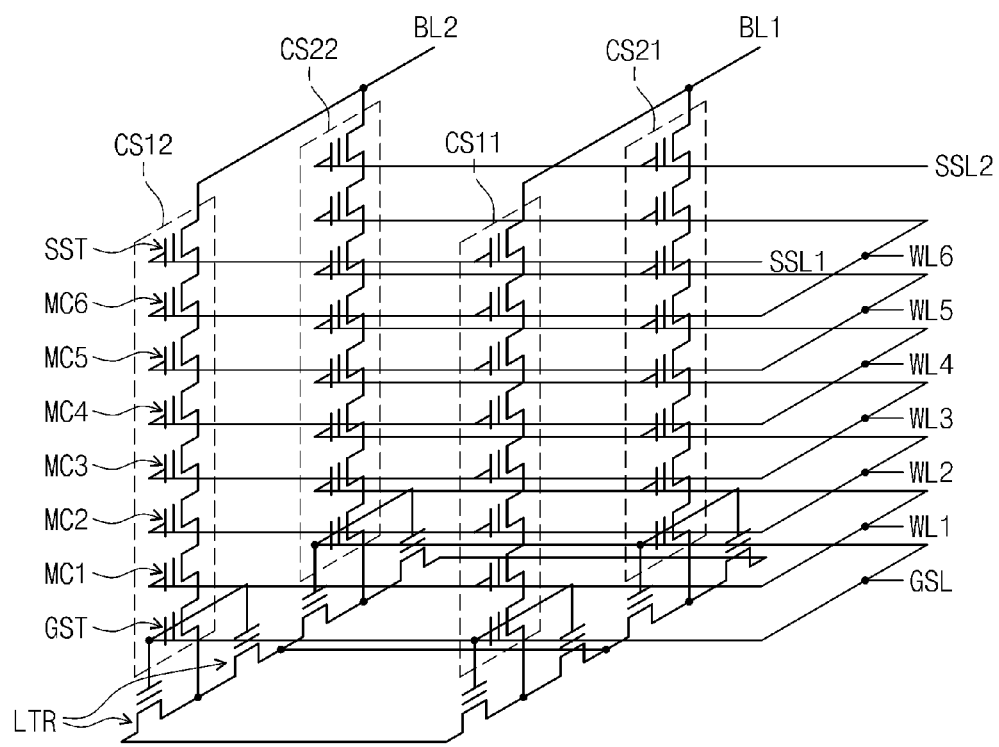
FIG. 31 is a circuit diagram illustrating an equivalent circuit of a part EC of a top view in FIG. 3 according to another embodiment.

FIG. 31 is a circuit diagram illustrating an equivalent circuit of a part EC of a top view in FIG. 3 according to another embodiment. An equivalent circuit BLKa2 in FIG. 31 may be different from that in FIG. 7 in that lateral transistors LTR are added in each cell string.

Referring to FIGS. 3 to 6 and 31, lateral transistors LTR in each cell string may be connected between a ground selection transistor GST and a common source line CSL. Gates of the lateral transistors LTR in each cell string may be connected to a ground selection line GSL together with a gate (or, a control gate) of a ground selection transistor GST therein.

Channel films 114 may operate as vertical bodies of first conductive materials CM1. That is, the first conductive materials CM1 may constitute vertical transistors together with the channel films 114. The first conductive materials CM1 may constitute ground selection transistors GST vertical to a substrate 111 together with the channel films 114.

Information storage films 116 may be provided between the substrate 111 and the first conductive materials CM1. The substrate 111 may act as a horizontal body of the first conductive materials CM1. That is, the first conductive materials CM1 may form the lateral transistors LTR together with the substrate 111.

When a voltage is applied to the first conductive materials CM1, an electric field may be formed between the first conductive materials CM1 and the channel films 114. The electric field may enable channels to be formed at the channel films 114. When a voltage is applied to the first conductive materials CM1, an electric field may be formed between the first conductive materials CM1 and the substrate 111. The electric field may enable channels to be formed at the substrate 111. Channels formed at the substrate 111 may be coupled with common source regions CSR and the channel films 114. When a voltage is applied to the ground selection line GSL, the ground selection transistors GST and the lateral transistors LTR may be turned on. This may enable cell strings CS11, CS12, CS21, and CS22 to be connected with a common source line CSL.

Figure 32:
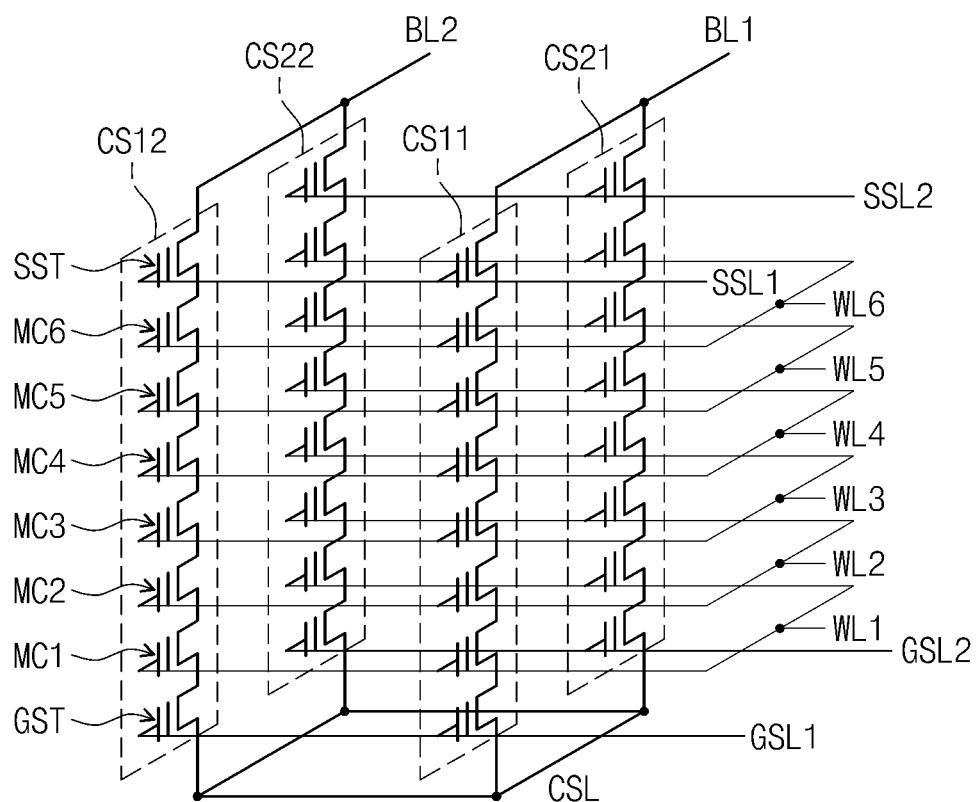
FIG. 32 is a circuit diagram illustrating an equivalent circuit of a part EC of a top view in FIG. 3 according to still another embodiment.

FIG. 32 is a circuit diagram illustrating an equivalent circuit of a part EC of a top view in FIG. 3 according to still another embodiment. An equivalent circuit BLKa3 in FIG. 32 may be different from that in FIG. 7 in that ground selection transistors GST are connected with first and second ground selection lines GSL1 and GSL2. Referring to FIGS. 3 to 6, and 32, first conductive materials CM1 may constitute first and second ground selection lines GSL1 and GSL2.

As described in relation to FIGS. 1 to 28, rearrangement characteristics of memory cells MC1 to MC6 may be detected (or, predicted) via reading. As described in relation to FIGS. 1 to 28, the memory cells MC1 to MC8 may be programmed in view of the detected (or, predicted) rearrangement characteristics.

As described with reference to FIG. 31, lateral transistors LTR can be provided to the equivalent circuit BLKa3.

Figure 33:
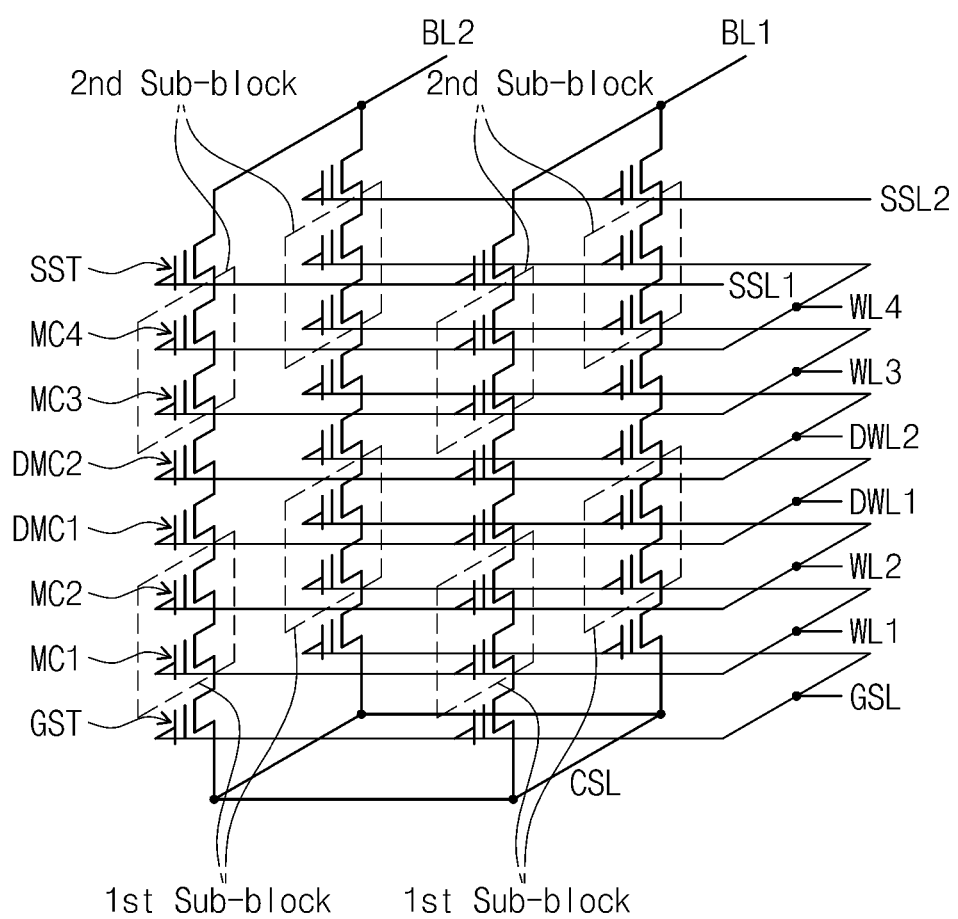
FIG. 33 is a circuit diagram illustrating an equivalent circuit of a part EC of a top view in FIG. 3 according to still another embodiment.

FIG. 33 is a circuit diagram illustrating an equivalent circuit of a part EC of a top view in FIG. 3 according to still another embodiment. Referring to FIGS. 3 to 6 and 33, a plurality of sub blocks may be provided. In this embodiment, second and third conductive materials CM2 and CM3 may constitute first and second memory cells MC1 and MC2, which are used as a first sub block. Sixth and seventh conductive materials CM6 and CM7 may constitute third and fourth memory cells MC3 and MC4, which are used as a second sub block. Fourth and fifth conductive materials CM4 and CM5 may constitute first and second dummy memory cells DMC1 and DMC2 provided between the first and second sub blocks. The first and second sub blocks may be programmed, read, and erased independently from each other.

As described in relation to FIGS. 1 to 28, rearrangement characteristics of memory cells MC1 to MC4 may be detected (or, predicted) via reading. As described in relation to FIGS. 1 to 28, the memory cells MC1 to MC4 may be programmed in view of the detected (or, predicted) rearrangement characteristics.

As described with reference to FIG. 31, lateral transistors LTR can be provided to the equivalent circuit BLKa3.

Figure 34:
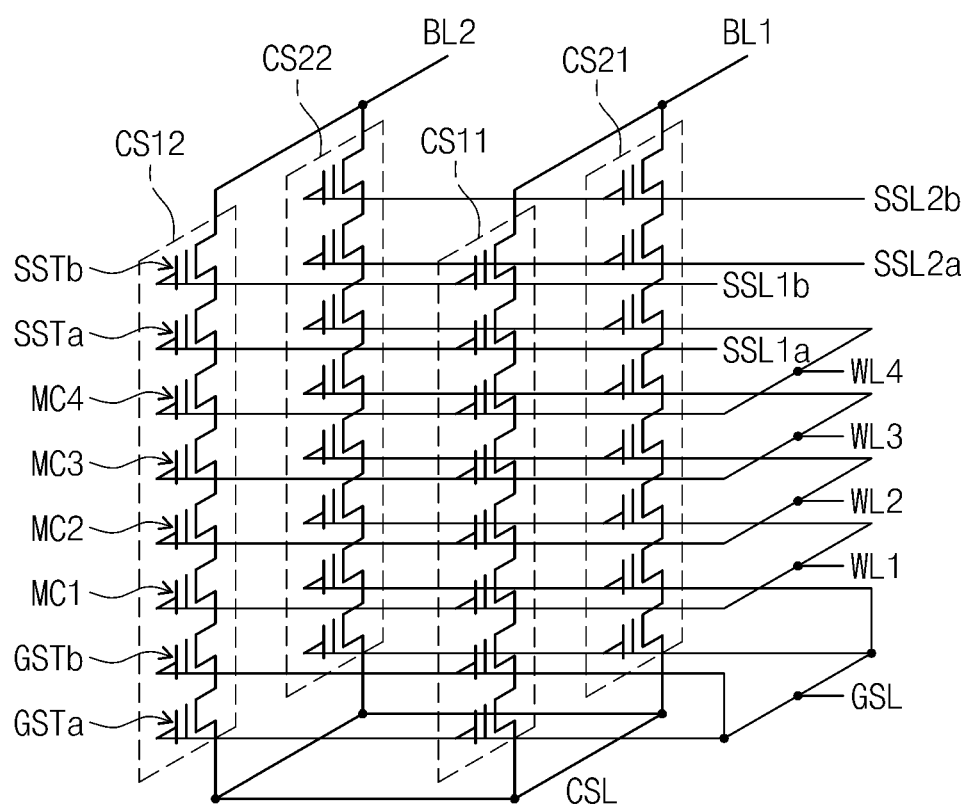
FIG. 34 is a circuit diagram illustrating an equivalent circuit of a part EC of a top view in FIG. 3 according to still another embodiment.

FIG. 34 is a circuit diagram illustrating an equivalent circuit of a part EC of a top view in FIG. 3 according to still another embodiment. Referring to FIGS. 3 to 6, and 34, first and second conductive materials CM1 and CM2 may constitute ground selection transistors GSTa and GSTb respectively having first and second heights. Seventh and eighth conductive materials CM7 and CM8 may constitute string selection transistors SSTa and SSTb respectively having seventh and eighth heights. Third to sixth conductive materials CM3 to CM6 may constitute first to fourth memory cells MC1 to MC4.

The first and second conductive materials CM1 and CM2 may be connected in common to form a ground selection line GSL. Cell strings CS11, CS12, CS21, and CS22 may be connected in common with a string selection line GSL.

The cell strings CS11 and CS12 may be connected with two string selection lines SSL 1a and SSL1b respectively having seventh and eighth heights and formed by seventh and eighth conductive materials CM7 and CM8. The cell strings CS21 and CS22 may be connected with two string selection lines SSL2a and SSL2b respectively having the seventh and eighth heights and formed by the seventh and eighth conductive materials CM7 and CM8.

Conductive materials respectively corresponding to at least three heights can form string selection transistors. Conductive materials respectively corresponding to at least three heights may form string selection transistors.

As described in relation to FIGS. 1 to 28, rearrangement characteristics of memory cells MC1 to MC4 may be detected (or, predicted) via reading. As described in relation to FIGS. 1 to 28, the memory cells MC1 to MC4 may be programmed in view of the detected (or, predicted) rearrangement characteristics.

Like an equivalent circuit BLKa2 described with reference to FIG. 31, lateral transistors LTR may be provided to the equivalent circuit BLKa5. Like an equivalent circuit BLKa3 described with reference to FIG. 32, cell strings CS11 and CS12 may be connected with one ground selection line (not shown), and cell strings CS21 and CS22 may be connected with another ground selection line (not shown). Like an equivalent circuit BLKa4 described with reference to FIG. 33, memory cells MC1 to MC4 may constitute a plurality of sub blocks.

Figure 35:
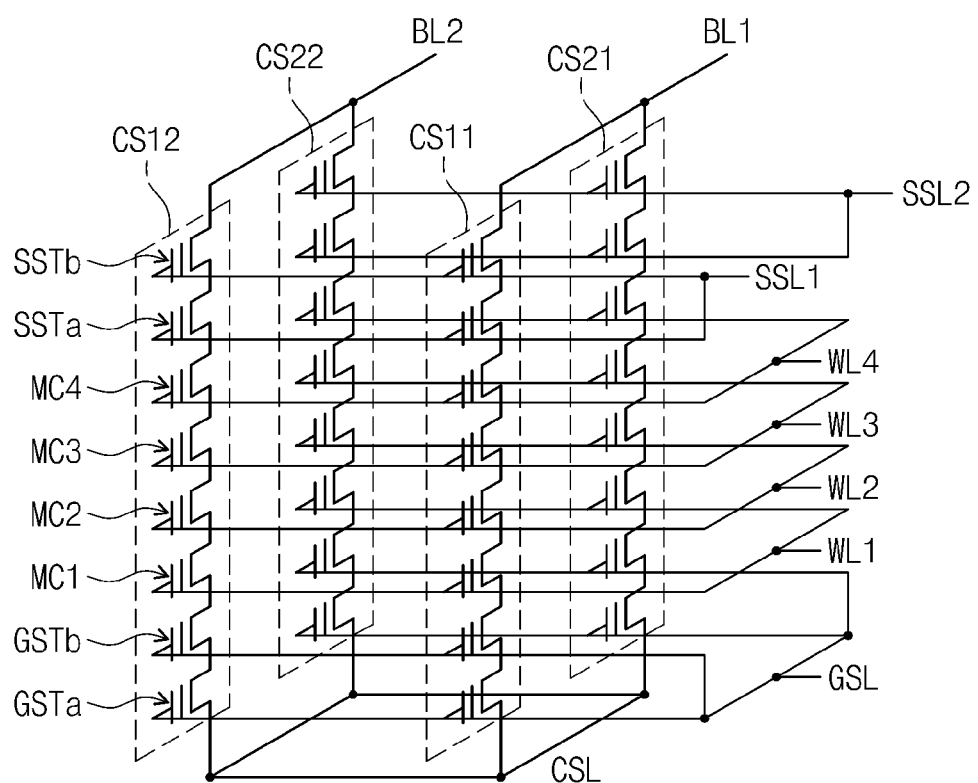
FIG. 35 is a circuit diagram illustrating an equivalent circuit of a part EC of a top view in FIG. 3 according to still another embodiment.

FIG. 35 is a circuit diagram illustrating an equivalent circuit of a part EC of a top view in FIG. 3 according to still another embodiment. An equivalent circuit BLKa6 in FIG. 35 may be different from that in FIG. 34 in that string selection transistors SSTa and SSTb in cell strings of the same row share a string selection line. String selection transistors SSTa and SSTb in cell strings CS11 and CS12 may be connected in common to a first string selection line SSL1, and string selection transistors SSTa and SSTb in cell strings CS21 and CS22 may be connected in common to a second string selection line SSL2.

As described in relation to FIGS. 1 to 28, rearrangement characteristics of memory cells MC1 to MC4 may be detected (or, predicted) via reading. As described in relation to FIGS. 1 to 28, the memory cells MC1 to MC4 may be programmed in view of the detected (or, predicted) rearrangement characteristics.

Like an equivalent circuit BLKa2 described with reference to FIG. 31, lateral transistors LTR may be provided to the equivalent circuit BLKa6. Like an equivalent circuit BLKa3 described with reference to FIG. 32, cell strings CS11 and CS12 may be connected with one ground selection line (not shown), and cell strings CS21 and CS22 may be connected with another ground selection line (not shown). Like an equivalent circuit BLKa4 described with reference to FIG. 33, memory cells MC1 to MC4 may constitute a plurality of sub blocks.

Figure 36:
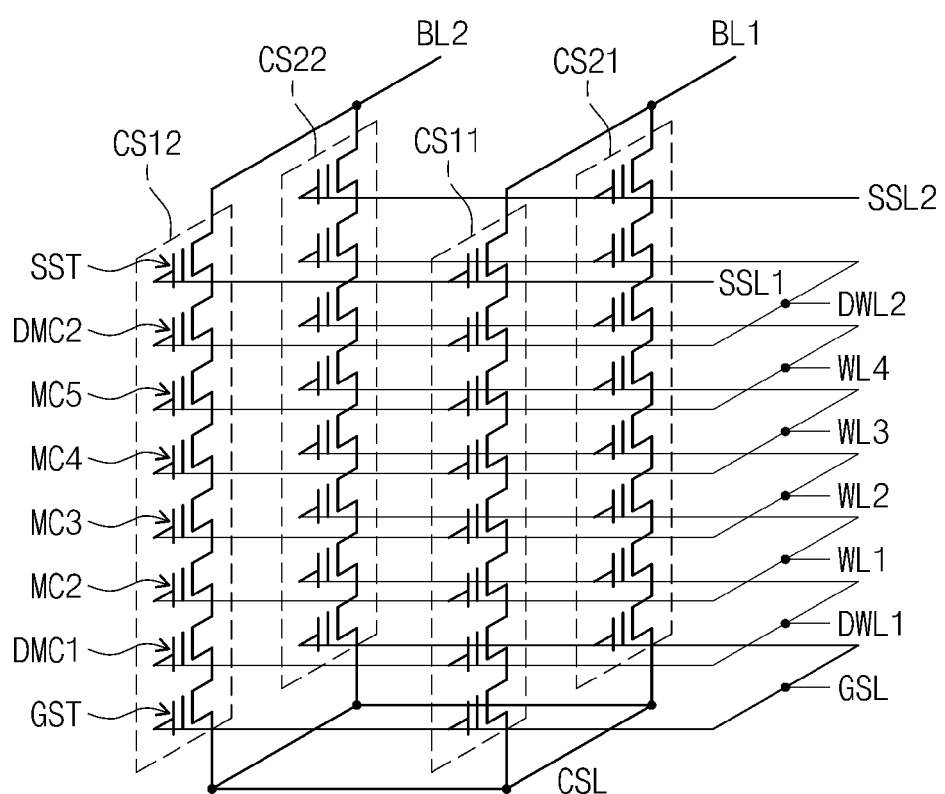
FIG. 36 is a circuit diagram illustrating an equivalent circuit of a part EC of a top view in FIG. 3 according to still another embodiment.

FIG. 36 is a circuit diagram illustrating an equivalent circuit of a part EC of a top view in FIG. 3 according to still another embodiment. Referring to FIGS. 3 to 6 and 36, second conductive materials CM2 may constitute first dummy memory cells DMC1, and seventh conductive materials CM7 may constitute second dummy memory cells DMC2.

In an embodiment, conductive materials corresponding to two or more heights may constitute dummy memory cells (not shown) disposed between memory cells and a ground selection transistor GST. Conductive materials corresponding to two or more heights may constitute dummy memory cells (not shown) disposed between memory cells and a string selection transistor SST. Dummy memory cells (not shown) can be disposed to be adjacent to any one of the ground and string selection transistors GST and SST.

As described in relation to FIGS. 1 to 28, rearrangement characteristics of memory cells MC1 to MC4 may be detected (or, predicted) via reading. As described in relation to FIGS. 1 to 28, the memory cells MC1 to MC4 may be programmed in view of the detected (or, predicted) rearrangement characteristics.

Like an equivalent circuit BLKa2 described with reference to FIG. 31, lateral transistors LTR may be provided to the equivalent circuit BLKa7. Like an equivalent circuit BLKa3 described with reference to FIG. 32, cell strings CS11 and CS12 may be connected with one ground selection line (not shown), and cell strings CS21 and CS22 may be connected with another ground selection line (not shown). Like an equivalent circuit BLKa4 described with reference to FIG. 33, memory cells MC1 to MC4 may constitute a plurality of sub blocks.

As described with reference to FIG. 34, conductive materials of two or more heights may constitute string selection transistors SSTa and SSTb. Conductive materials of two or more heights may constitute ground selection transistors GSTa and GSTb. As described with reference to FIG. 35, string selection transistors SSTa and SSTb of the same row may be connected with one string selection line SSL1 or SSL2.

Figure 37:
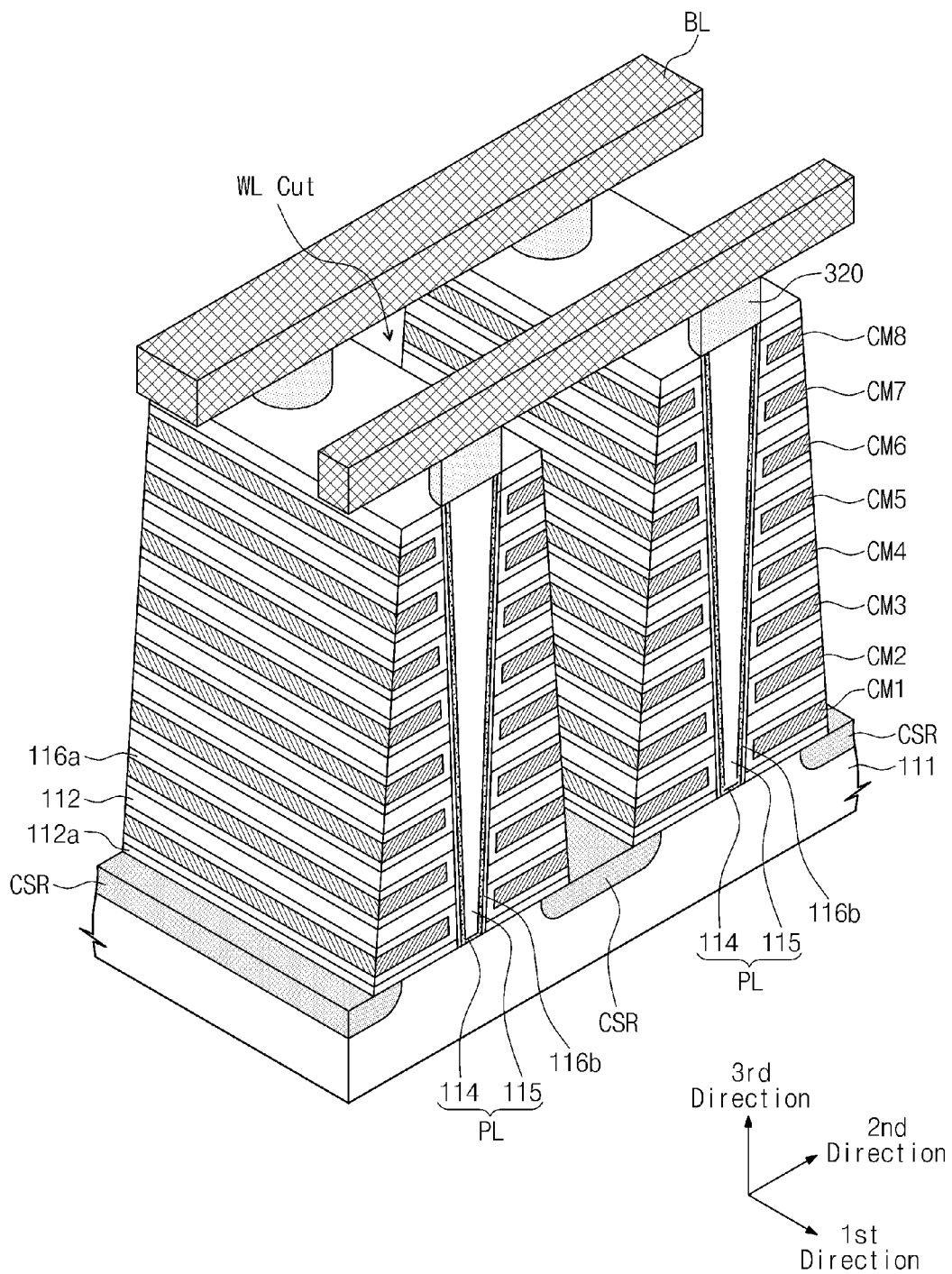
FIG. 37 is a perspective view taken along a line IV-IV' in FIG. 3 according to another embodiment.
Figure 38:
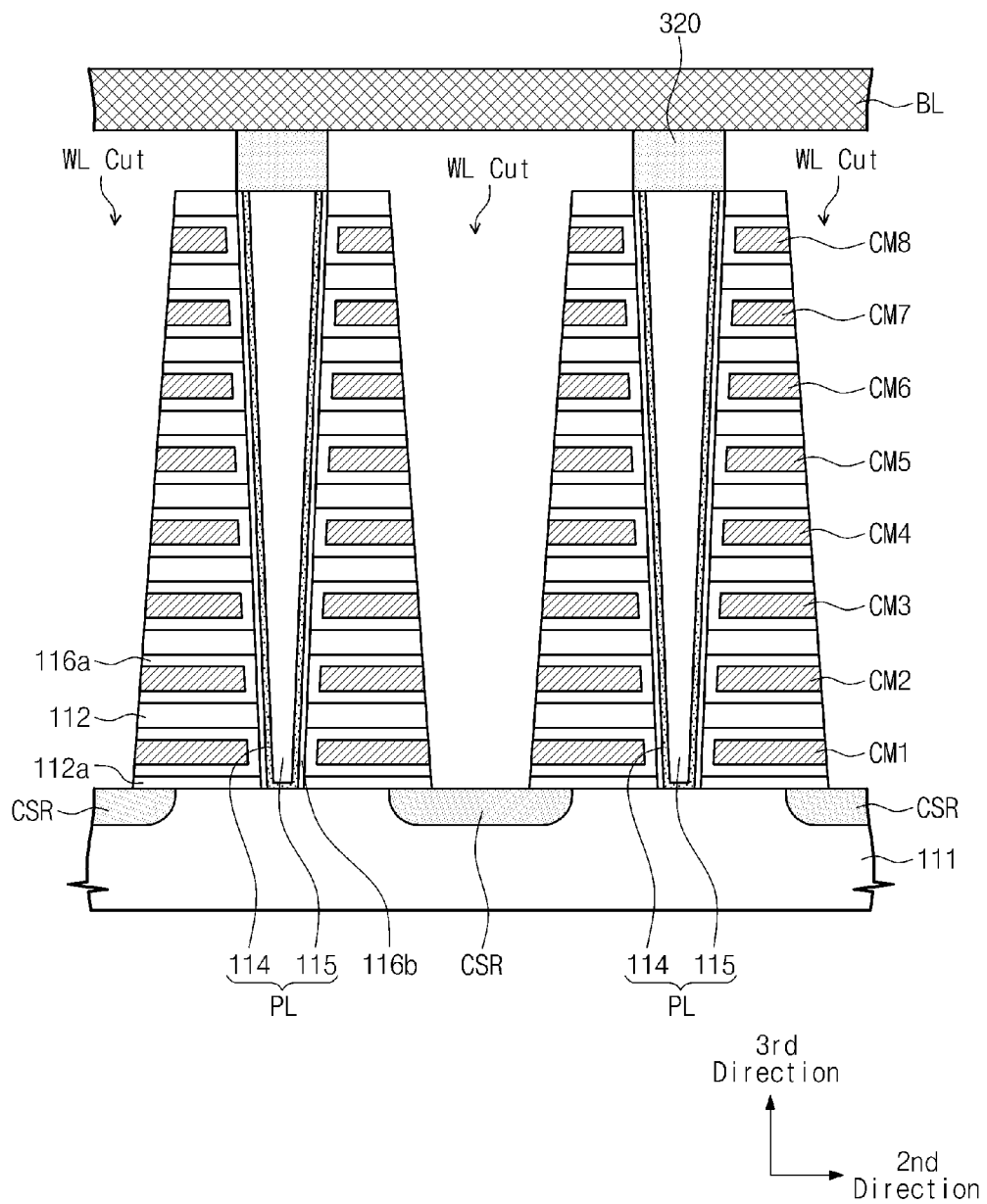
FIG. 38 is a cross-sectional view taken along a line IV-IV' in FIG. 3 according to another embodiment.

FIG. 37 is a perspective view taken along a line IV-IV' in FIG. 3 according to another embodiment. FIG. 38 is a cross-sectional view taken along a line IV-IV' in FIG. 3 according to another embodiment. Referring to FIGS. 3, 37, and 38, first information storage films 116a may be provided among conductive materials CM1 to CM8, insulation materials 112 and 112a, and pillars PL, and second information storage films 116b may be provided on inner sides of the pillars PL.

The first information storage films 116a may include blocking insulation films such as third sub insulation films 119 (refer to FIGS. 4 and 5). The first information storage films 116a may be formed at the same location as information storage films 116 illustrated in FIGS. 4 and 5. The second information storage films 116b may include charge trap films and tunneling insulation films such as first and second sub insulation films 117 and 118.

An equivalent circuit of a memory block described with reference to FIGS. 3, 37, and 38 may be one of the above-described equivalent circuits BLKa1 to BLKa7.

Figure 39:
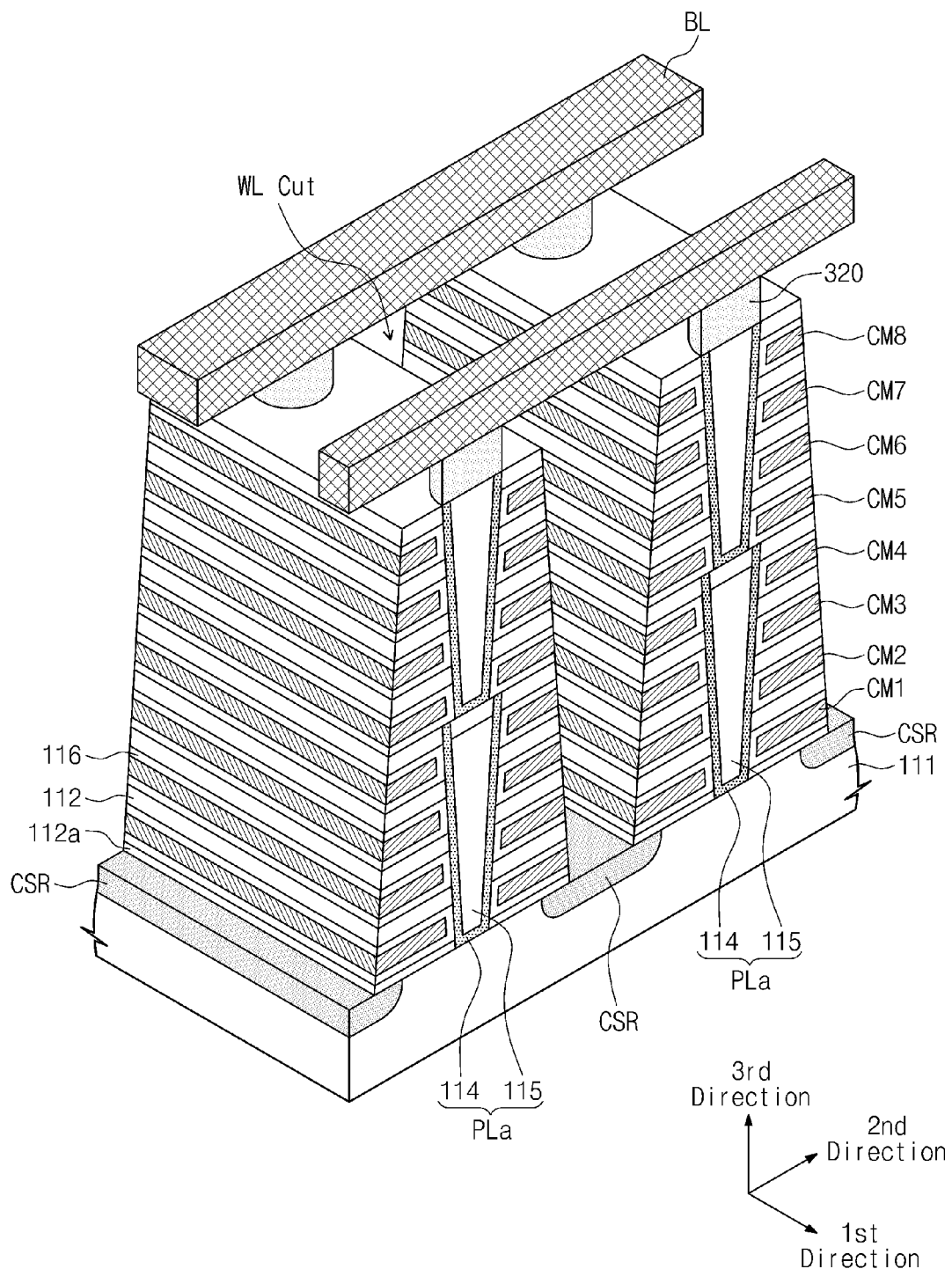
FIG. 39 is a perspective view taken along a line IV-IV' in FIG. 3 according to still another embodiment.
Figure 40:
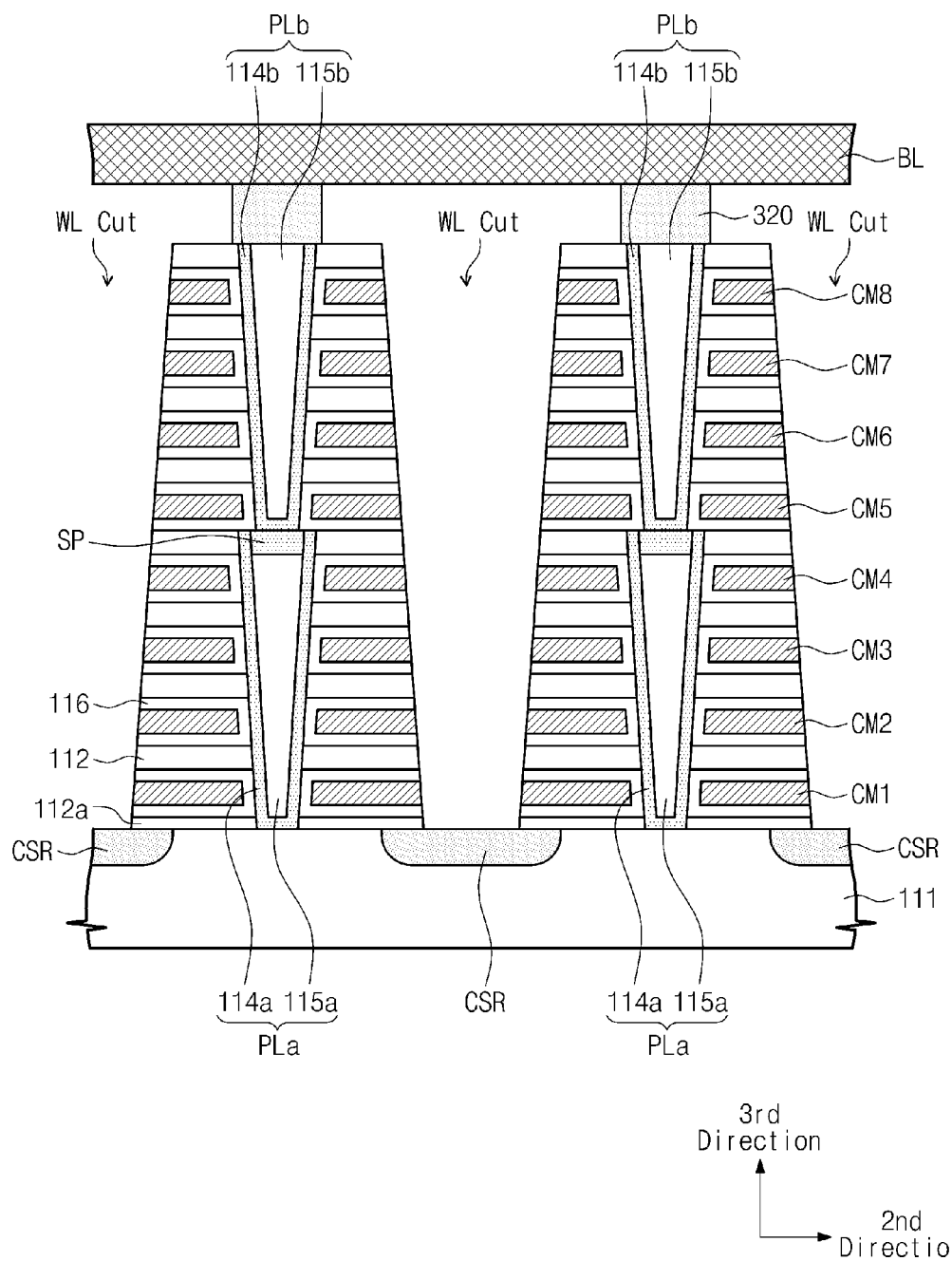
FIG. 40 is a cross-sectional view taken along a line IV-IV' in FIG. 3 according to still another embodiment.

FIG. 39 is a perspective view taken along a line IV-IV' in FIG. 3 according to still another embodiment. FIG. 40 is a cross-sectional view taken along a line IV-IV' in FIG. 3 according to still another embodiment. Referring to FIGS. 3, 39, and 40, lower pillars PLa and upper pillars PLb may be provided to be stacked in a direction perpendicular to a substrate 111.

The lower pillars PLa may penetrate insulation films 112 and 112a along a third direction to contact with the substrate 111. Each of the lower pillars PLa may include a lower channel film 114a and a lower inner material 115a. The lower channel films 114a may include a semiconductor material having the same conductivity type as the substrate 111 or an intrinsic semiconductor. The lower channel films 114a may act as vertical bodies of first to fourth conductive materials CM1 and CM4, respectively. The lower inner materials 115a may include an insulation material.

The upper pillars PLb may be provided on the lower pillars PLa, respectively. The upper pillars PLb may penetrate the insulation films 112 along a third direction to contact with upper surfaces of the lower pillars PLa. Each of the upper pillars PLb may include an upper channel film 114b and an upper inner material 115b. The upper channel films 114b may include a semiconductor material having the same conductivity type as the lower channel films 114a or an intrinsic semiconductor. The upper channel films 114b may act as vertical bodies of fifth to eighth conductive materials CM5 and CM8, respectively. The upper inner materials 115b may include an insulation material.

The lower channel films 114a and the upper channel films 114b may be connected to act as a vertical body. For example, semiconductor pads SP may be provided on the lower pillars PLa, respectively. The semiconductor pads SP may include a semiconductor material having the same conductivity type as the lower channel films 114a or an intrinsic semiconductor. The lower channel films 114a and the upper channel films 114b may be interconnected via the semiconductor pads SP.

In this embodiment, among the first to eighth conductive materials CM1 to CM8, conductive materials adjacent to the semiconductor pads SP may constitute dummy word lines and dummy memory cells. For example, the fourth conductive material CM4 adjacent to the semiconductor pads SP, the fifth conductive material CM5, or the fourth and fifth conductive materials CM4 and CM5 may constitute dummy word lines and dummy memory cells.

An equivalent circuit of a memory block described with reference to FIGS. 3, 39, and 40 may be identical to one of the above-described equivalent circuits BLKa1 to BLKa7.

Figure 41:
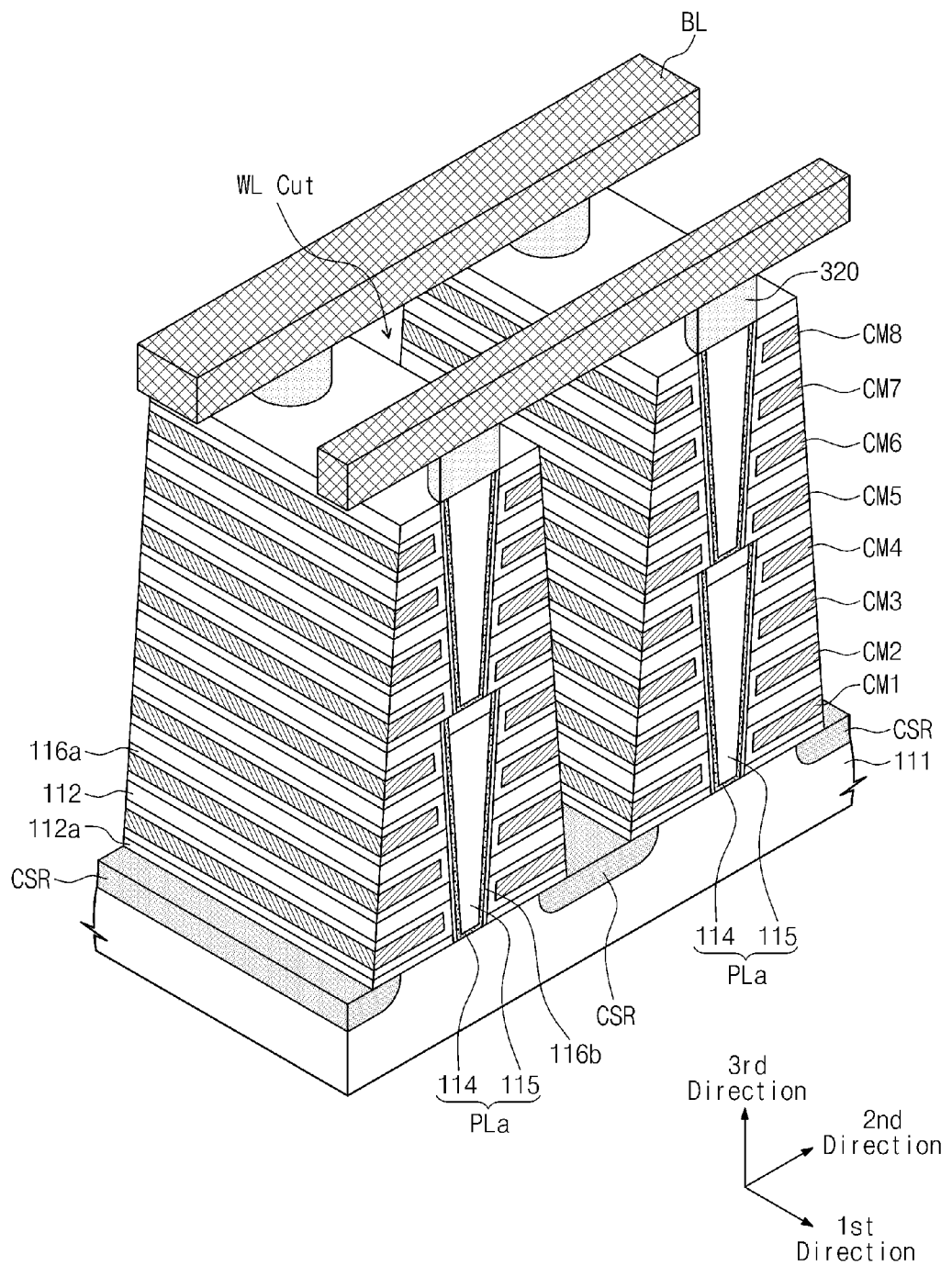
FIG. 41 is a perspective view taken along a line IV-IV' in FIG. 3 according to still another embodiment.
Figure 42:
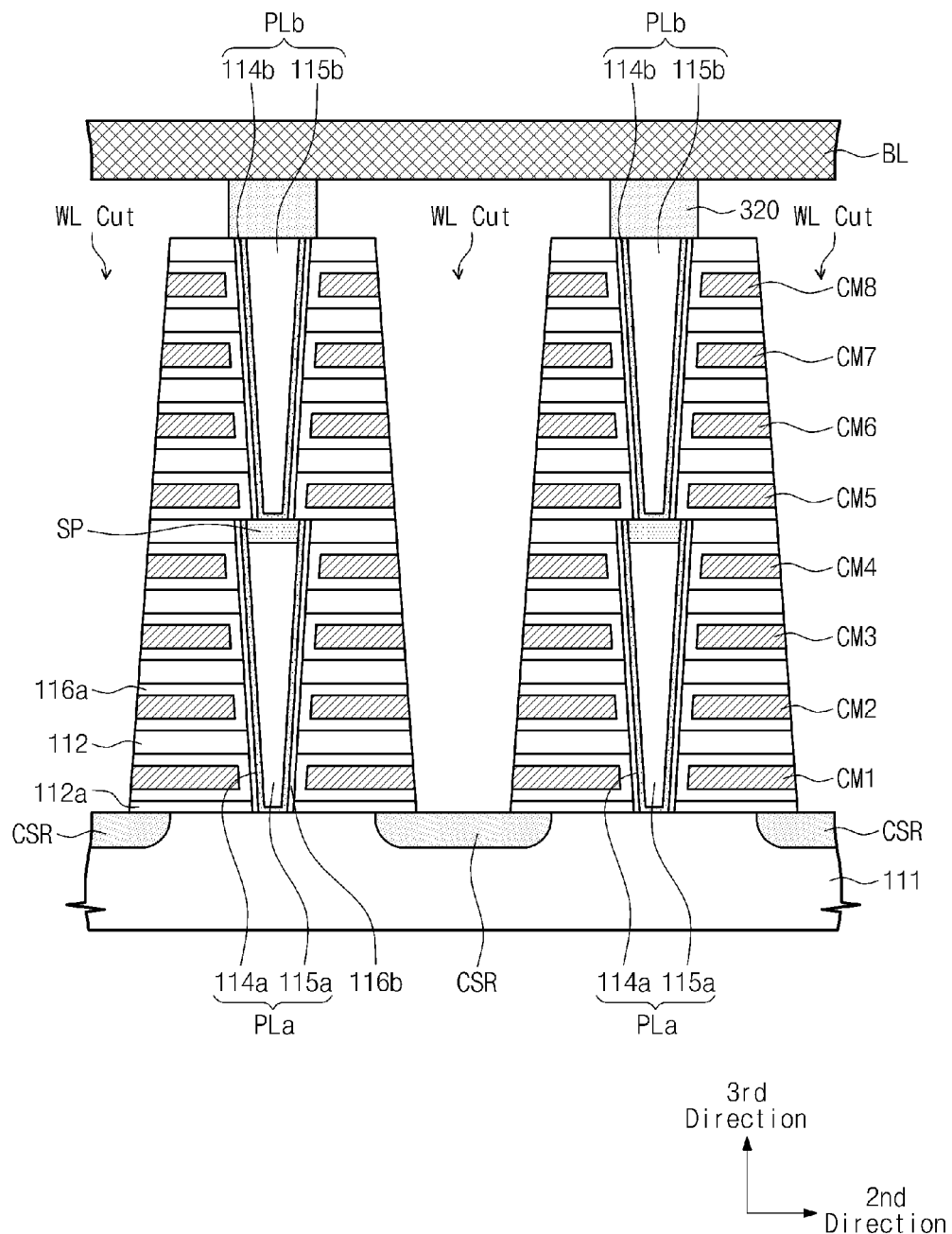
FIG. 42 is a cross-sectional view taken along a line IV-IV' in FIG. 3 according to still another embodiment.

FIG. 41 is a perspective view taken along a line IV-IV' in FIG. 3 according to still another embodiment. FIG. 42 is a cross-sectional view taken along a line IV-IV' in FIG. 3 according to still another embodiment. Referring to FIGS. 3, 41, and 42, lower pillars PLa and upper pillars PLb may be provided (refer to FIGS. 39 and 40). First information storage films 116a may be provided among conductive materials CM1 to CM8, insulation materials 112 and 112a, and pillars PLa and PLb, and second information storage films 116b may be provided on inner sides of the pillars PLa and PLb (refer to FIGS. 37 and 38).

An equivalent circuit of a memory block described with reference to FIGS. 3, 41, and 42 may be identical to one of the above-described equivalent circuits BLKa1 to BLKa7.

Figure 43:
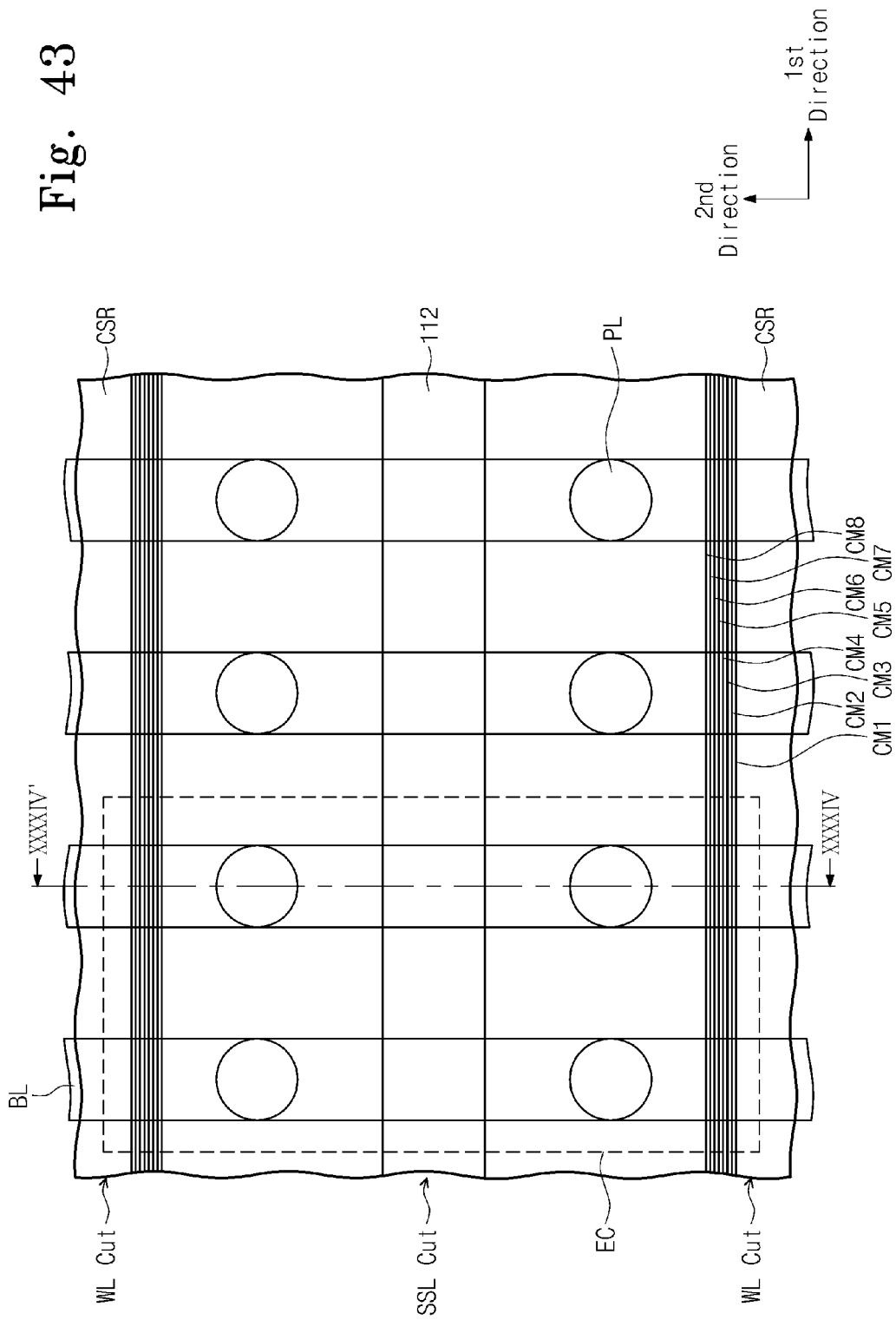
FIG. 43 is a top view illustrating one memory block in FIG. 2 according to another exemplary embodiment.
Figure 44:
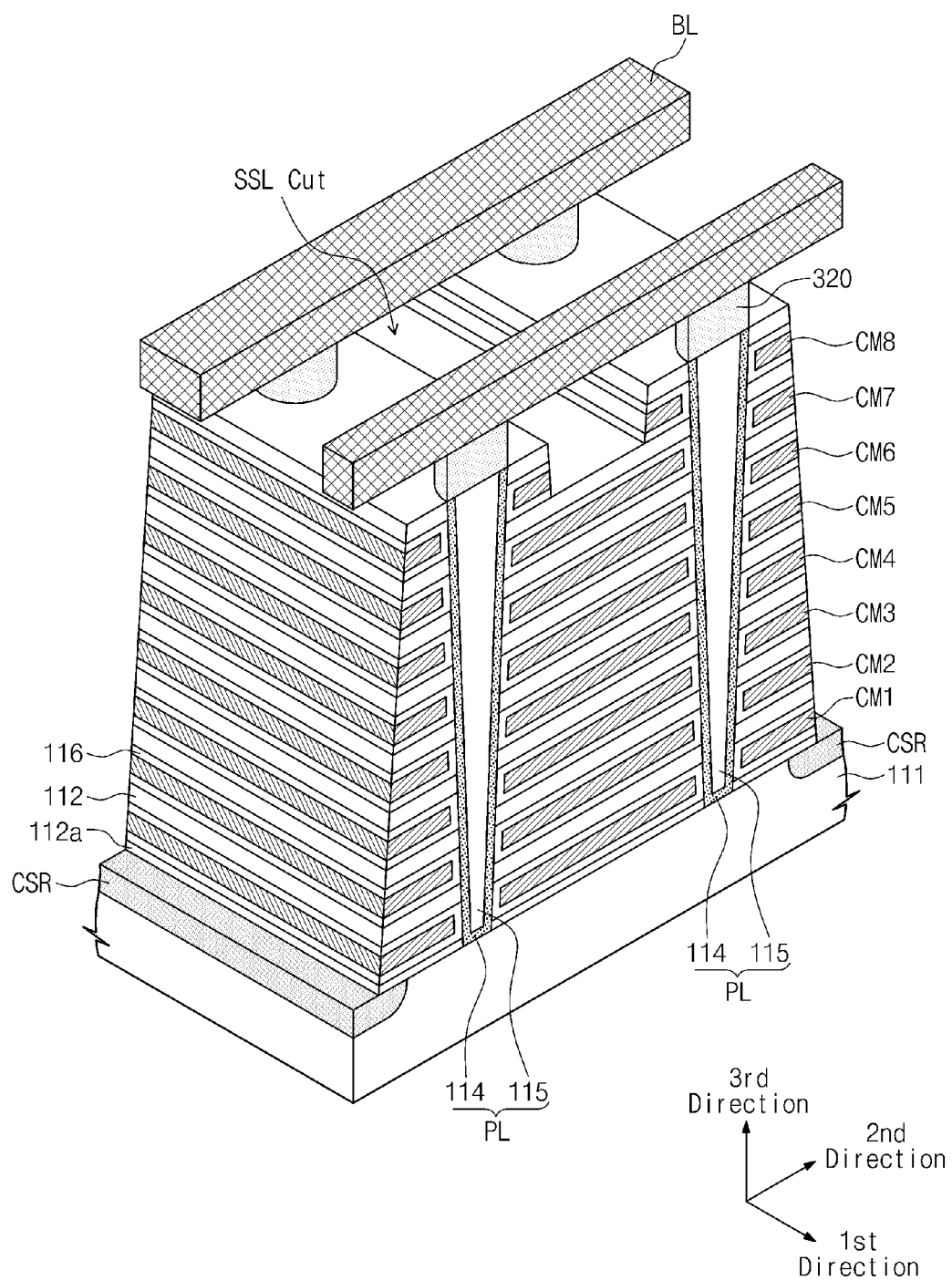
FIG. 44 is a perspective view taken along a line X X X X IV-X X X X IV' in FIG. 43.
Figure 45:
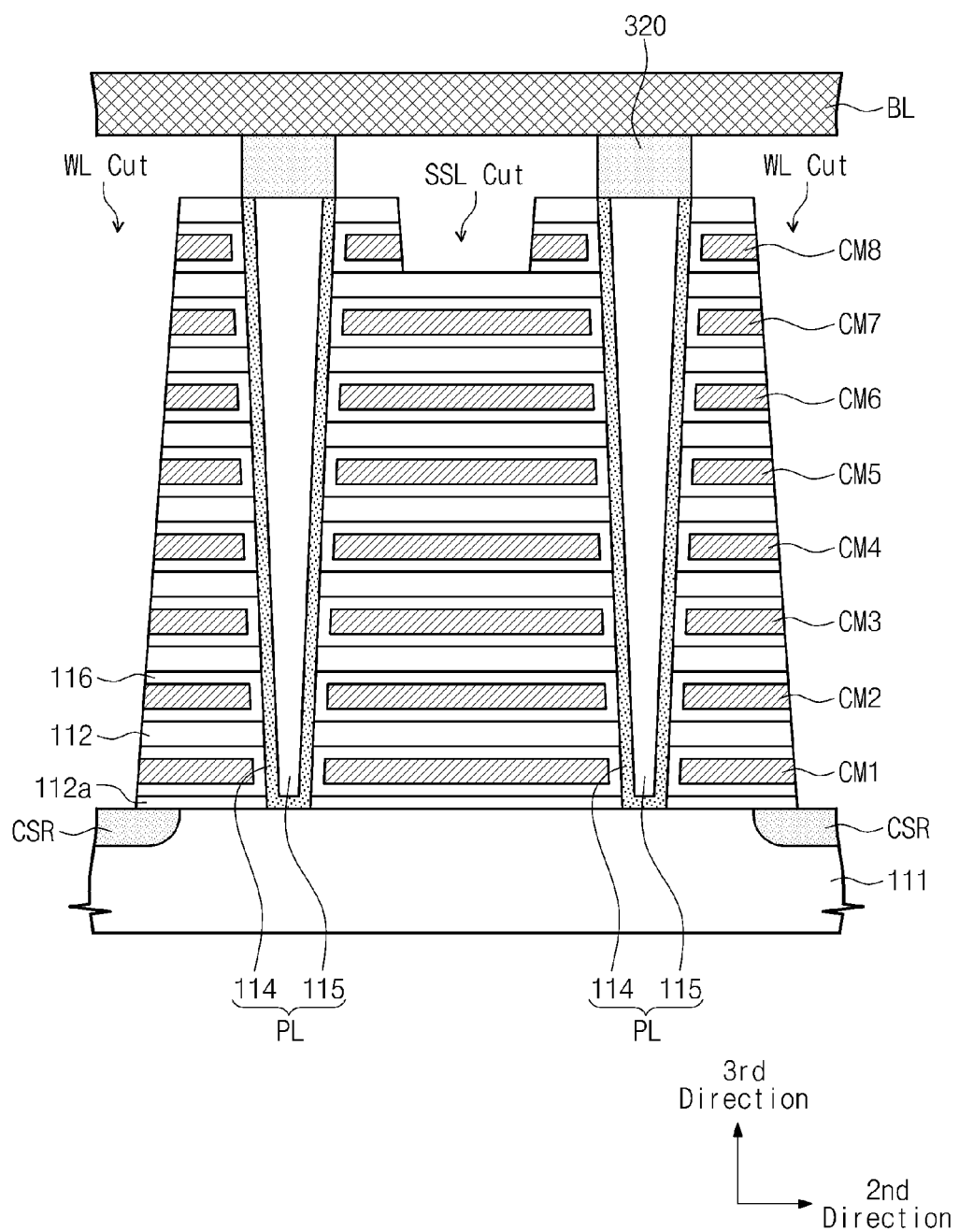
FIG. 45 is a cross-sectional view taken along a line X X X IV-X X X X IV' in FIG. 43.

FIG. 43 is a top view illustrating one memory block in FIG. 2 according to another exemplary embodiment. FIG. 44 is a perspective view taken along a line X X X X IV-X X X X IV' in FIG. 43. FIG. 45 is a cross-sectional view taken along a line X X X X IV-X X X X IV' in FIG. 43.

As compared with a memory block BLKa described with reference to FIGS. 3 to 6, a string selection line cut SSL Cut and a word line cut WL Cut extending along a first direction may be provided in turn in a second direction. The word line cut WL Cut may penetrate conductive materials CM1 to CM8 and insulation materials 112 and 112a to expose portions of common source regions CSR. The string selection line cut SSL Cut may penetrate one or more conductive materials (e.g., CM8) and insulation materials 112 thereon. The string selection line cut SSL Cut may separate an eighth conductive lines CM8 constituting string selection transistors SST. When conductive lines of two or more heights constitute string selection transistors SST, the string selection line cut SSL Cut may separate conductive materials of two or more heights.

A part EC of a top view of FIG. 43 may be identical to one of the above-described equivalent circuits BLKa1 to BLKa7.

In this embodiment, pillars PL can be formed of lower pillars and upper pillars as described in FIGS. 39 and 40.

In an embodiment, first information storage films 116a and second information storage films 116b may be provided as described with reference to FIGS. 37 and 38.

Figure 46:
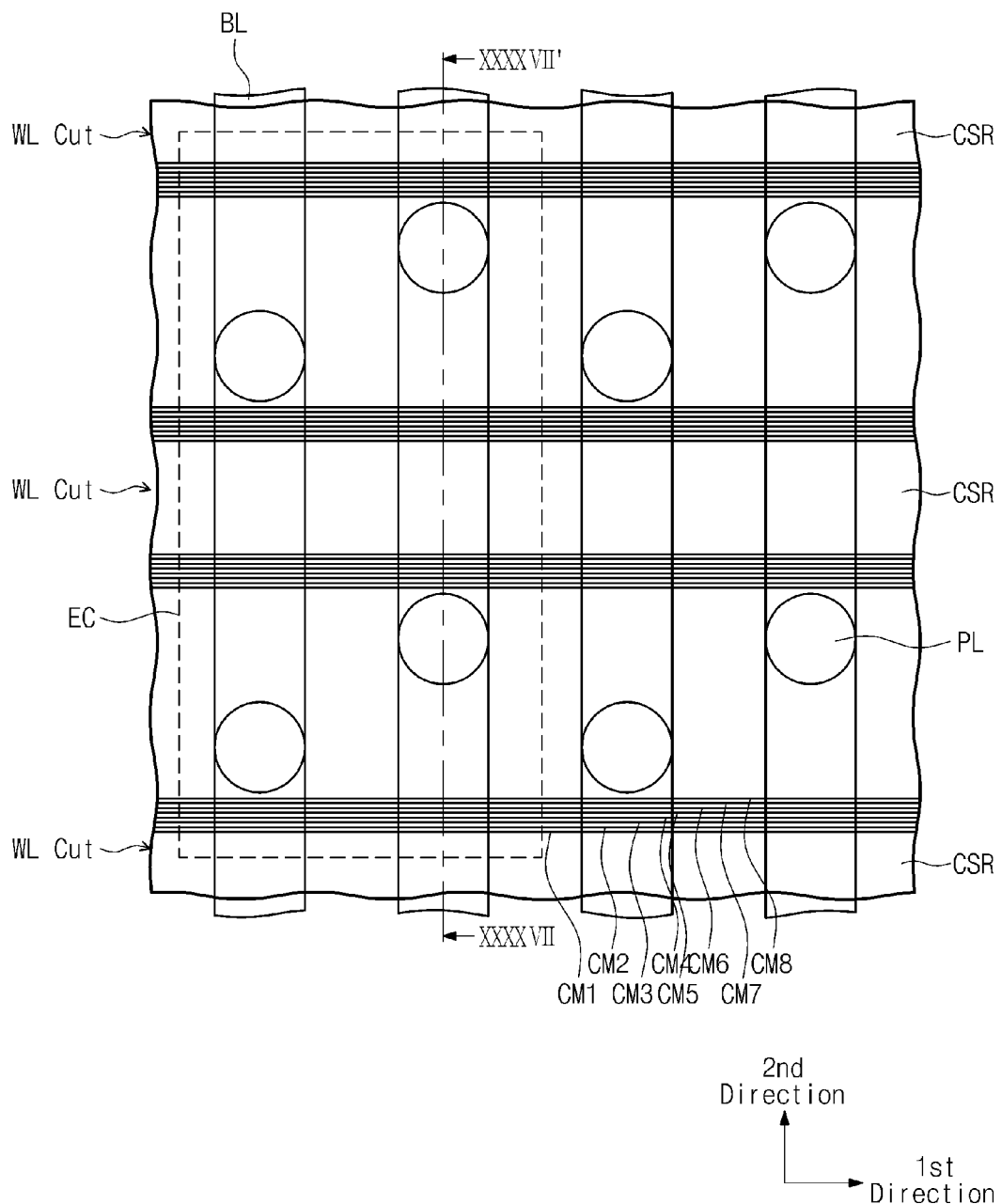
FIG. 46 is a top view illustrating a part of one memory block in FIG. 2 according to still another embodiment.
Figure 47:
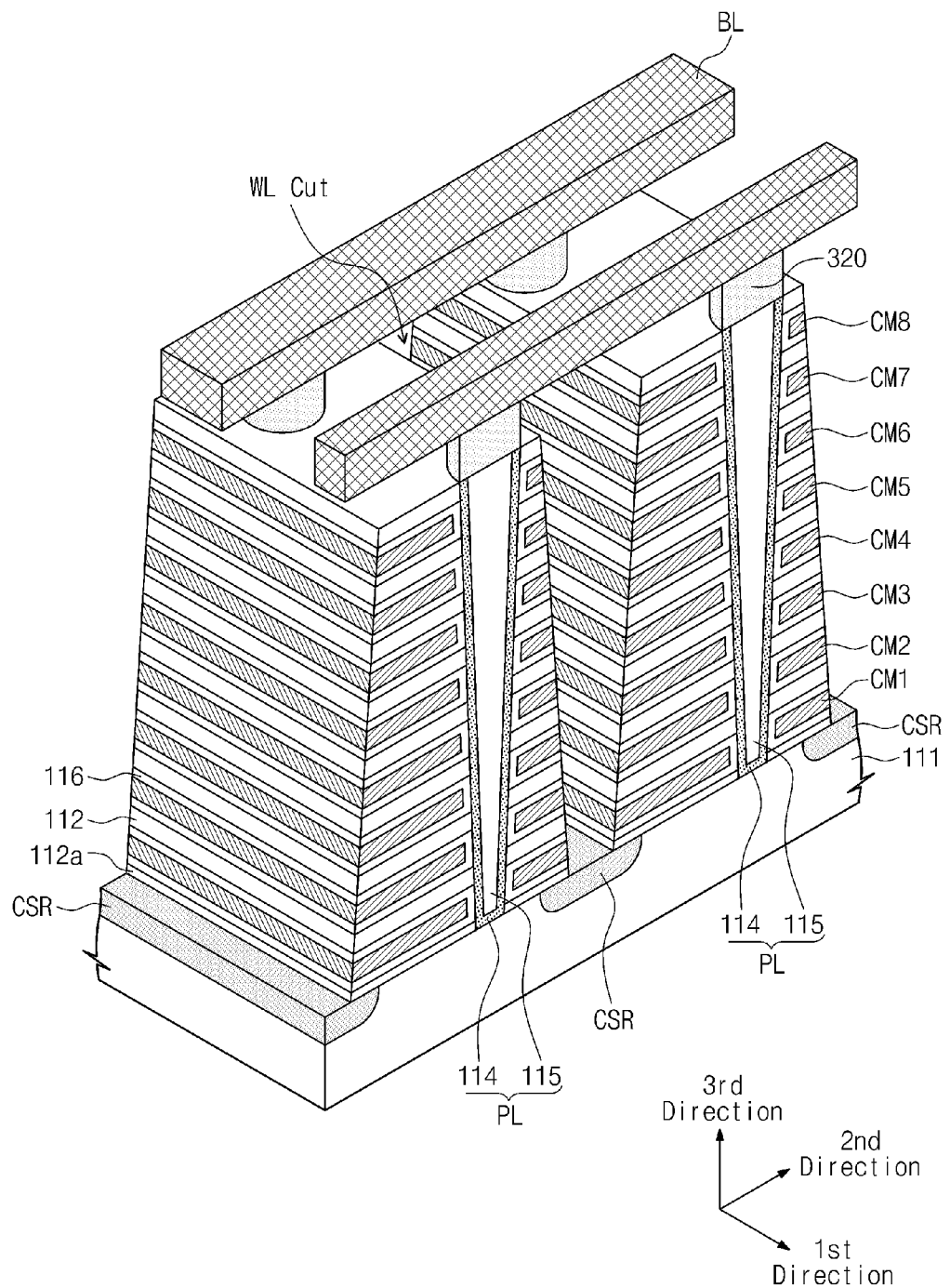
FIG. 47 is a perspective view taken along a line X X X X VII-X X X X VII' in FIG. 46.
Figure 48:
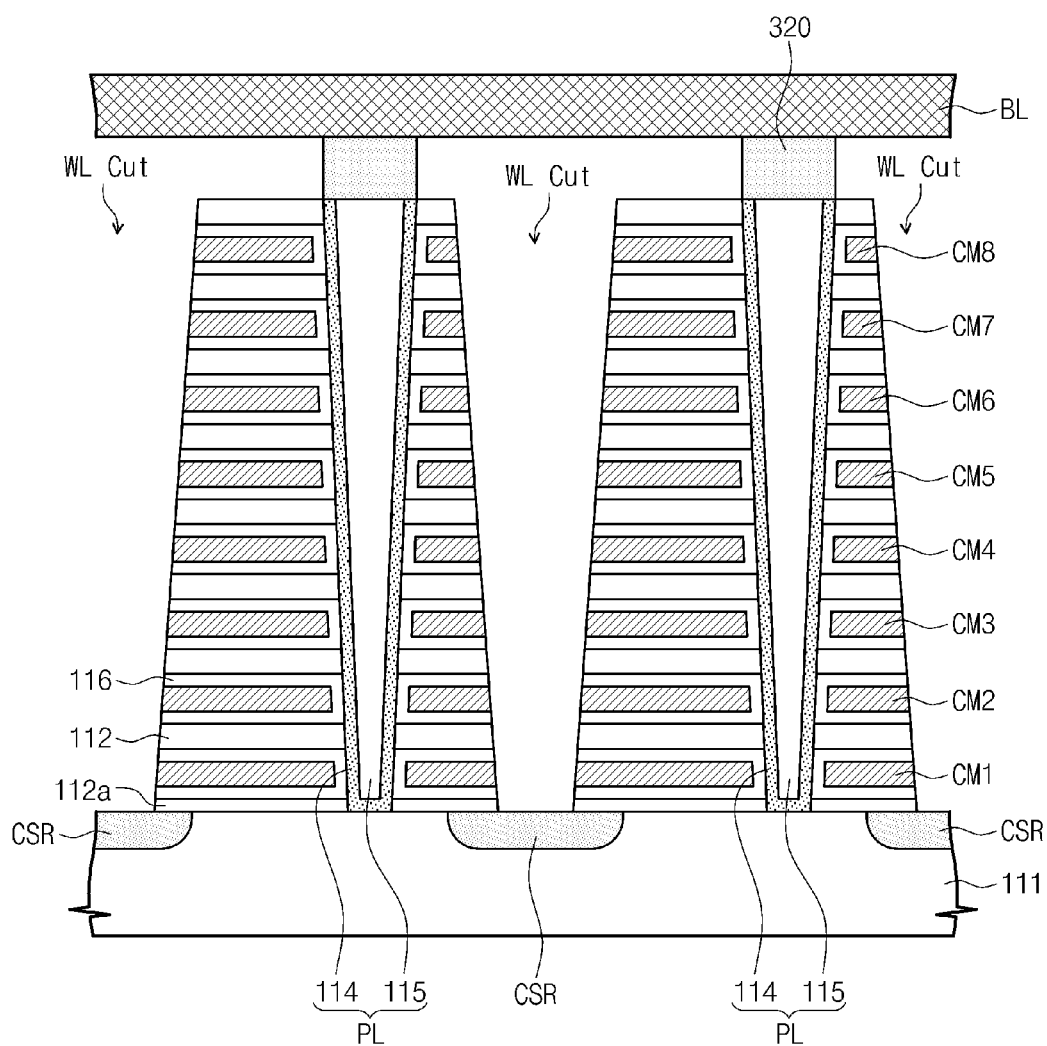
FIG. 48 is a cross-sectional view taken along a line X X X X VII-X X X X VII' in FIG. 46.

FIG. 46 is a top view illustrating a part of one memory block in FIG. 2 according to still another embodiment. FIG. 47 is a perspective view taken along a line X X X X VII-X X X X VII' in FIG. 46. FIG. 48 is a cross-sectional view taken along a line X X X X VII-X X X X VII' in FIG. 46.

As compared with a memory block BLKa described in FIGS. 3 to 6, pillars provided between adjacent common source regions may be disposed in a zigzag shape along a first direction.

As described in FIGS. 39 and 40, pillars PL may be formed of lower pillars and upper pillars. As described in FIGS. 37 to 38, first information storage films 116a and second information storage films 116b may be provided. As described with reference to FIGS. 43 to 45, a string selection line cut SSL Cut can be provided. One line of pillars disposed in a zigzag shape along the first direction can be provided between word line and string selection line cuts WL Cut and SSL Cut which are adjacent to each other.

A part EC of a top view in FIG. 46 may correspond to one of above-described equivalent circuits BLKa1 to BLKa7.

Figure 49:
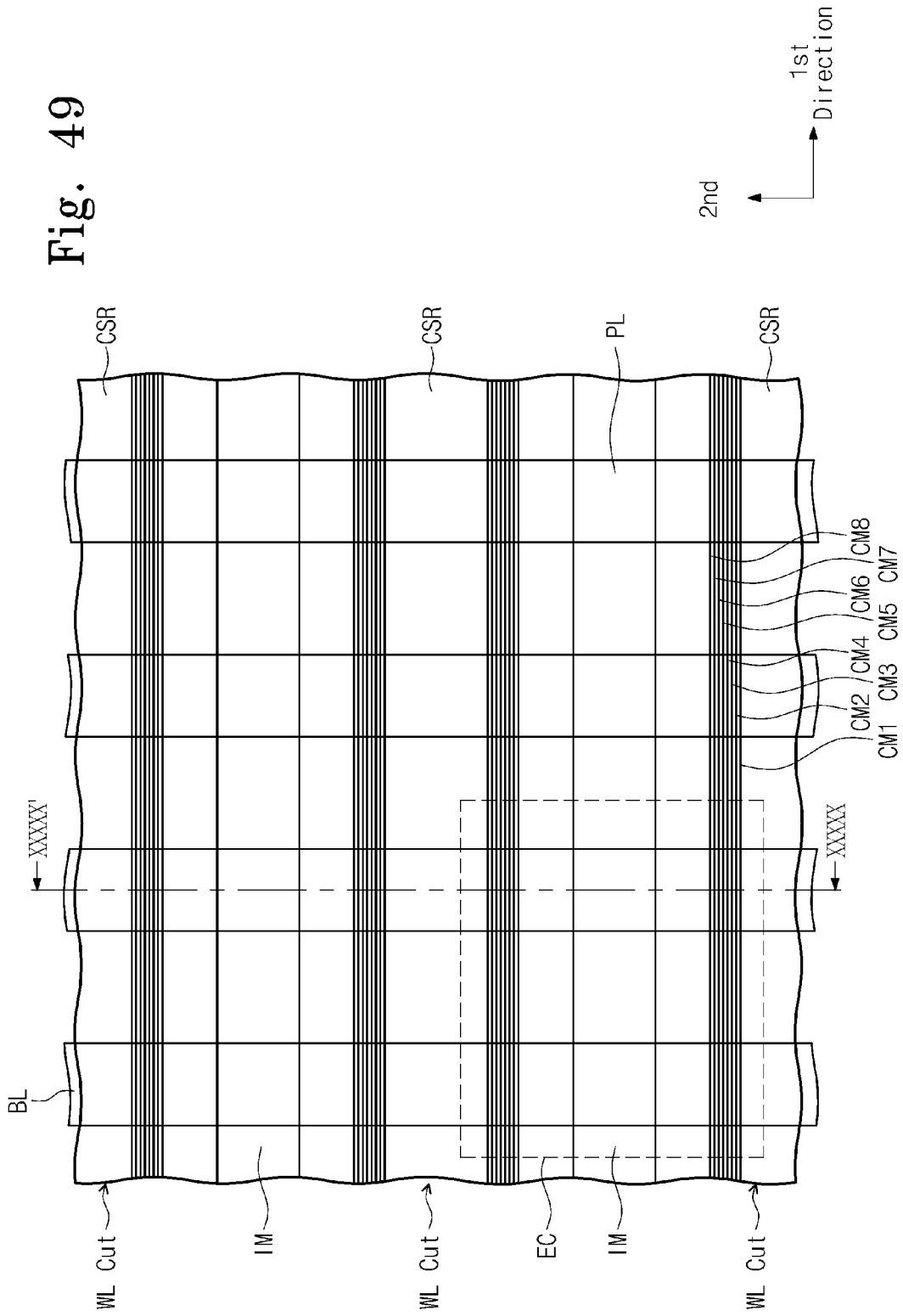
FIG. 49 is a top view illustrating a part of one memory block in FIG. 2 according to still another embodiment.
Figure 50:
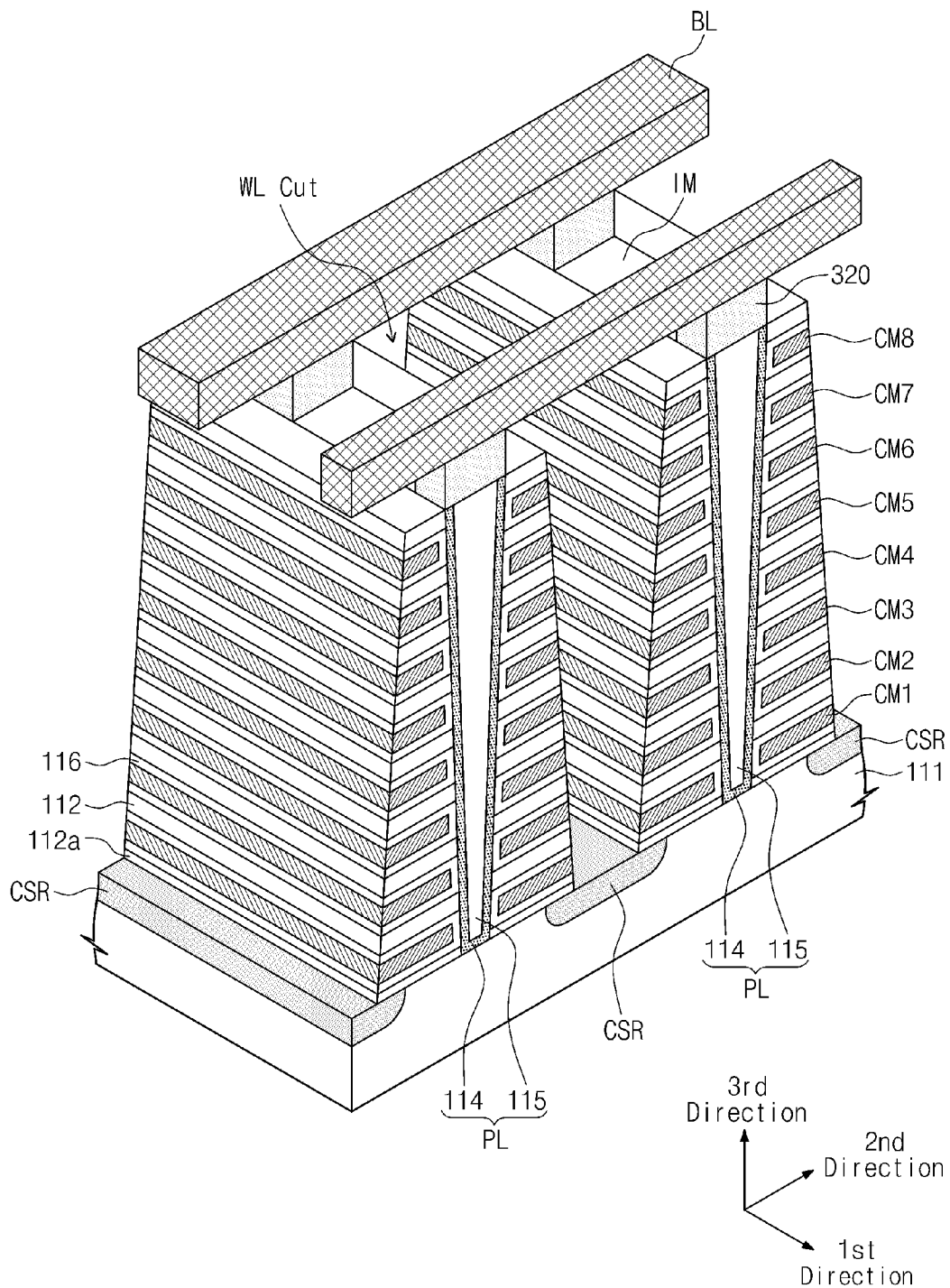
FIG. 50 is a perspective view taken along a line X X X X X-X X X X X' in FIG. 49.

FIG. 49 is a top view illustrating a part of one memory block in FIG. 2 according to still another embodiment. FIG. 50 is a perspective view taken along a line X X X X X-X X X X X' in FIG. 49. A cross-sectional view taken along a line X X X X X-X X X X X' in FIG. 49 may be identical to that in FIG. 5, and description thereof is thus omitted.

As compared with a memory block BLKa described in FIGS. 3 to 6, a memory block BLKd may include square pillars PL. Insulation materials IM may be provided between pillars PL. The pillars PL may be disposed in line along a first direction between adjacent common source regions CSR. The insulation materials IM may extend along the third direction so as to contact with a substrate 111.

Each of the pillars PL may include a channel film 114 and an inner material 115. Exemplarily, the channel film 114 may be provided on two sides, adjacent to conductive materials CM1 to CM8, from among four sides of a corresponding pillar, not surrounding the corresponding pillar.

A channel film on one side of each pillar may constitute a cell string together with conductive materials CM1 to CM8 and information storage films 116. A channel film on the other side of each pillar may constitute another cell string together with conductive materials CM1 to CM8 and information storage films 116. That is, one pillar may be used to form two cell strings.

In an embodiment, as described in FIGS. 39 and 40, pillars PL may be formed of lower pillars and upper pillars. As described in FIGS. 37 and 38, first information storage films 116a and second information storage films 116b may be provided. As described with reference to FIGS. 43 to 45, a string selection line cut SSL Cut can be provided. One line of pillars PL disposed in a zigzag shape along a first direction can be provided between a word line cut WL Cut and a string selection line cut SSL Cut that are disposed to be adjacent.

A part EC of a top view in FIG. 49 may correspond to one of above-described equivalent circuits BLKa1 to BLKa7.

Figure 52:
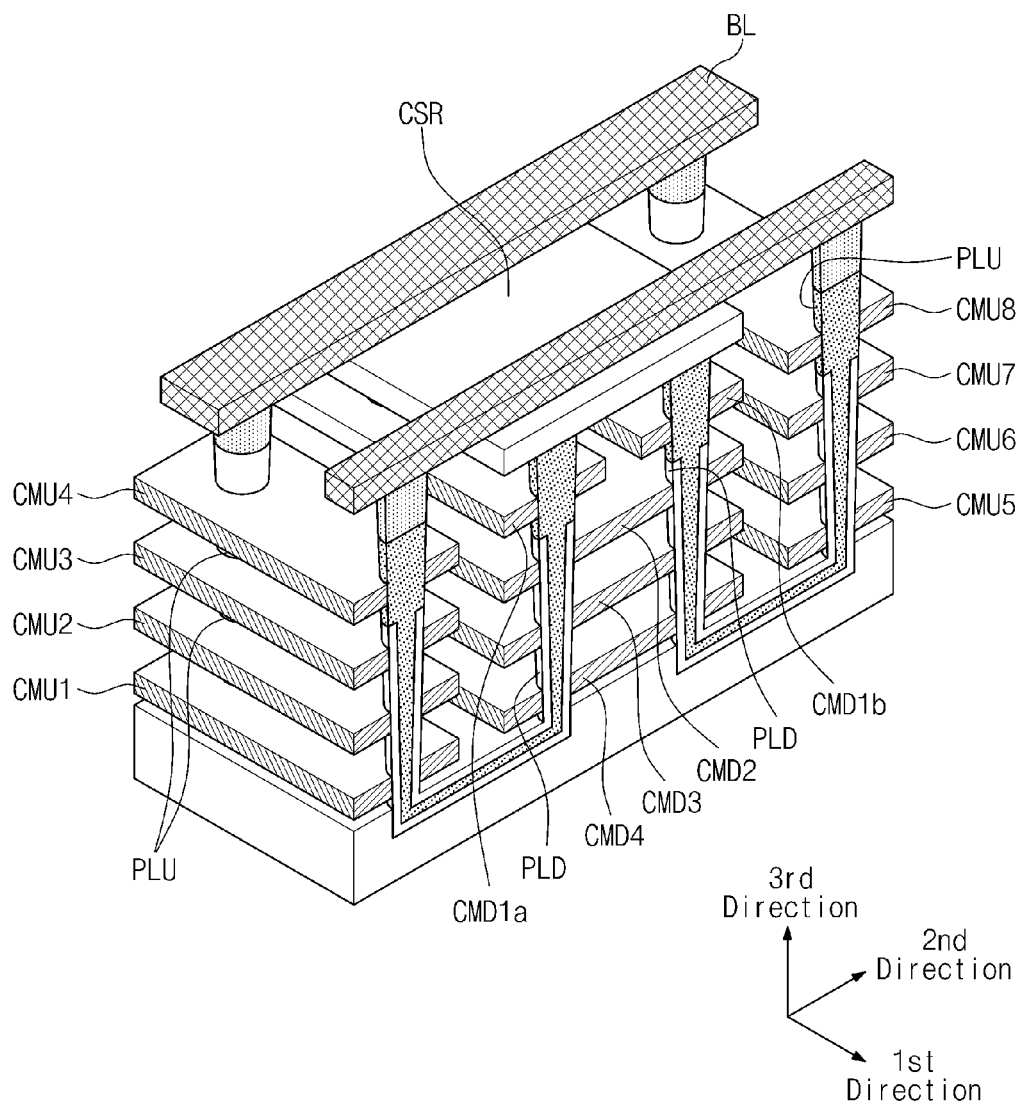
FIG. 52 is a perspective view taken along a line X X X X X II-X X X X X II' in FIG. 51.
Figure 53:
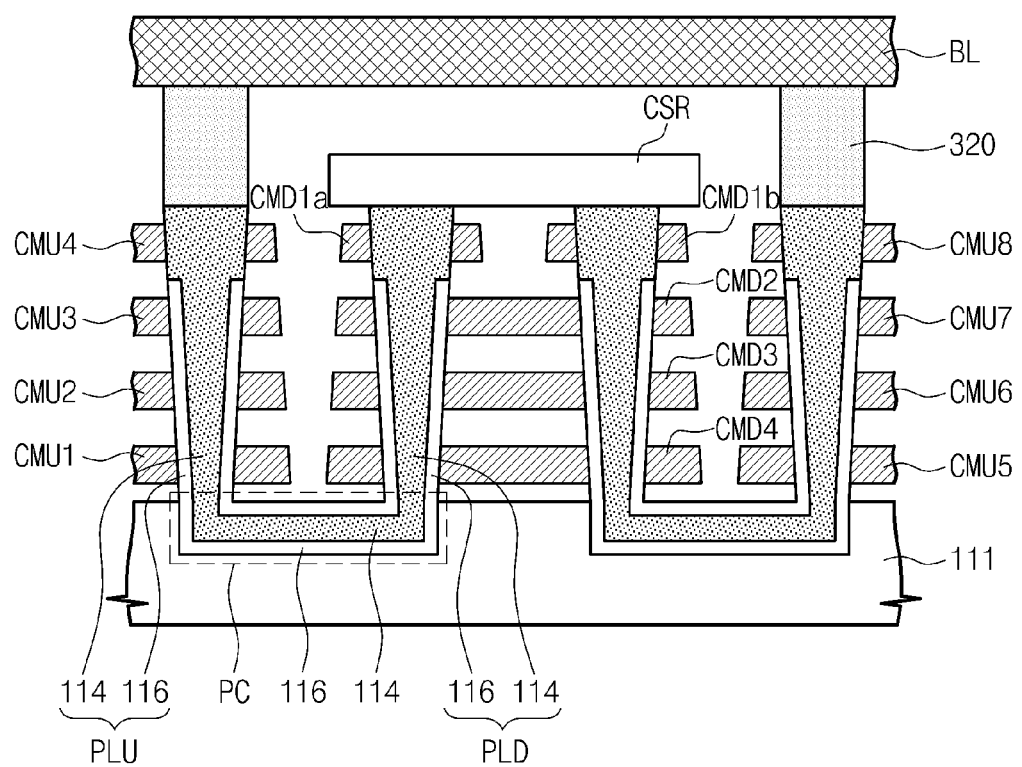
FIG. 53 is a cross-sectional view taken along a line X X X X X II-X X X X X II' in FIG. 51.

FIG. 51 is a top view illustrating a part of one memory block in FIG. 2 according to still another embodiment. FIG. 52 is a perspective view taken along a line X X X X Xi II-X X X X X II' in FIG. 51. FIG. 53 is a cross-sectional view taken along a line X X X X X II-X X X X X II' in FIG. 51.

Referring to FIGS. 51 to 53, first to eight upper conductive materials CMU1 to CMU8 extending along a first direction may be provided on a substrate 111. The first to fourth upper conductive materials CMU1 to CMU4 may be stacked in a direction perpendicular to the substrate 111 and spaced apart from one another in a direction perpendicular to the substrate 111. The fifth to eighth upper conductive materials CMU5 to CMU8 may be stacked in a direction perpendicular to the substrate 111 and spaced apart from one another in a direction perpendicular to the substrate 111. A group of the first to fourth upper conductive materials CMU1 to CMU4 may be spaced apart from a group of the fifth to eighth upper conductive materials CMU5 to CMU8 along a second direction.

Lower conductive materials CMD1a, CMD1b, and CMD2 to CMD4 extending along the first direction may be provided between the first to fourth upper conductive materials CMU1 to CMU4 and the fifth to eighth upper conductive materials CMU5 to CMU8. The lower conductive materials CMD2 to CMD4 may be stacked in a direction perpendicular to the substrate 111 and spaced apart from one another in a direction perpendicular to the substrate 111. The lower conductive materials CMD1a and CMD1b may be provided on the lower conductive material CMD2. The lower conductive materials CMD1a and CMD1b may be spaced apart along the second direction.

A plurality of upper pillars PLU may be configured to penetrate the first to fourth upper conductive materials CMU1 to CMU4 or the fifth to eighth upper conductive materials CMU5 to CMU8 in a direction perpendicular to the substrate 111. The upper pillars PLU may contact with the substrate 111. In the first upper conductive materials CMU1, upper pillars may be disposed in line along the first direction and spaced apart along the first direction. In the eighth upper conductive materials CMU8, upper pillars may be disposed in line along the first direction and spaced apart along the first direction.

Each of the upper pillars PLU may include an information storage film 116 and a channel film 114. The information storage film 116 may store information by trapping or discharging charges. The information storage film 116 may include a tunneling insulation film, a charge trap film, and a blocking insulation film.

The channel films 114 may act as vertical bodies of the upper pillars PLU. The channel films 114 may include an intrinsic semiconductor, respectively. The channel films 114 may include semiconductor having the same conductivity type (e.g., p-type) as the substrate 111.

A plurality of lower pillars PLD may be formed. The plurality of lower pillars PLD may penetrate the lower conductive materials CMD2 to CMD4 and the lower conductive material CMD1a or CMD1b in a direction perpendicular to the substrate 111 so as to contact with the substrate 111. In the lower conductive materials CMD 1a, lower pillars may be disposed in line along the first direction and spaced apart along the first direction. In the lower conductive materials CMD1b, lower pillars may be disposed in line along the first direction and spaced apart along the first direction.

Each of the lower pillars PLD may include an information storage film 116 and a channel film 114. The information storage film 116 may store information by trapping or discharging charges. The information storage film 116 may include a tunneling insulation film, a charge trap film, and a blocking insulation film.

The channel films 114 may act as vertical bodies of the lower pillars PLD. The channel films 114 may include an intrinsic semiconductor, respectively. The channel films 114 may include semiconductor having the same conductivity type (e.g., p-type) as the substrate 111.

A plurality of pipeline contacts PC may be provided at the substrate 111. The pipeline contacts PC may extend in a bit line direction so as to connect lower surfaces of upper pillars PLU formed at the first upper conductive material CMU1 with lower surfaces of lower pillars PLD formed at the lower conductive material CMD1a. The pipeline contacts PC may extend in a bit line direction so as to connect lower surfaces of upper pillars PLU formed at the eighth upper conductive material CMU8 with lower surfaces of lower pillars PLD formed at the lower conductive material CMD1b.

In this embodiment, each of the pipeline contacts PC may include a channel film 114 and an information storage film 116. The channel films 114 of the pipeline contacts PC may interconnect the channel films 114 of the upper pillars PLU and channel films of the lower pillars PLD. The information storage films 116 of the pipeline contacts PC may interconnect the information storage films 116 of the upper pillars PLU and the information storage films 116 of the lower pillars PLD.

A common source region CSR extending along the first direction may be provided on the lower pillars PLD. The common source region CSR may extend along the first direction so as to be connected with the plurality of lower pillars PLD. The common source region CSR may form a common source line CSL. The common source region CSR may include a metallic material. The common source region CSR may have a conductivity type different from the substrate 111.

Drains 320 may be provided on the upper pillars PLU. The drains 320 may include a semiconductor material having a conductivity type (e.g., n-type) different from the substrate 111. Bit lines BL may be formed on the drains 320. The bit lines BL may be spaced apart along the first direction. The bit lines BL may extend along the second direction so as to be connected with the drains 320.

In this embodiment, the bit lines BL and the drains 320 can be connected via contact plugs, and the common source region CSR and the lower pillars PLD can be connected via contact plugs.

One cell string may be formed of a lower pillar and an upper pillar connected to each other via one pipeline contact.

In an exemplary embodiment, as described in FIGS. 43 to 45, the upper pillars PLU and the lower pillars PLD can be disposed in a zigzag shape along the first direction.

A part EC of a top view in FIG. 51 may correspond to one of above-described equivalent circuits BLKa1 to BLKa7.

Figure 54:
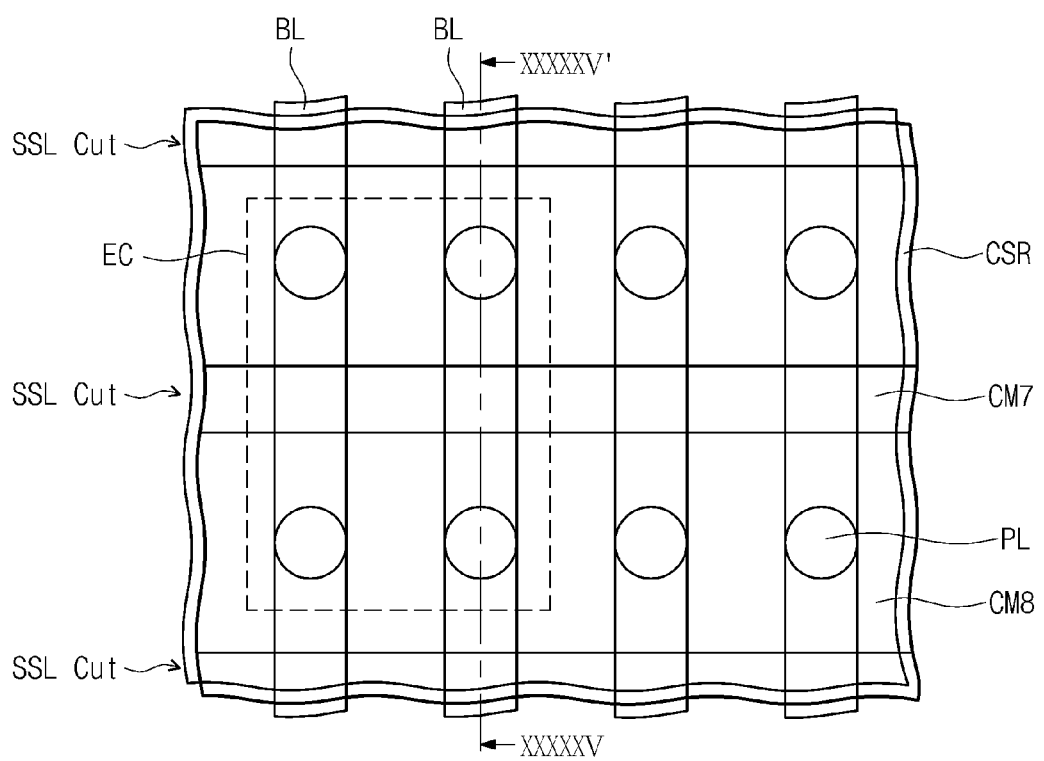
FIG. 54 is a plane view illustrating a part of one memory block in FIG. 2 according to still another embodiment.
Figure 55:
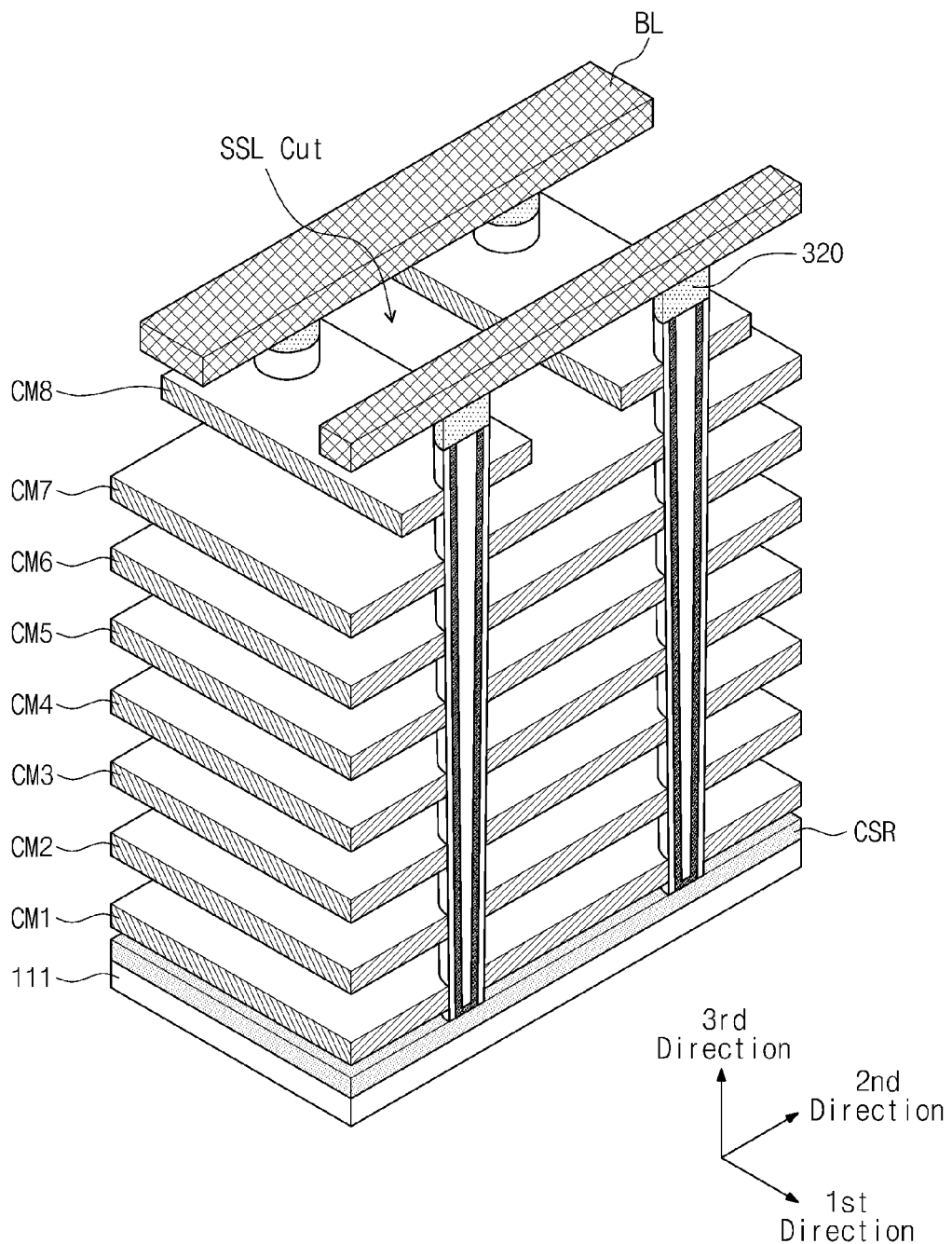
FIG. 55 is a perspective view taken along a line X X X X X V-X X X X X V' in FIG. 54.
Figure 56:
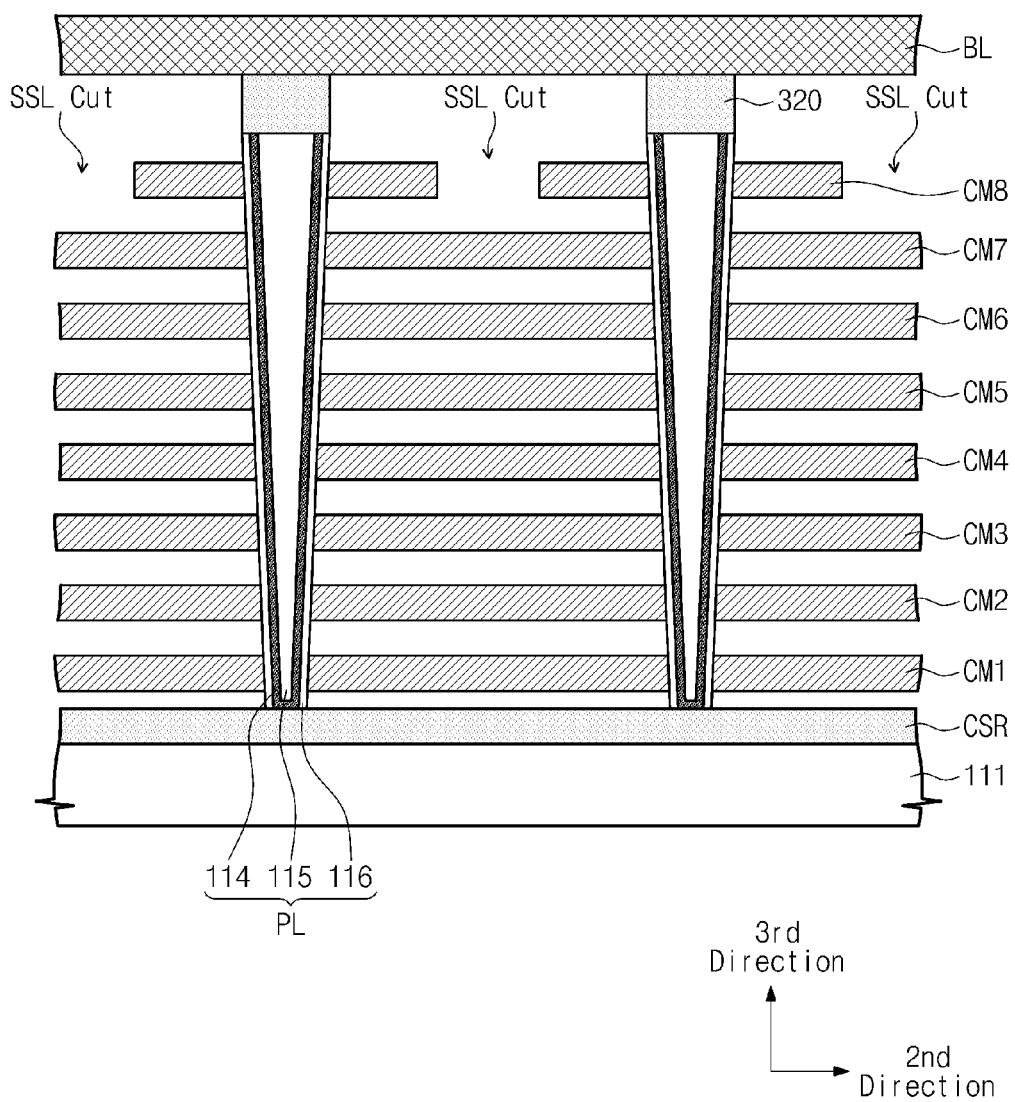
FIG. 56 is a cross-sectional view taken along a line X X X X X V-X X X X X V' in FIG. 54.

FIG. 54 is a plane view illustrating a part of one memory block in FIG. 2 according to still another embodiment. FIG. 55 is a perspective view taken along a line X X X X X V-X X X X X V' in FIG. 54. FIG. 56 is a cross-sectional view taken along a line X X X X X V-X X X X X V' in FIG. 54.

Referring to FIGS. 54 to 56, a common source region CSR may be formed at a substrate 111. The common source region CSR may be formed of one doping region, for example. The common source region CSR may constitute a common source line CSL.

First to eighth conductive materials CM1 to CM8 may be formed on the common source region CSR. The first to eighth conductive materials CM1 to CM8 may be stacked in a direction perpendicular to the substrate 111 and spaced apart in a direction perpendicular to the substrate 111. Among the first to eighth conductive materials CM1 to CM8, conductive materials constituting string selection transistors SST may be separated by string selection line cuts SSL Cut. The string selection line cuts SSL Cut may extend along a first direction and spaced apart along a second direction. Remaining conductive materials (not used for the string selection transistors) may be formed on the common source region CSR to have a plate shape extending along the first and second directions. 1

For example, the first to seventh conductive lines CM1 to CM7 may have a plate shape, and the eighth conductive materials CM8 may be separated by the string selection line cuts SSL Cut. The eighth conductive materials CM8 may extend along the first direction and spaced apart along the second direction.

A plurality of pillars PL may be provided to penetrate the first to eighth conductive materials CM1 to CM8 in a direction perpendicular to the substrate 111 and to contact with the substrate 111. In one of the eighth conductive materials CM8, pillars PL may be provided in line along the first direction. Each of the pillars PL may include an information storage film 116, a channel film 114, and an inner material 115.

The information storage films 116 may store information by trapping or discharging charges. The information storage films 116 may include a tunneling insulation film, a charge trap film, and a blocking insulation film. The channel films 114 may act as vertical bodies of the pillars PL. The channel films 114 may include intrinsic semiconductor. The channel films 114 may include a semiconductor material having the same type (e.g., p-type) as the substrate 111. The inner materials 115 may include an insulation material or air gap.

In an embodiment, as described in FIGS. 39 and 40, pillars PL may be formed of upper pillars and lower pillars. As described in FIGS. 43 to 45, pillars PL may be disposed in a zigzag shape along the first direction.

Figure 57:
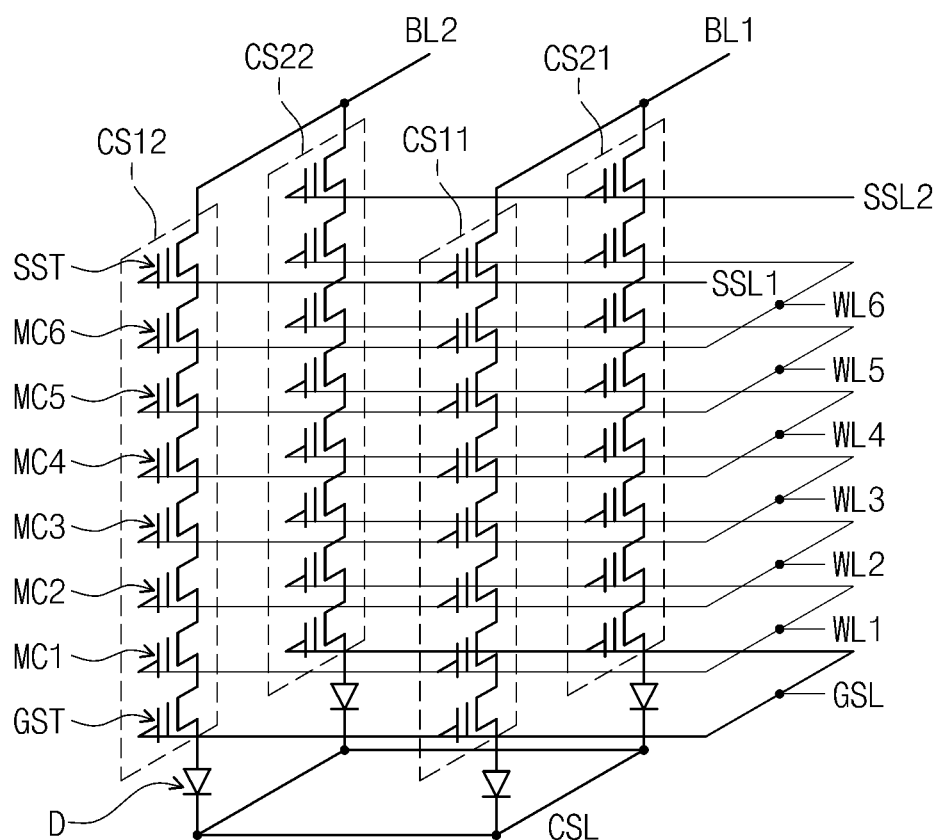
FIG. 57 is a circuit diagram illustrating an equivalent circuit of a part EC of a top view in FIG. 54 according to an embodiment.

FIG. 57 is a circuit diagram illustrating an equivalent circuit of a part EC of a top view in FIG. 54 according to an embodiment. Referring to FIGS. 54 to 57, a common source region CSR may be formed between pillars PL and a substrate 111.

Channels films 114 may be p-type, and the common source region CSR may be n-type. A portion, corresponding to ground selection transistors GST, from among the channel films 114 may be p-type, and the common source region CSR may be n-type. That is, the channel film 114 and the common source region CSR may form a PN junction. Accordingly, diodes D may be formed between cell strings CS11, CS12, CS21, and CS22 formed of pillars PL and a common source line formed of the common source region CSR. An equivalent circuit BLKf1 in FIG. 57 may be identical to that in FIG. 7 except that the diodes D are provided therein.

The equivalent circuit BLKf1 may be applied like the above-described equivalent circuits BLKa2 to BLKa7.

Figure 58:
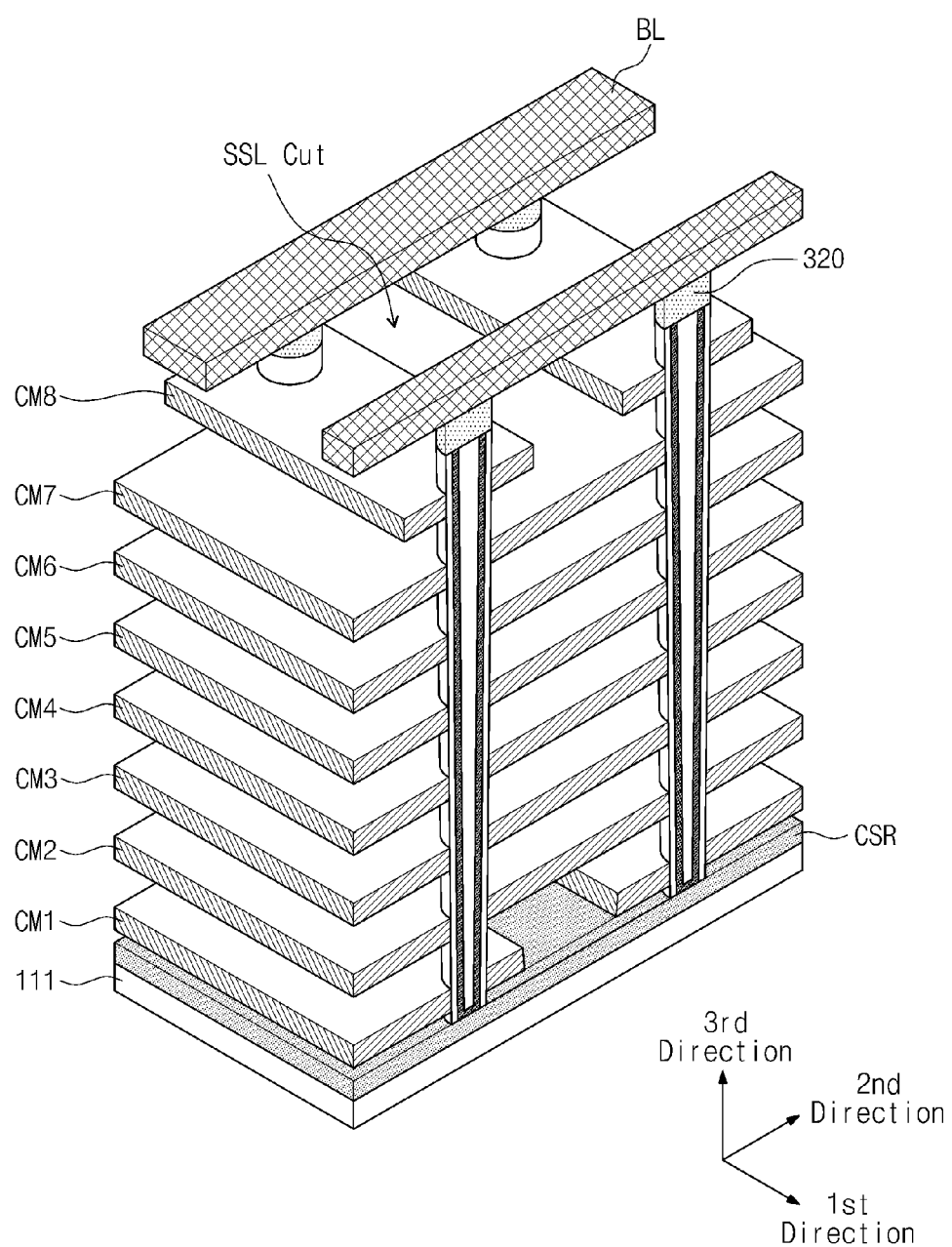
FIG. 58 is a perspective view taken along a line X X X X X V-X X X X X V' in FIG. 54.
Figure 59:
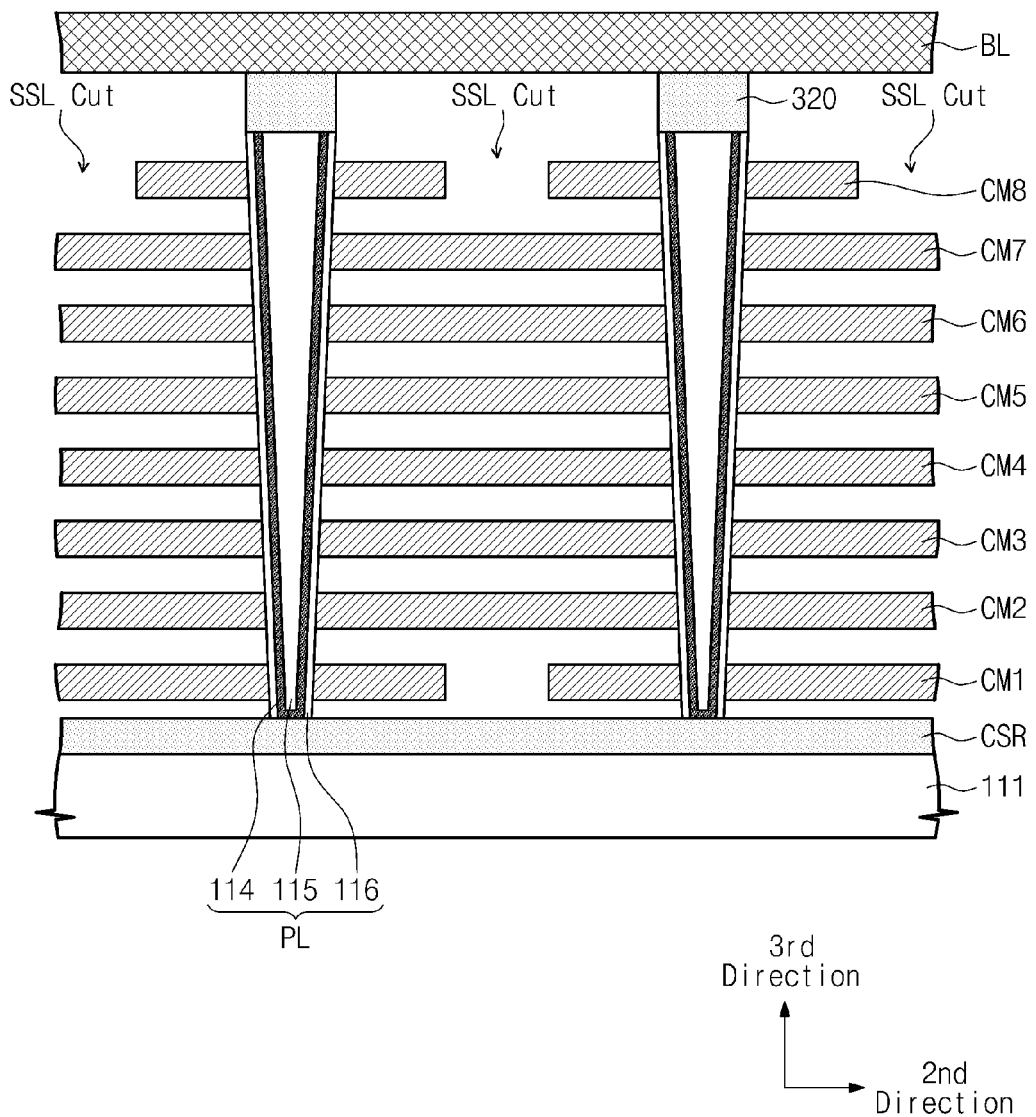
FIG. 59 is a cross-sectional view taken along a line X X X X X V-X X X X X V' in FIG. 54.

FIG. 58 is a perspective view taken along a line X X X X X V-X X X X X V' in FIG. 54. FIG. 59 is a cross-sectional view taken along a line X X X X X V-X X X X X V' in FIG. 54.

Referring to FIGS. 54, 58, and 59, conductive materials, constituting ground selection transistors GST, from among first to eighth conductive materials CM1 to CM8 may extend along a first direction and spaced apart along a second direction. The conductive materials constituting ground selection transistors GST may have the same structure as conductive materials constituting string selection transistors SST. For example, the first conductive materials CM1 may have the same structure as the eighth conductive materials CM8.

In an embodiment, as described in FIGS. 39 and 40, pillars PL may be formed of upper pillars and lower pillars. As described in FIGS. 43 to 45, pillars PL may be disposed in a zigzag shape along the first direction.

Figure 60:
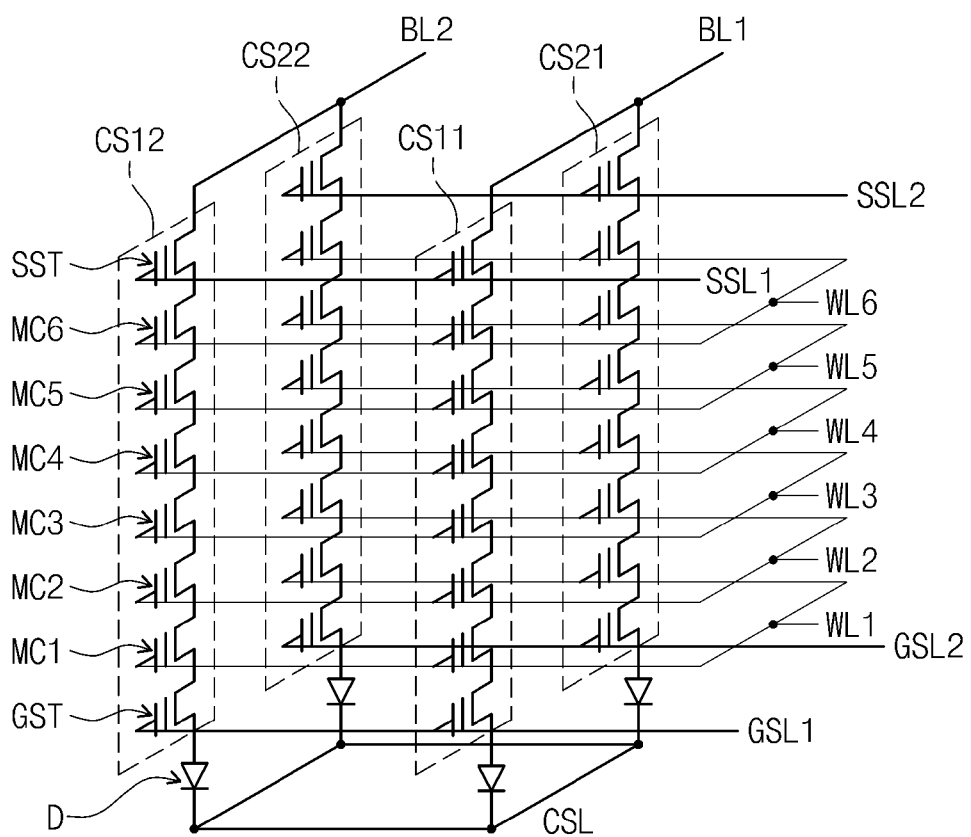
FIG. 60 is a circuit diagram illustrating an equivalent circuit of a part EC of a top view in FIG. 54 according to another embodiment.

FIG. 60 is a circuit diagram illustrating an equivalent circuit of a part EC of a top view in FIG. 54 according to another embodiment.

Referring to FIGS. 54 and 58 to 60, diodes D may be formed between cell strings CS11, CS12, CS21, and CS22 and a common source line CSL. Ground selection transistors GST may be connected with a plurality of ground selection lines GSL1 and GSL2. For example, ground selection transistors of the cell strings CS11 and CS12 may be connected with a first ground selection line GSL1, and ground selection transistors of the cell strings CS21 and CS22 may be connected with a second ground selection line GSL2.

The equivalent circuit BLKf2 may be applied like the above-described equivalent circuits BLKa2 to BLKa7.

Figure 61:
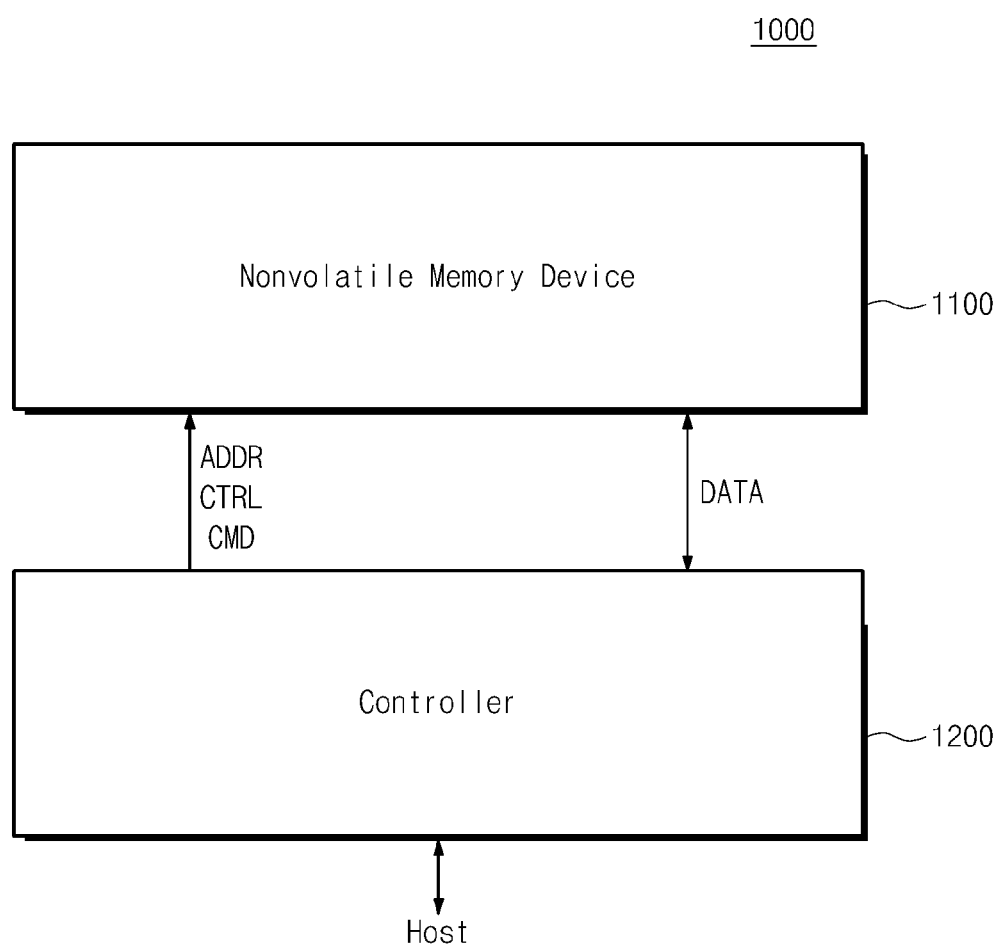
FIG. 61 is a block diagram illustrating a memory system according to an embodiment.

FIG. 61 is a block diagram illustrating a memory system according to an embodiment. Referring to FIG. 61, a memory system 1000 may include a nonvolatile memory device 1100 and a controller 1200.

The nonvolatile memory device 1100 may be substantially identical to that of one of nonvolatile memory devices 100 to 500 according to embodiments. That is, the nonvolatile memory device 1100 may include a plurality of cell strings CS11, CS12, CS21, and CS22 provided on a substrate 111 each of which includes a plurality of cell transistors CT stacked in a direction perpendicular to the substrate 111. The nonvolatile memory device 1100 may make a program operation according to the above-described program method. The nonvolatile memory device 1100 may perform a state read operation to perform a program operation in view of charge rearrangement according to a state read result.

The controller 1200 may be connected with a host and the nonvolatile memory device 1100. In response to a request from the host, the controller 1200 may be configured to access the nonvolatile memory device 1100. For example, the controller 1200 may be configured to control a read operation, a write operation, an erase operation, a state read operation, a program operation considering rearrangement, and a background operation of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may be configured to provide the nonvolatile memory device 1100 with a control signal CTRL, a command CMD, and an address ADDR. In response to the control signal CTRL, the command CMD, and the address ADDR provided from the controller 1200, the nonvolatile memory device 1100 may perform a read operation, a write operation, a state read operation, an erase operation, and a program operation considering charge rearrangement.

In an embodiment, the controller 1200 may further include constituent elements such as a processing unit, a host interface, and a memory interface. The processing unit may control an overall operation of the controller 1200.

The host interface may include the protocol for executing data exchange between the host and the controller 1200. Exemplarily, the host interface may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory device 1100. The memory interface may include a NAND interface or a NOR interface.

The memory system 1000 may be used as computer, portable computer, Ultra Mobile PC (UMPC), workstation, netbook, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

A nonvolatile memory device 1100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 62:
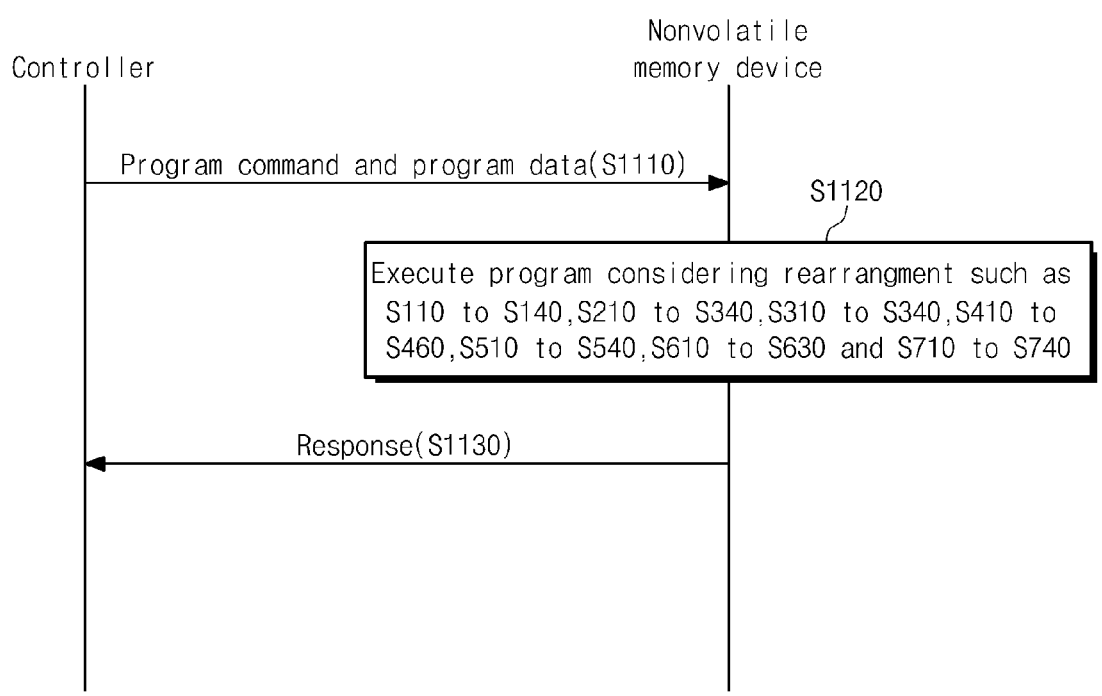
FIG. 62 is a flowchart for describing a program method of a memory system according to an embodiment.

FIG. 62 is a flowchart for describing a program method of a memory system according to an embodiment. Referring to FIGS. 61 and 62, in operation S1110, a controller 1200 may send a program command and program data to a nonvolatile memory device 1100. At this time, there may be sent address of memory cells in which the program data is to be stored.

In operation S1120, the nonvolatile memory device 1100 may perform a program operation according to one of program methods according to embodiments. For example, the nonvolatile memory device 1100 may perform a state read operation and may carry out a program operation according to a state read result. The nonvolatile memory device 1100 may perform a state read operation when program data is MSB data, and may execute a program operation according to a state read result. The nonvolatile memory device 1100 may perform a state read operation when program data is fine program data, and may execute a program operation according to a state read result. The nonvolatile memory device 1100 may store a state read result in a supplemental area, and may use the stored state read result in case of need. The nonvolatile memory device 1100 may read and use a state read result from a test data region if necessary. The nonvolatile memory device 1100 may detect (or, predict) a rearrangement characteristic according to previously programmed data and program data to perform a program operation according to a detected (or, predicted) result. The nonvolatile memory device 1100 may detect (or, predict) a rearrangement characteristic according to previously programmed data, program data, and data to be programmed next to perform a program operation according to a detected (or, predicted) result.

Figure 63:
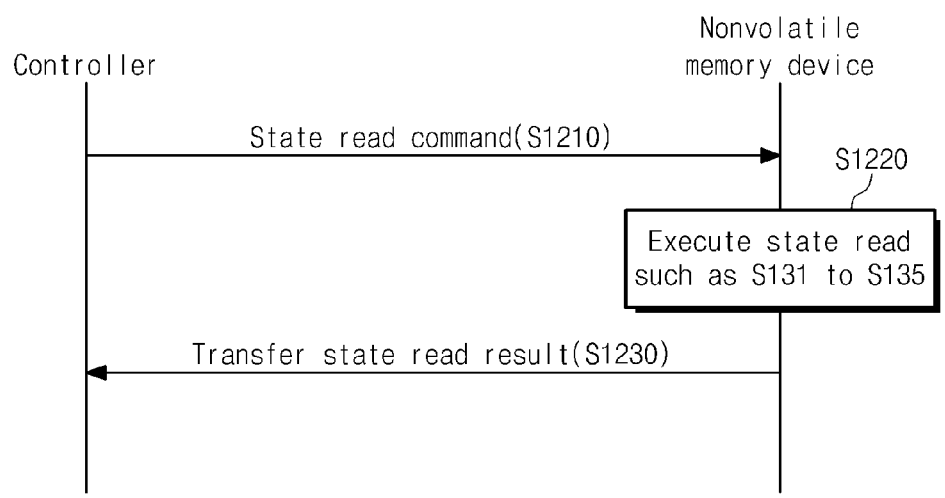
FIG. 63 is a flowchart for describing a state read method of a memory system according to an embodiment.

FIG. 63 is a flowchart for describing a state read method of a memory system according to an embodiment. Referring to FIGS. 61 and 63, in operation S1210, a controller 1200 may send a state read command to a nonvolatile memory device 1100. At this time, addresses of memory cells where a state read operation is to be carried out may be sent.

In operation S1220, the nonvolatile memory device 1100 may perform a state read operation according to an embodiment (operations S151 to S155).

In operation S1230, the nonvolatile memory device 1100 may send a state read result to the controller 1200.

The controller 1200 may control various operations of the nonvolatile memory device 1100 such as programming, reading, and erasing, based on the transferred state read result.

The controller 1200 may receive previously stored data from the nonvolatile memory device 1100 and program data and data to be programmed next from an external device, and may decide levels of a verification voltage to be used at programming of the program data to send it to the nonvolatile memory device with the program data.

Figure 64:
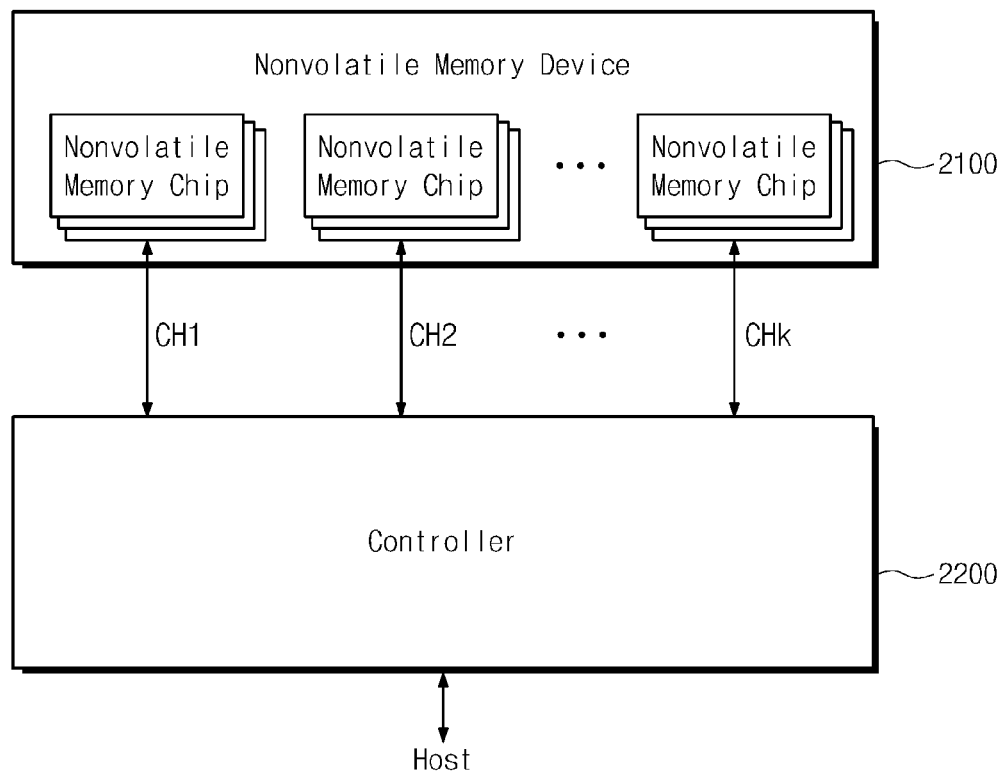
FIG. 64 is a block diagram illustrating an application of a memory system in FIG. 61.

FIG. 64 is a block diagram illustrating an application of a memory system in FIG. 61. Referring to FIG. 64, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In an embodiment, the plurality of nonvolatile memory chips may communicate with the controller 2200 via a plurality of channels CH1 to CHk.

Each of the nonvolatile memory chips may be substantially identical to that of one of nonvolatile memory devices 100 to 500 according to embodiments. That is, the nonvolatile memory device 2100 may include a plurality of cell strings CS11, CS12, CS21, and CS22 provided on a substrate 111 each of which includes a plurality of cell transistors CT stacked in a direction perpendicular to the substrate 111. The nonvolatile memory device 2100 may perform a state read operation according to embodiments, and may perform a program operation considering rearrangement according to a state read result. The controller 2200 may control the nonvolatile memory device 2100 so as to perform a state read operation and a program operation according to embodiments. The controller 2200 may control the nonvolatile memory device 2100 so as to perform a state read operation according to embodiments, and may control operations of the nonvolatile memory device 3100 according to a state read result.

In FIG. 64, there is described the case that one channel is connected with a plurality of nonvolatile memory chips. However, the memory system 2000 can be modified such that one channel is connected with one nonvolatile memory chip.

Figure 65:
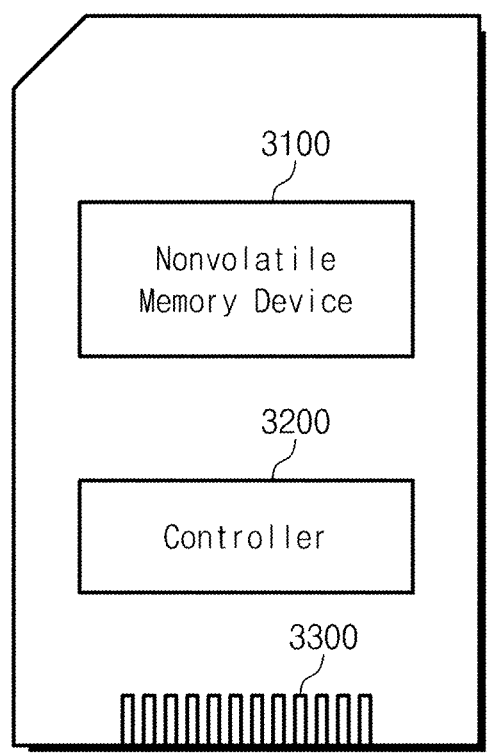
FIG. 65 is a diagram illustrating a memory card according to an embodiment.

FIG. 65 is a diagram illustrating a memory card according to an embodiment. Referring to FIG. 65, a memory card 3000 may include a nonvolatile memory device 3100, a controller 3200, and a connector 3300.

The nonvolatile memory device 3100 may be substantially identical to that of one of nonvolatile memory devices 100 to 500 according to exemplary embodiments. That is, the nonvolatile memory device 3100 may include a plurality of cell strings CS11, CS12, CS21, and CS22 provided on a substrate 111 each of which includes a plurality of cell transistors CT stacked in a direction perpendicular to the substrate 111. The nonvolatile memory device 3100 may perform a state read operation according to embodiments, and may perform a program operation considering rearrangement according to a state read result. The controller 3200 may control the nonvolatile memory device 3100 so as to perform a state read operation and a program operation according to embodiments. The controller 3200 may control the nonvolatile memory device 3100 so as to perform a state read operation according to embodiments, and may control operations of the nonvolatile memory device 3100 according to a state read result.

The connector 3300 may connect the memory card 3000 with a host electrically.

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 66:
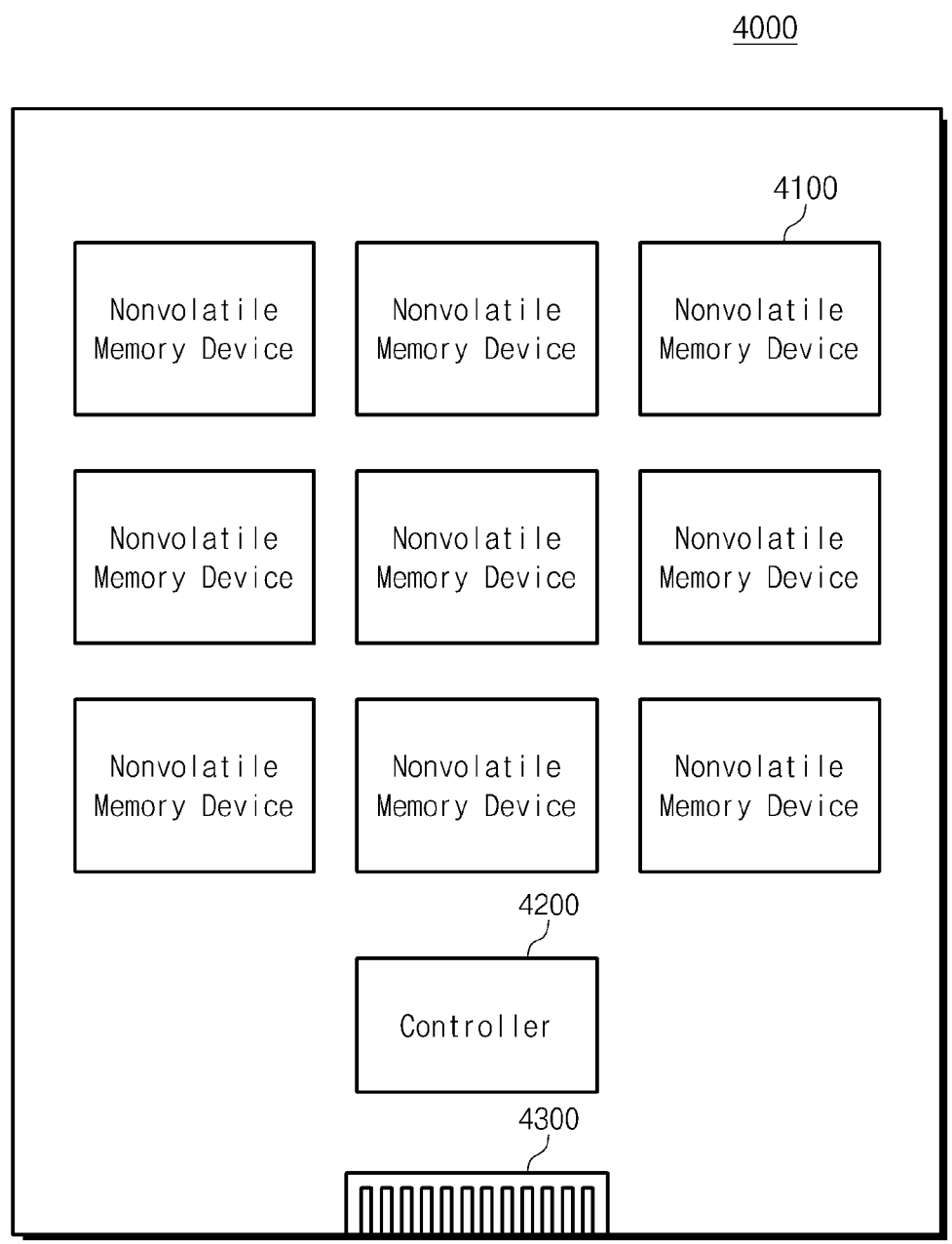
FIG. 66 is a diagram illustrating a solid state drive according to an embodiment.

FIG. 66 is a diagram illustrating a solid state drive according to an embodiment. Referring to FIG. 66, a solid state drive 4000 may include a plurality of nonvolatile memory devices 4100, a controller 4200, and a connector 4300.

Each of the nonvolatile memory devices 4100 may be substantially identical to that of one of nonvolatile memory devices 100 to 500 according to exemplary embodiments. That is, each of the nonvolatile memory devices 4100 may include a plurality of cell strings CS11, CS12, CS21, and CS22 provided on a substrate 111 each of which includes a plurality of cell transistors CT stacked in a direction perpendicular to the substrate 111. The nonvolatile memory device 4100 may perform a state read operation according to embodiments, and may perform a program operation considering rearrangement according to a state read result. The controller 4200 may control the nonvolatile memory device 4100 so as to perform a state read operation and a program operation according to embodiments. The controller 4200 may control the nonvolatile memory device 4100 so as to perform a state read operation according to embodiments, and may control operations of the nonvolatile memory device 4100 according to a state read result.

The connector 4300 may connect the solid state driver 4000 with a host electrically.

Figure 67:
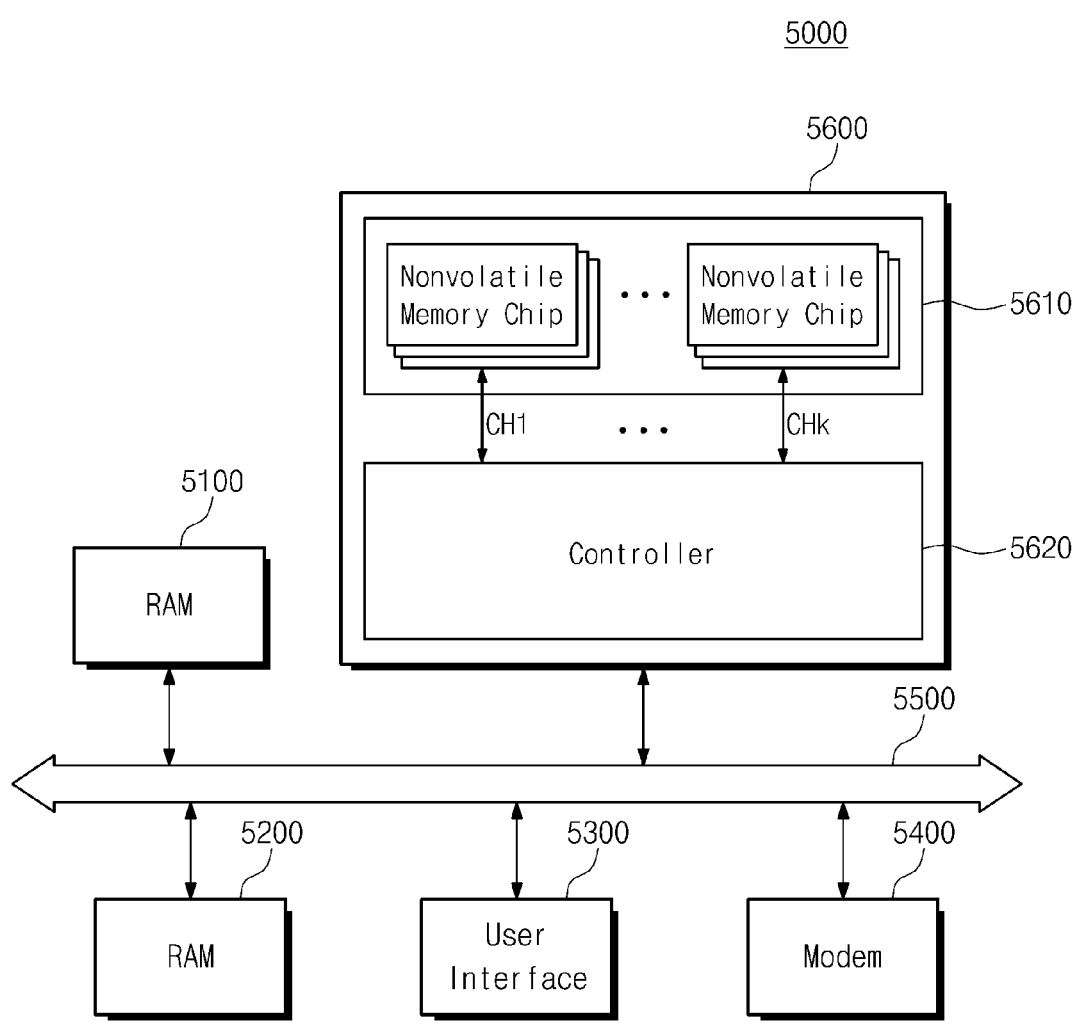
FIG. 67 is a block diagram illustrating a computing system according to an embodiment.

FIG. 67 is a block diagram illustrating a computing system according to an embodiment. Referring to FIG. 67, a computing system 5000 may include a central processing unit 5100, a RAM 5200, a user interface 5300, a modem 5400, and a memory system 5600.

The memory system 5600 may be connected electrically with the elements 5100 to 5400 via a system bus 5500. Data provided via the user interface 5300 or processed by the central processing unit 5100 may be stored in the memory system 5600.

The memory system 5600 may include a nonvolatile memory device 5610 and a controller 5620. The memory system 5600 may be formed of one of memory systems 1000 and 2000, a memory card 3000, and a solid state drive 4000 according to embodiments.

The above-disclosed subject matter is to be considered illustrative, and not restrictive. Many alternatives embodiments are intended to fall within the scope of the invention. For example, while the above embodiments have focused on a memory cell storing data as a threshold voltage in a memory cell transistor, the invention is equally applicable to other memory cell types, and the characteristics may representing data may be different. For example, a range of resistances values may represent a program state in a PRAM memory device, with multiple ranges representing multiple program states. Other factors besides those described herein may affect the shifting of the memory device characteristic representing data (e.g., a shift in voltage threshold or resistance value). The appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A non-volatile memory device comprising:
   bit lines;
   word lines;
   a three dimensional array of memory cells comprising a plurality of memory cell strings, each memory cell string including a vertical stack of memory cells connected to a respective bit line, and memory cells of different memory cell strings connected to a respective word line;
   a page buffer including first latches and second latches connected to corresponding bit lines, first latches configured to store data;
   a voltage generator configured to generate a program voltage;
   a row decoder configured to decode an address and select a word line;
   a control unit configured to control a programming operation including performing a plurality of program loops, each program loop comprising application of a program pulse to a word line selected by the row decoder and a plurality of sequential verify operations to verify respective program levels of a first row of memory cells connected to the selected word line,
   wherein the first latches of the page buffer are configured to inhibit or allow a programming operation on respective memory cells of the first row connected to bit lines corresponding to the first latches, and
   wherein the second latches are configured to select one of a plurality of verify results corresponding to each of the plurality of verify operations of a program loop.

2. The non-volatile memory device of claim 1,
   wherein the control unit is configured to control a programming operation to modify a memory cell characteristic of each of the memory cells of the first row to one of a plurality of program states, each program state representing a different data set of one or more bits of data.

3. The non-volatile memory device of claim 2,
   wherein the control unit is configured to perform a plurality of program loops, each program loop comprising a plurality of verify operations for at least one of the program states.

4. The non-volatile memory device of claim 3, wherein the second latches are rearrangement latches and are configured to store rearrangement data indicating a charge rearrangement characteristic of the first row of memory cells,
   wherein one of the plurality of verify results is selected based upon the rearrangement data of corresponding rearrangement latches.

5. The non-volatile memory device of claim 4, wherein the control unit is configured to perform a state read operation of a least significant bit program state of the first row of memory cells to generate and store in corresponding rearrangement latches corresponding rearrangement data effective to select one of the plurality of verify results when programming least significant bits and additional bits into the first row of memory cells.

6. The non-volatile memory device of claim 4,
   wherein the control unit is configured to perform a state read operation of a first program state including a first read operation with a first read voltage applied to the elected word line and a second read operation with a second read voltage, higher than the first read voltage, applied to the selected word line, the first read voltage and second read voltage having a magnitude within a threshold range representing the first program state,
   wherein the rearrangement data of the rearrangement latches include information of a result of the state read operation.

7. The non-volatile memory device of claim 6, wherein the control unit determines memory cells of the first row of memory cells having an increasing threshold charge rearrangement characteristic as those memory cells of the first row having a threshold voltage higher than the second read voltage, and memory cells of the first row of memory cells having a decreasing threshold charge rearrangement characteristic as those memory cells of the first row having a threshold voltage lower than the first read voltage.

8. The non-volatile memory device of claim 7, wherein the control unit is configured to store data in the rearrangement latches such that memory cells determined to have an increasing threshold charge rearrangement characteristic select verify results of a first verify voltage of memory cells to be programmed to a second program state and such that memory cells determined to have a decreasing threshold charge rearrangement characteristic select verify results of a second verify voltage higher than the first verify voltage of memory cells to be programmed to a second program state.

9. The non-volatile memory device of claim 6, wherein the control unit is configured to generate the rearrangement data stored in the rearrangement latches as a function of the result of the state read operation and as a function of a programming operation of memory cells of a neighboring word line to the selected word line after the first row of memory cells connected to the selected word line is programmed to include the first program state.

10. The non-volatile memory device of claim 9, wherein the control unit is configured to generate the rearrangement data stored in the rearrangement latches as a function of the result of the state read operation and as a function of a voltage threshold difference between memory cells of the selected word line and adjacent memory cells of the neighboring word line.

11. The non-volatile memory device of claim 9, wherein the control unit is configured to generate the rearrangement data stored in the rearrangement latches as a function of the result of the state read operation and as a function of a voltage threshold change adjacent memory cells of the neighboring word line after at least some of the first row of memory cells connected to the selected word line are programmed to include the first program state.

12. The non-volatile memory device of claim 4,
wherein the control unit is configured to perform a state read operation of an erase state of the first row of memory cells connected to the selected word line, including a first read operation with a first read voltage applied to the selected word line and a second read operation with a second read voltage, higher than the first read voltage, applied to the selected word line, the first read voltage and second read voltages having a magnitude within a threshold range representing the erase state,
wherein the rearrangement data of the rearrangement latches includes information of a result of the state read operation.

13. The non-volatile memory device of claim 4,
wherein the control unit is configured to control a programming operation including performing one or more first program loops followed by one or more second program loops, each first program loop comprising application of a program pulse to the selected word line and n sequential verify operations to verify respective program levels of the first row of memory cells connected to the selected word line, each second program loop comprising application of a program pulse to the selected word line and m sequential verify operations to verify respective program levels of the first row of memory cells connected to the selected word line, where n is an integer equal or greater than one, and m is an integer greater than n,
wherein the control unit is configured to perform a state read operation after the one or more first program loops and before the one or more second program loops, wherein the rearrangement data of the rearrangement latches include information of a result of the state read operation.

14. The non-volatile memory device of claim 13, wherein the control unit is configured to stop performing the one or more first program loops after determining a threshold condition.

15. The non-volatile memory device of claim 13, where n equals 1.

16. The non-volatile memory device of claim 3,
wherein the control unit is configured to perform a plurality of program loops, each program loop comprising a first plurality of verify operations for a first program state and a second plurality of verify operations for a second program state, the first program state representing the same first data set for each memory cell programmed to the first data state, and the second program state representing the same second data set for each memory cell programmed to the second data state.

17. The non-volatile memory device of claim 3,
wherein the memory array includes a user data area including the first row of memory cells and a separate data area,
wherein the control unit is configured to load the second latches with first data stored in the separate data area of the array of memory cells,
wherein one of the plurality of verify results is selected based upon the data loaded into corresponding second latches.

18. The non-volatile memory device of claim 17,
wherein the control unit is configured to perform a state read operation of at least one of a first program state and an erase state including a first read operation with a first read voltage applied to the selected word line and a second read operation with a second read voltage, higher than the first read voltage, applied to the selected word line, the first read voltage and second read voltages having a magnitude within a threshold range representing the corresponding first program state or the erase state,
wherein results of the state read operation are the first data stored in the separate data area of the array of memory cells.

19. The non-volatile memory device of claim 3,
wherein the control unit is configured to analyze a program operation of a word line, adjacent to the selected word line, to be performed subsequent to the a program operation of the selected word line and load the second latches with data including information of the analysis,
wherein one of the plurality of verify results is selected based upon the data loaded into corresponding second latches.

20. The non-volatile memory device of claim 3,
wherein the control unit is configured to perform a state read operation of at least one of a first program state and an erase state including a first read operation with a first read voltage applied to the selected word line and a second read operation with a second read voltage, higher than the first read voltage, applied to the selected word line, the first read voltage and second read voltages having a magnitude within a threshold range representing the corresponding first program state or the erase state,
wherein the control unit is configured to analyze a program operation of a word line, adjacent to the selected word line, subsequent to the a program operation of the selected word line, and
wherein the control unit is configured to load the second latches with data including information of the state read operation and the analysis.

21. A non-volatile memory device comprising:
an array of memory cells arranged in rows in columns, rows of memory cells connected to corresponding word lines, columns of memory cells connected to corresponding bit lines;
a voltage generator configured to generate a program voltage;

a page buffer including first latches and second latches connected to corresponding bit lines, first latches configured to temporarily store data to be stored in a row of memory cells to be programmed;

a row decoder configured to decode an address and select a word line;

a control unit configured to control a programming operation including performing a plurality of program loops each program loop comprising application of a program pulse to a word line selected by the row decoder and a plurality of sequential verify operations to verify respective voltage threshold levels of a first row of memory cells connected to the selected word line;

wherein the first latches of the page buffer are configured to inhibit or allow a programming operation on respective memory cells of the first row connected to bit lines corresponding to the first latches, wherein the control unit is configured control a coarse programming operation to program the first row of memory cells to a plurality of coarse program state, each of the plurality of coarse program states corresponding to a fine program state, wherein the control unit is configured to perform a state read of the first row of the memory cells when in a coarse program state to determine a tendency of a threshold voltage of each memory cell to shift, and wherein the second latches are configured to store information of the result of the state read, and configured to select, in response to the information stored in the second latches, one of a plurality of verify results corresponding to each of the plurality of verify operations of a program loop.

22. The non-volatile memory device of claim 21, wherein the array of memory cells includes a user data area including the first row of memory cells, and a buffer area configured to store data to be programmed into the user data area, wherein at least some of the first row of memory cells include a charge rearrangement characteristic that alters the threshold levels of the at least some of the first row of memory cells after a programming operation including the coarse programming operation, wherein the control unit is configured to access the buffer area to determine to which of the plurality of coarse program states memory cells of the first row of memory cells were previously programmed, and wherein results of the state read of the first row of the memory cells when in the coarse program by the control unit are responsive to the access of the buffer area by the control unit.

23. The non-volatile memory device of claim 22, wherein the control unit is configured to control a fine programming operation to program each of the first row of memory cells to a fine program state respectively corresponding to a coarse program state.

24. A solid state drive (SSD) comprising:

a plurality of non-volatile memory devices;

a memory controller configured to control operations of a plurality of non-volatile memory devices; and a plurality of channels configured to provide communications between the plurality of non-volatile memory devices and the memory controller, wherein each non-volatile memory device comprises:

an array of memory cells arranged in rows in columns, rows of memory cells connected to corresponding word lines, columns of memory cells connected to corresponding bit lines;

a page buffer including first latches and second latches connected to corresponding bit lines, first latches configured to store data;

a voltage generator configured to generate a program voltage;

a row decoder configured to decode an address and select a word line;

a control unit configured to control a programming operation including performing a plurality of program loops each program loop comprising application of a program pulse to a word line selected by the row decoder and a plurality of sequential verify operations to verify respective program levels of a first row of memory cells connected to the selected word line, the first latches of the page buffer being configured to inhibit or allow a programming operation on respective memory cells of the first row connected to bit lines corresponding to the first latches, and the second latches being configured to select one of a plurality of verify results corresponding to each of the plurality of verify operations of a program loop.

* * * * *